(12) United States Patent
Nagasawa et al.

(10) Patent No.: US 8,748,076 B2
(45) Date of Patent: Jun. 10, 2014

(54) RESIST COMPOSITION AND PATTERNING PROCESS USING THE SAME

(75) Inventors: Takayuki Nagasawa, Jyoetsu (JP); Tomohiro Kobayashi, Jyoetsu (JP); Ryosuke Taniguchi, Jyoetsu (JP); Masaki Ohashi, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/345,355

(22) Filed: Jan. 6, 2012

(65) Prior Publication Data

US 2012/0196228 A1    Aug. 2, 2012

(30) Foreign Application Priority Data

Jan. 28, 2011 (JP) .................. 2011-016066
Sep. 20, 2011 (JP) .................. 2011-204482

(51) Int. Cl.
*G03F 7/039* (2006.01)
*G03F 7/20* (2006.01)
*G03F 7/30* (2006.01)
*G03F 7/38* (2006.01)

(52) U.S. Cl.
USPC ........ 430/270.1; 430/311; 430/326; 430/330; 430/910; 430/921; 430/925

(58) Field of Classification Search
None
See application file for complete search history.

(56) References Cited

U.S. PATENT DOCUMENTS

| | | | |
|---|---|---|---|
| 6,312,867 B1 | 11/2001 | Kinsho et al. | |
| 2003/0044717 A1 | 3/2003 | Kodama | |
| 2006/0228648 A1 | 10/2006 | Ohsawa et al. | |
| 2008/0090172 A1 | 4/2008 | Hatakeyama et al. | |
| 2008/0118860 A1 | 5/2008 | Harada et al. | |
| 2009/0042128 A1 | 2/2009 | Takemoto | |
| 2009/0226842 A1 | 9/2009 | Shimizu et al. | |
| 2009/0274978 A1 | 11/2009 | Ohashi et al. | |
| 2010/0035185 A1 | 2/2010 | Hagiwara et al. | |
| 2010/0143830 A1 | 6/2010 | Ohashi et al. | |
| 2010/0203447 A1 | 8/2010 | Otsuka et al. | |
| 2010/0266957 A1 | 10/2010 | Harada et al. | |
| 2010/0285405 A1 | 11/2010 | Shimokawa et al. | |
| 2012/0100486 A1* | 4/2012 | Sagehashi et al. ............ | 430/325 |

FOREIGN PATENT DOCUMENTS

| | | |
|---|---|---|
| JP | A-6-157381 | 6/1994 |
| JP | A-2000-336121 | 12/2000 |
| JP | A-2001-166476 | 6/2001 |
| JP | B2-3912767 | 5/2007 |
| JP | A-2007-145797 | 6/2007 |
| JP | A-2007-199653 | 8/2007 |
| JP | A-2008-111103 | 5/2008 |
| JP | A-2008-122932 | 5/2008 |
| JP | A-2009-7327 | 1/2009 |
| JP | A-2009-244859 | 10/2009 |
| JP | A-2009-269953 | 11/2009 |
| JP | A-2010-155824 | 7/2010 |
| TW | 200728920 | 8/2007 |
| TW | 200912543 | 3/2009 |
| TW | 201035029 A1 | 10/2010 |
| TW | 201039064 A1 | 11/2010 |

OTHER PUBLICATIONS

European Search Report issued in Application No. EP 12 00 0406.4 on May 9, 2012.

(Continued)

*Primary Examiner* — Sin J. Lee
(74) *Attorney, Agent, or Firm* — Oliff PLC

(57) ABSTRACT

There is disclosed a resist composition comprising at least: (A) a polymer containing one or more repeating units having a structure shown by the following general formula (1) and/or (2), an alkaline-solubility of the polymer being increased by an acid, (B) a photo acid generator generating, with responding to a high energy beam, a sulfonic acid shown by the following general formula (3), and (C) an onium sulfonate shown by the following general formula (4). There can be a resist composition showing not only excellent LWR and pattern profile but also extremely good performance in pattern-fall resistance, and to provide a patterning process using the same.

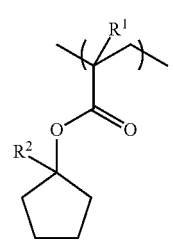

(1)

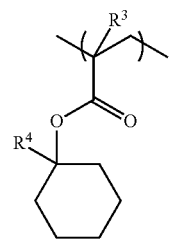

(2)

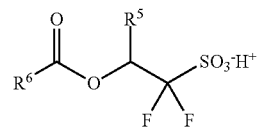

(3)

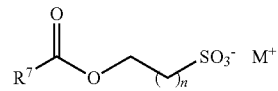

(4)

18 Claims, No Drawings

(56) References Cited

OTHER PUBLICATIONS

Fedynyshyn; "Advances in Resist Technology and Processing XIX;" *Proceedings of SPIE*; Mar. 4-6, 2002; vol. 4690; Santa Clara, U.S.A.

Owa et al,; "Immersion lithography; its potential performance and issues;" *Optical Microlithography XVI—Proceedings of SPIE*; 2003; pp. 724-733; vol. 5040.

Feb. 27, 2014 Office Action issued in Taiwanese Patent Application No. 101102507 (with partial translation).

* cited by examiner

US 8,748,076 B2

RESIST COMPOSITION AND PATTERNING PROCESS USING THE SAME

BACKGROUND OF THE INVENTION

1. Field of the Invention

The present invention relates to a resist composition used for microfabrication in manufacturing process of a semiconductor device, for example, for a lithography using an ArF excimer laser of a 193 nm wavelength as a light source, especially for an immersion photolithography in which water is inserted between a projection lens and a wafer, and to a resist-patterning process using the same.

2. Description of the Related Art

As LSI is progressing toward a higher integration and a faster speed in recent years, further miniaturization of a pattern rule is required. Under such a movement, a lithography using a light exposure, which is a widely used technology today, is reaching a limit of its resolution power inherent to a wavelength of a light source.

Heretofore, light-exposure using a light source of a g-line (436 nm) or an i-line (365 nm) of a mercury lamp as an exposure light was broadly adopted in forming a resist pattern. As a mean for further miniaturization, shifting to a shorter wavelength of an exposing light was assumed to be effective. As a result, in a mass production process after DRAM (Dynamic Random Access Memory) with 64-megabits (0.25 μm or less of a processing dimension), a KrF excimer laser (248 nm), a shorter wavelength than an i-line (365 nm), was used in place of an i-line as an exposure light source.

However, in production of DRAM with an integration of 256 M, 1 G and higher which require further miniaturized process technologies (process dimension of 0.2 μm or less), a light source with a further short wavelength is required, and thus a photo lithography using an ArF excimer laser (193 nm) has been investigated seriously since about a decade ago.

At first, an ArF lithography was planned to be applied to a device-manufacturing starting from a 180-nm node device, but a KrF excimer laser lithography lived long to a mass production of a 130-nm node device, and thus a full-fledged application of an ArF lithography will start from a 90-nm node. Further, a study of a 65-nm node device by combining with a lens having an increased NA till 0.9 is now underway.

Further shortening of wavelength of an exposure light is progressing towards the next 45-nm node device, and for that an $F_2$ lithography with a 157-nm wavelength became a candidate. However, there are many problems in an $F_2$ lithography: an increase in cost of a scanner due to the use of a large quantity of expensive $CaF_2$ single crystals for a projector lens; extremely poor sustainability of a soft pellicle, which leads to a change of an optical system due to introduction of a hard pellicle; a decrease in an etching resistance of a resist film; and the like. Because of these problems, it was proposed to postpone an $F_2$ lithography and to introduce an ArF immersion lithography earlier (Proc. SPIE Vol. 4690 xxix).

In an ArF immersion lithography, a proposal is made to impregnate water between a projector lens and a wafer. A refractive index of water at 193 nm is 1.44, and therefore a pattern formation is possible even if a lens with a numerical aperture (NA) of 1.0 or more is used, and moreover, theoretically NA may be increased to near 1.35. A miniaturization to a level of 45-nm node or lower becomes possible by combination of a lens having NA of 1.2 or more and a super-resolution technology (Proc. SPIE Vol. 5040 p 724).

As a circuit line width becomes narrower, an effect of contrast deterioration due to acid diffusion becomes more serious in a resist composition. This is caused by approaching of a pattern size to an acid diffusion length whereby leading to lowering of mask fidelity, worsening of LWR (Line Width Roughness), and deterioration of pattern rectangularity. Accordingly, to fully enjoy the favor owing to a shift to a shorter wavelength of a light source and to a higher NA, increase of a dissolution contrast or suppression of an acid diffusion is necessary ever than before in the material.

Poly hydroxy styrene (PHS), which has been widely used as a base resin of a KrF resist composition, shows excellent alkaline-dissolution properties, but an insufficient transparency to an ArF beam (193 nm) has been a problem; and thus, for an ArF resist composition, an attempt has been made to change to a material, represented by a (meth)acrylate resin, which has a carboxylic acid as an alkaline-soluble group.

However, because a carboxylic acid is a stronger acid than a phenolic acid of PHS, a resist film swells easily during development, whereby causing poor LWR and pattern fall.

To reduce swelling, lowering of lipophilicity in a base resin is effective; and it has been known that LWR can be improved by lowering lipophilicity by using a unit that protects a soluble carboxylic acid with an acid-labile group having a monocyclic structure. However, when a base resin with reduced lipophilicity is used, there occurs a problem that sufficient rectangularity cannot be obtained in a fine pattern because of an insufficient dissolution contrast.

In order to suppress an acid diffusion, a structure of a photo acid generator (PAG) plays a key role; and this aim has been accomplished to a certain degree by development of a photo acid generator which is stable and yet gives the acid generated therefrom adequate acidity and bulkiness (for example, SF5Ad-03, SF2Ad-03, and SF5Ad-tBu12).

However, in the most advanced lithography, a pattern size approaches to an acid diffusion length; and thus, acid diffusion needs to be suppressed more than ever.

To further suppress an acid diffusion, addition of a quencher component that captures an acid generated by light irradiation is effective; and thus, as the quencher, nitrogen-containing organic basic compounds represented by a primary, a secondary, and a tertiary amines have been widely used. However, these nitrogen-containing organic compounds bring about a size difference between a dark area (large unexposed area) and a bright area (large exposed area) due to being eccentrically located in a resist film and volatilization (chemical flare) from a resist film surface layer, and this in turn leads to difficult surface dissolution and the like that cause a poor profile.

As an illustrative example of other quenchers, a quencher with a type of an onium salt can be mentioned. For example, in Japanese Patent No. 3912767, a resist composition concurrently using a compound that generates an alkanesulfonic acid substituted with a fluorine atom at its α-position and an onium salt of an unfluorinated alkanesulfonic acid, thereby giving a small sparse-dense dependency, especially a small sparse-dense dependency in a line-and-space, has been proposed. Although a detail of this effect is not described, it is supposed that this is caused because the fluorine-containing sulfonic acid generated by photo-exposure reacts with the onium salt of the unfluorinated alkanesulfonic acid for salt-exchange to form the unfluorinated alkanesulfonic acid and an onium salt of the fluorine-containing sulfonic acid whereby exchanging a strong acid (fluorine-containing sulfonic acid) to a weak acid (unfluorinated alkanesulfonic acid). In other words, it is supposed that the onium salt of the unfluorinated alkanesulfonic acid acts as a quencher (acid-deactivator) to a strong acid generated by photo-exposure. A similar proposal to the foregoing is also described in Japanese Patent Laid-Open Publication No. 2009-244859. In this document, an onium salt of an alkanesulfonic acid having a specific structure is proposed; and it is reported that a pattern profile and so on resulted therefrom are excellent.

These weakly acidic onium salt quenchers are generally nonvolatile; and thus, there is no fear of a chemical flare as mentioned above, so that effect to improve rectangularity of a pattern may be expected. Especially in a combination with the foregoing low-lipophilic base resin, rectangularity can be improved while keeping a good LWR level; and thus, a lithographic performance can be enhanced complementarily.

On the other hand, these weakly acidic onium salt quenchers have a lower quenching performance to a strong acid as compared with a nitrogen-containing organic compound such as an amine; and thus, there is a tendency not to adequately suppress acid diffusion so that there is a fear of giving a tapered form and a footing profile in a fine pattern.

In addition, there is a serious problem of pattern fall caused by reduction of an absolute size. Especially when these weakly acidic onium salt quenchers are used, a weak acid generated by the salt-exchange reaction remains within a resist film without being neutralized, so that penetration of an alkaline developer into a pattern becomes easier; and thus, a problem of pattern fall becomes more serious.

SUMMARY OF THE INVENTION

The present invention was made in view of the problems mentioned above, and has an object to provide a resist composition showing not only excellent LWR and pattern profile but also extremely good performance in pattern-fall resistance, and to provide a patterning process using the same.

To solve the problems mentioned above, the present invention provides a resist composition comprising at least:
(A) a polymer containing one or more repeating units having a structure shown by the following general formula (1) and/or one or more repeating units having a structure shown by the following general formula (2), an alkaline-solubility of the polymer being increased by an acid,
(B) a photo acid generator generating, with responding to a high energy beam, a sulfonic acid shown by the following general formula (3), and
(C) an onium sulfonate shown by the following general formula (4).

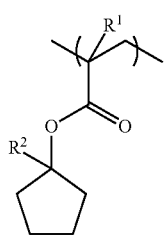

(1)

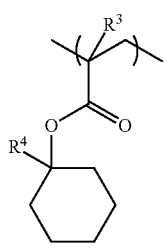

(2)

(In the formulae, each $R^1$ and $R^3$ independently represents a hydrogen atom or a methyl group. Each $R^2$ and $R^4$ independently represents a linear, a branched, or a cyclic alkyl group having 1 to 7 carbon atoms and optionally containing an oxygen atom.)

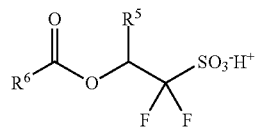

(3)

(In the formula, $R^5$ represents a hydrogen atom or a trifluoromethyl group. $R^6$ represents a linear, a branched, or a cyclic alkyl group, substituted or unsubstituted, having 1 to 23 carbon atoms, or an aryl group, substitute or unsubstituted, having 6 to 14 carbon atoms.)

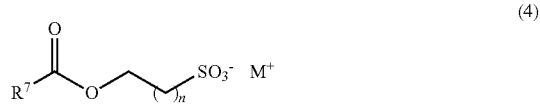

(4)

(In the formula, $R^7$ represents a monovalent hydrocarbon group optionally containing a hetero atom, excluding the cases that $R^7$ represents a vinyl group and an isopropenyl group. "n" represents an integer of 1 to 3, and $M^+$ represents a counter cation having a substituent and is any of a sulfonium cation, an iodonium cation, and an ammonium cation.)

The resist composition comprising, as described above, (A) a polymer whose soluble carboxylic acid is protected by a specific acid-labile group having a monocyclic structure, (B) a specific photo acid generator, and (C) a quencher of a specific onium sulfonate, shows not only excellent LWR and pattern profile but also an extremely good performance in pattern-fall resistance. The resist composition of the present invention can form a resist pattern having extremely good properties in all of LWR pattern profile, and pattern-fall resistance by containing all of the components (A), (B), and (C) as mentioned above.

In this case, as an illustrative example of the onium sulfonate of the component (C), a sulfonium sulfonate shown by the following general formula (5) can be mentioned.

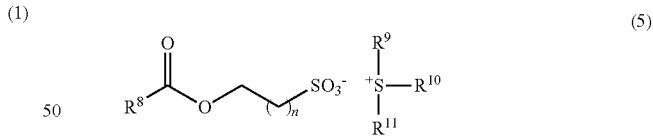

(5)

(In the formula, $R^8$ represents a monovalent hydrocarbon group optionally containing a hetero atom. "n" represents an integer of 1 to 3. Each $R^9$, $R^{10}$, and $R^{11}$ independently represent any of a linear or a branched alkyl group, alkenyl group, and oxoalkyl group, substituted or unsubstituted, having 1 to 10 carbon atoms, or any of an aryl, an aralkyl, and an aryl oxoalkyl group, substituted or unsubstituted, having 6 to 18 carbon atoms, or any two or more of $R^9$, $R^{10}$, and $R^{11}$ may be bonded with each other to form a ring together with a sulfur atom in the formula.)

Accordingly, as an illustrative example of the onium sulfonate of the component (C), a sulfonium sulfonate shown by the above general formula (5), which corresponds to the above general formula (4) whose $M^+$ is a sulfonium cation, can be mentioned.

In this case, it is preferable that the polymer of the component (A) further contain, in addition to the repeating unit shown by the above general formulae (1) and/or (2), a repeating unit having an adhesive group of a hydroxyl group and/or a lactone ring.

When the polymer of the component (A) contains a repeating unit having an adhesive group of a hydroxyl group and a lactone group as described above, LWR can be improved more effectively.

In this case, it is preferable that the polymer of the component (A) further contain, in addition to the repeating unit shown by the above general formulae (1) and/or (2), one or more of an acid-labile unit shown by the following general formula (6).

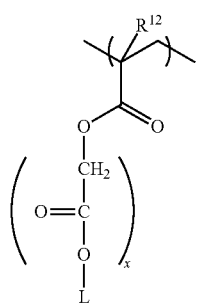

(6)

(In the formula, $R^{12}$ represents a hydrogen atom or a methyl group. x represents 0 or 1, and L represents an acid-labile group.)

As mentioned above, it is preferable that the polymer of the component (A) contain as the acid-labile group, in addition to the repeating unit shown by the above general formulae (1) and/or (2), one or more of the acid-labile unit shown by the above general formula (6). When a resist composition containing a polymer having the acid-labile group shown by the above general formula (6) is used, an alkaline-solubility by an acid increases further so that a pattern profile may be made better.

In addition, it is preferable that amount of the photo acid generator of the component (B) be 2 to 10% by mass relative to that of the polymer of the component (A) and amount of the onium sulfonate of the component (C) in terms of mole be more than that of the photo acid generator of the component (B).

When amount of the photo acid generator of the component (B) is 2 to 10% by mass relative to that of the polymer of the component (A) and amount of the onium sulfonate of the component (C) in terms of mole is more than that of the photo acid generator of the component (B) as mentioned above, there is no fear of deterioration of resolution nor a problem of a foreign matter during development and resist removal; and thus, the amounts shown above are preferable.

Further, it is preferable that the resist composition of the present invention further contain any one or more of an organic solvent, a basic compound, a dissolution inhibitor, and a surfactant.

As mentioned above, by blending an organic solvent, for example, a coating property of the resist composition to a substrate can be improved; by blending a basic compound, resolution can be improve further; by blending a dissolution inhibitor, difference in dissolution rates between an exposed part and an unexposed part can be made further larger thereby improving resolution further; and by blending a surfactant, a coating property of the resist composition can be improved or controlled further.

In addition, the present invention provides a patterning process comprising at least a step of applying the forgoing resist composition to a substrate, a step of heat treatment, a step of exposing to a high energy beam, and a step of developing by using a developer.

According to the patterning process of the present invention, a pattern having extremely good properties in all of LWR, pattern profile, and pattern-fall resistance can be formed.

Here, it is preferable that wavelength of the high energy beam be made in the range between 180 and 250 nm.

Accordingly, the patterning process of the present invention is most suitable for fine patterning by a deep ultraviolet ray or an excimer laser with wavelength range between 180 and 250 nm among high energy beams such as an ultraviolet ray, a deep ultraviolet ray, an electron beam, an X-ray, an excimer laser, a γ-ray, a synchrotron radiation, or the like.

Here, it is preferable that the step of exposing to a high energy beam be carried out by an immersion exposure intervened with a liquid. In this case, it is preferable that water be used as the foregoing liquid.

As mentioned above, the exposure step by a high energy beam may also be carried out by an immersion method with intervention of a liquid (especially water) in which a space between a mask and a resist film is immersed in a liquid.

In the present invention, a linear alkyl chain is introduced between a terminal sulfonyl group and a substituent playing a role of solubility and bulkiness of a quencher in a specific onium sulfonate (quencher) as the component (C) thereby appropriately supplementing distribution and dynamic movement of the quencher inside a film owing to movability of the terminal sulfonyl group under heating condition after exposure; and as a result, freedom of the sulfonyl group directly involving a quenching capacity to a specific sulfonic acid generated from a photo acid generator of the component (C) is increased, thereby enabling to accomplish increase of capturing rate of the generated acid. In addition, a monocyclic structure unit is introduced into a composition element of increasing alkaline-solubility of the polymer of the component (A) by an acid thereby reducing a lipophilicity and enhancing a resist dissolution contrast; and as a result, mask fidelity and LWR (Line Width Roughness) are dramatically improved, while keeping effectiveness of the onium sulfonate as the quencher of the component (C), thereby enabling to provide a resist composition having an excellent pattern rectangularity. Further in addition, owing to an anti-swelling effect by the component (A), pattern fall during the time of development could be suppressed as compared with a resist composition using a conventional onium sulfonate quencher.

DETAILED DESCRIPTION OF THE PREFERRED EMBODIMENTS

Hereinafter, the preferred embodiments to carry out the present invention will be explained, but the present invention is not limited to them.

Inventors of the present invention carried out an extensive investigation to solve the problems mentioned above; and as a result, they found that a resist composition, containing (A) a polymer having a specific structure, (B) a specific photo acid generator, and (C) a specific onium sulfonate quencher mentioned above, showed extremely good properties in LWR, pattern profile, and pattern fall resistance.

A necessary repeating unit to generate an acid contained in the polymer of the component (A) is a repeating unit shown by the following general formulae (1) and/or (2). The polymer of the component (A) is a polymer whose alkaline-solubility is increased by an acid, wherein the following general formulae (1) and (2) are the units whose soluble carboxylic acid group is protected by an acid-labile group having a monocyclic structure.

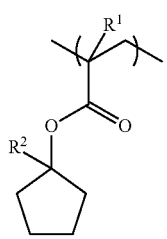
(1)

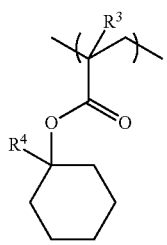
(2)

(In the formulae, each $R^1$ and $R^3$ independently represents a hydrogen atom or a methyl group. Each $R^2$ and $R^4$ independently represents a linear, a branched, or a cyclic alkyl group having 1 to 7 carbon atoms and optionally containing an oxygen atom.)

As the specific examples of the above general formula (1) and (2), compounds having following structures, though not limited to them, can be mentioned.

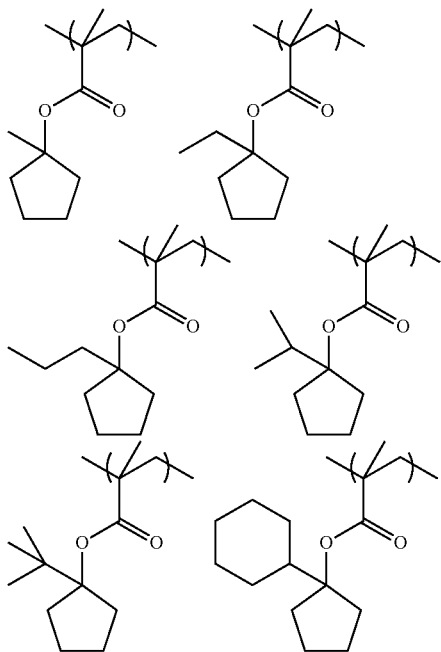

-continued

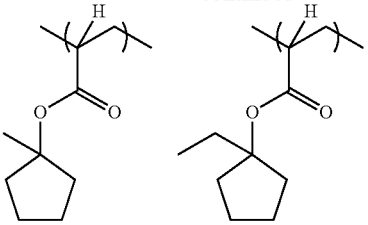

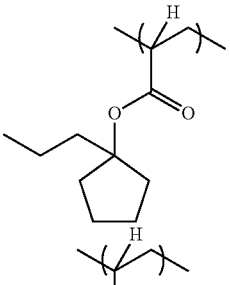

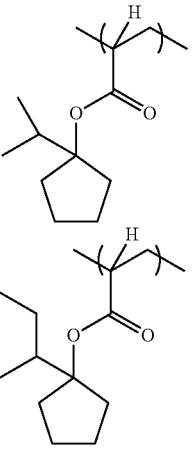

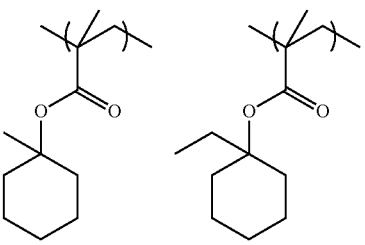

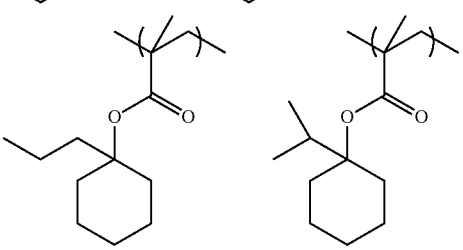

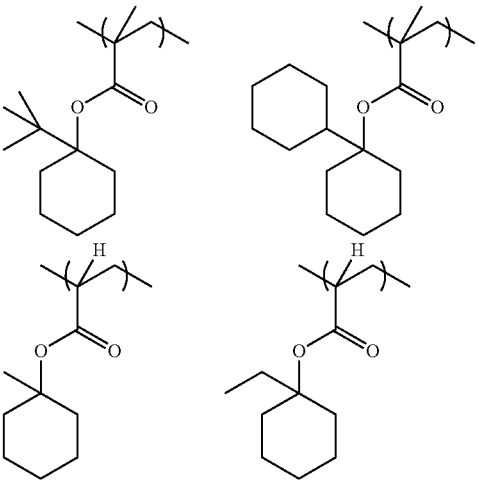

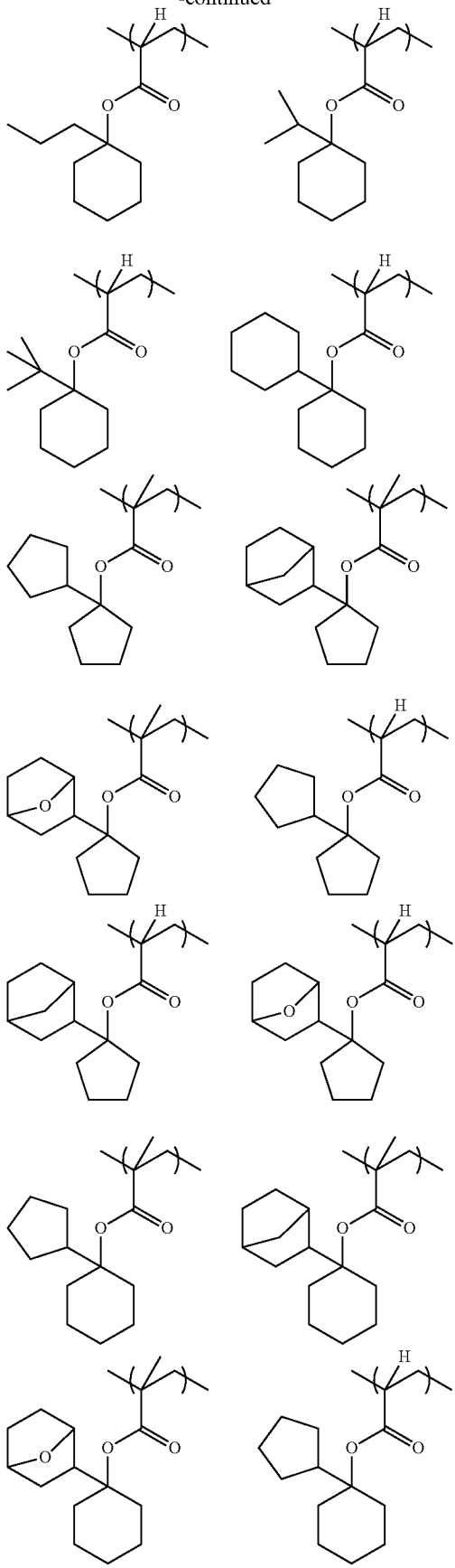

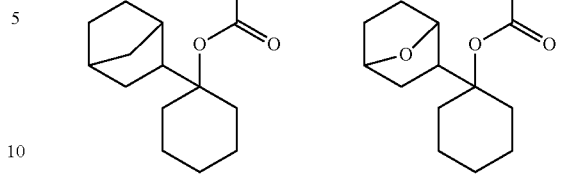

In addition, the polymer of the component (A) contained in the resist composition of the present invention may contain, in addition to a repeating unit shown by the above general formulae (1) and/or (2), one or more of an acid-labile unit shown by the following general formula (6).

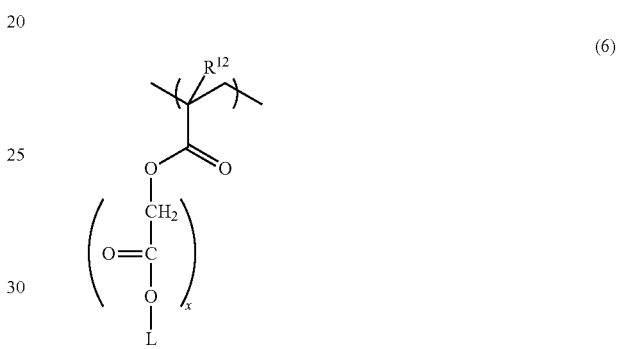

(In the formula, $R^{12}$ represents a hydrogen atom or a methyl group. x represents 0 or 1, and L represents an acid-labile group.)

A monomer of the repeating unit shown by the above general formula (6) is shown by the following general formula (6'); and when this monomer is copolymerized with a monomer giving the repeating unit shown by the above general formula (1) and/or (2), namely a monomer shown by the following general formula (1') and/or (2'), the polymer of the component (A) of the present invention can be obtained.

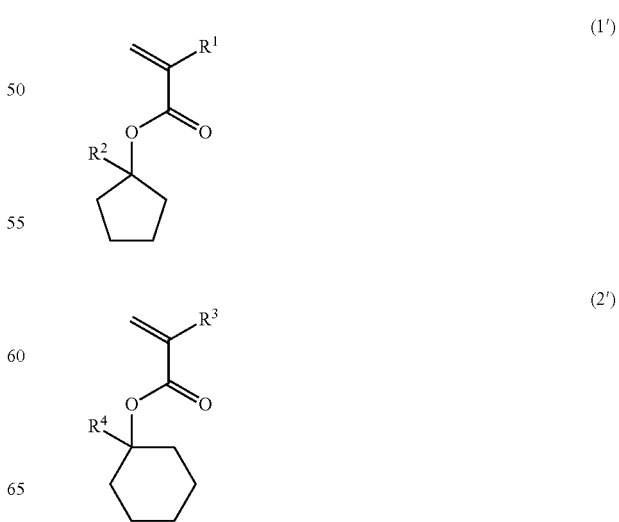

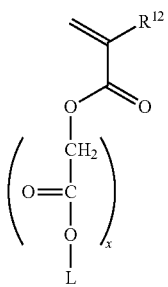

(6')

(In the formulae, each $R^1$, $R^2$, $R^3$, and $R^4$ represents the same meaning as before; and $R^{12}$, x, and L represent the same meanings as those of the above general formula (6).)

Here, explanation will be made on the acid-labile unit. The acid-labile unit is a repeating unit having a structure in which an acid group such as a carboxylic acid, a phenol, and a fluoroalcohol is protected by an acid-labile group; and thus, solubility of the polymer into an alkaline developer can be increased by deprotection by an acid.

The repeating units shown by the above general formulae (1) and (2), which are necessary units of the polymer of the component (A) of the resist composition of the present invention, and the repeating unit shown by the above general formula (6) have the structure that the carboxylic acid group is protected by an acid-labile group.

Usable as the acid labile group L included in the above formula (6) are various ones, and examples thereof specifically include an alkoxymethyl group represented by the following general formula (L1), and tertiary alkyl groups represented by the following general formulae (L2) to (L8), without limited thereto. Especially, most preferable acid labile groups are ones having structure of (L2) to (L5).

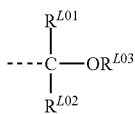
(L1)

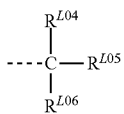
(L2)

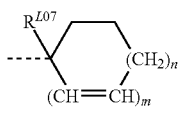
(L3)

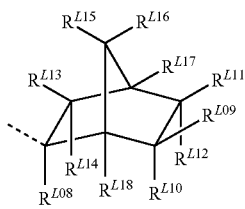
(L4)

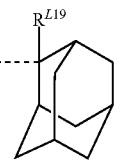
(L5)

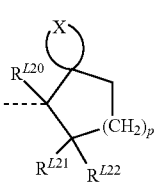
(L6)

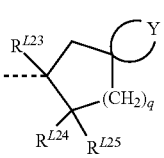
(L7)

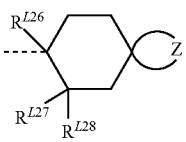
(L8)

In the above formulae, broken lines each indicate a bonding hand. Further, $R^{L01}$ and $R^{L02}$ each represent a hydrogen atom, or a straight, branched, or cyclic alkyl group having 1 to 18 carbon atoms, preferably 1 to 10 carbon atoms, and examples thereof specifically include a methyl group, ethyl group, propyl group, isopropyl group, n-butyl group, sec-butyl group, tert-butyl group, cyclopentyl group, cyclohexyl group, 2-ethylhexyl group, n-octyl group, and adamantyl group. $R^{L03}$ represents a monovalent hydrocarbon group, which may contain a heteroatom such as oxygen atom, having 1 to 18 carbon atoms, preferably 1 to 10 carbon atoms, and examples thereof include a straight, branched, or cyclic alkyl group, and such a group obtained by substituting the above alkyl group, at part of hydrogen atoms, by a hydroxyl group(s), alkoxy group(s), oxo group(s), amino group(s), alkylamino group(s), or the like, such that examples of the straight, branched, or cyclic alkyl group are the same as those for the $R^{L01}$ and $R^{L02}$, while examples of the substituted alkyl group include the following groups.

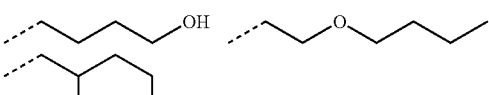

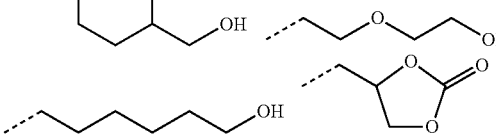

$R^{L01}$ and $R^{L02}$, $R^{L01}$ and $R^{L03}$, or $R^{L02}$ and $R^{L03}$ may bond to each other to form a ring together with a carbon atom or oxygen atom to which $R^{L01}$, $R^{L02}$ and $R^{L03}$ is bonded, and in case of forming a ring, $R^{L01}$, $R^{L02}$, and $R^{L03}$ each represent a straight or branched alkylene group having 1 to 18 carbon atoms, preferably 1 to 10 carbon atoms.

$R^{L04}$, $R^{L05}$, and $R^{L06}$ each independently represent a straight, branched, or cyclic alkyl group having 1 to 15 carbon atoms. Examples thereof specifically include a methyl group, ethyl group, propyl group, isopropyl group, n-butyl group, sec-butyl group, tert-butyl group, cyclopentyl group, cyclohexyl group, 2-ethylhexyl group, n-octyl group, 1-adamantyl group, 2-adamantyl group, and the like.

$R^{L07}$ represents a straight, branched, or cyclic alkyl group having 1 to 10 carbon atoms which may be substituted, or an aryl group having 6 to 20 carbon atoms which may be substituted. Examples of the alkyl group which may be substituted, specifically include: a straight, branched, or cyclic alkyl group such as a methyl group, ethyl group, propyl group, isopropyl group, n-butyl group, sec-butyl group, tert-butyl group, tert-amyl group, n-pentyl group, n-hexyl group, cyclopentyl group, cyclohexyl group, bicyclo[2.2.1]heptyl group, and the like; such a group obtained by substituting the above alkyl group, at part of hydrogen atoms, by a hydroxyl group(s), alkoxy group(s), carboxyl group(s), alkoxycarbonyl group(s), oxo group(s), amino group(s), alkylamino group(s), cyano group(s), mercapto group(s), alkylthio group(s), sulfo group(s), or the like; or such a group obtained by substituting the above mentioned alkyl group, at part of the methylene group, by an oxygen atom or sulfur atom. Examples of the aryl group which may be substituted, specifically include a phenyl group, methylphenyl group, naphthyl group, anthryl group, phenanthryl group, pyrenyl group, or the like. In the formula (L3), n is 4, 5 or 6 when m is 0, and n is 0, 1, 2 or 3 when m is 1.

$R^{L08}$ represents a straight, branched, or cyclic alkyl group having 1 to 10 carbon atoms which may be substituted, or an aryl group having 6 to 20 carbon atoms which may be substituted, and examples thereof specifically include the same groups as those for $R^{L07}$, and the like. $R^{L09}$ to $R^{L18}$ each independently represent a hydrogen atom, or a monovalent hydrocarbon group having 1 to 15 carbon atoms, and examples thereof specifically include: a straight, branched, or cyclic alkyl group such as a methyl group, ethyl group, propyl group, isopropyl group, n-butyl group, sec-butyl group, tert-butyl group, tert-amyl group, n-pentyl group, n-hexyl group, n-octyl group, n-nonyl group, n-decyl group, cyclopentyl group, cyclohexyl group, cyclopentylmethyl group, cyclopentylethyl group, cyclopentylbutyl group, cyclohexylmethyl group, cyclohexylethyl group, cyclohexylbutyl group, and the like; such an alkyl group obtained by substituting the above alkyl group, at part of hydrogen atoms, by a hydroxyl group(s), alkoxy group(s), carboxyl group(s), alkoxycarbonyl group(s), oxo group(s), amino group(s), alkylamino group(s), cyano group(s), mercapto group(s), alkylthio group(s), sulfo group(s), or the like. $R^{L09}$ to $R^{L18}$ may bond to each other to form a ring (for example, $R^{L09}$ and $R^{L10}$, $R^{L09}$ and $R^{L11}$, $R^{L10}$ and $R^{L12}$, $R^{L11}$ and $R^{L12}$, $R^{L13}$ and $R^{L14}$, $R^{L15}$ and $R^{L16}$, or the like), and in such a case, they each represent a divalent hydrocarbon group having 1 to 15 carbon atoms, where examples thereof specifically include those each obtained by eliminating one hydrogen atom from each of those examples mentioned for the monovalent hydrocarbon group, and the like. Further, those two of $R^{L09}$ to $R^{L18}$, which are bonded to adjacent carbons, respectively, may bond to each other without through any atom therebetween, to form a double bond (for example, $R^{L09}$ and $R^{L11}$, $R^{L11}$ and $R^{L17}$, $R^{L15}$ and $R^{L17}$, or the like).

$R^{L19}$ represents a straight, branched, or cyclic alkyl group having 1 to 10 carbon atoms which may be substituted, or an aryl group having 6 to 20 carbon atoms which may be substituted, and examples thereof specifically include the same groups as those for $R^{L07}$, and the like.

$R^{L20}$ represents a straight, branched, or cyclic alkyl group having 1 to 10 carbon atoms which may be substituted, or an aryl group having 6 to 20 carbon atoms which may be substituted, and examples thereof specifically include the same groups as those for $R^{L07}$, and the like. X represents a divalent group that forms, together with a carbon atom to which it bonds, a substituted or unsubstituted cyclopentane ring, cyclohexane ring, or norbornane ring. $R^{L21}$ and $R^{L22}$ each independently represent a hydrogen atom, or a straight, branched, or cyclic monovalent hydrocarbon group having 1 to 10 carbon atoms; or $R^{L21}$ and $R^{L22}$ represent divalent groups, respectively, bonded to each other to form, together with a carbon atom to which the groups are bonded, a substituted or unsubstituted cyclopentane ring or cyclohexane ring. p represents 1 or 2.

$R^{L23}$ represents a straight, branched, or cyclic alkyl group having 1 to 10 carbon atoms which may be substituted, or an aryl group having 6 to 20 carbon atoms which may be substituted, and examples thereof specifically include the same groups as those for $R^{L07}$, and the like. Y represents a divalent group that forms, together with a carbon atom to which it bonds, a substituted or unsubstituted cyclopentane ring, cyclohexane ring, or norbornane ring. $R^{L24}$ and $R^{L25}$ each independently represent a hydrogen atom, or a straight, branched, or cyclic monovalent hydrocarbon group having 1 to 10 carbon atoms; or $R^{L24}$ and $R^{L25}$ represent divalent groups, respectively, bonded to each other to form, together with a carbon atom to which the groups are bonded, a substituted or unsubstituted cyclopentane ring or cyclohexane ring. q represents 1 or 2.

$R^{L26}$ represents a straight, branched, or cyclic alkyl group having 1 to 10 carbon atoms which may be substituted, or an aryl group having 6 to 20 carbon atoms which may be substituted, and examples thereof specifically include the same groups as those for $R^{L07}$, and the like. Z represents a divalent group that forms, together with a carbon atom to which it bonds, a substituted or unsubstituted cyclopentane ring, cyclohexane ring, or norbornane ring. $R^{L27}$ and $R^{L28}$ each independently represent a hydrogen atom, or a straight, branched, or cyclic monovalent hydrocarbon group having 1 to 10 carbon atoms; or $R^{L27}$ and $R^{L28}$ represent divalent groups, respectively, bonded to each other to form, together with a carbon atom to which the groups are bonded, a substituted or unsubstituted cyclopentane ring or cyclohexane ring.

Examples of straight or branched ones of the acid labile group represented by the formula (L1) specifically include the following groups:

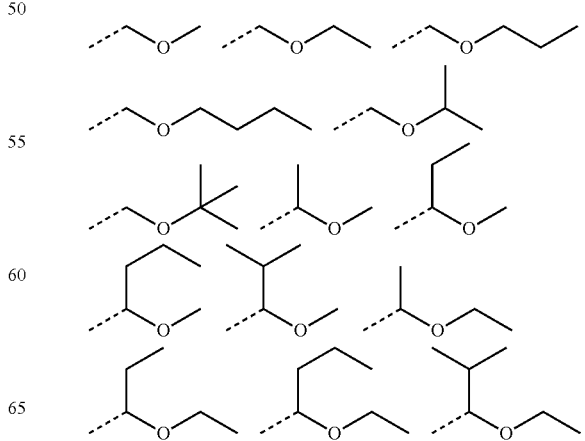

-continued

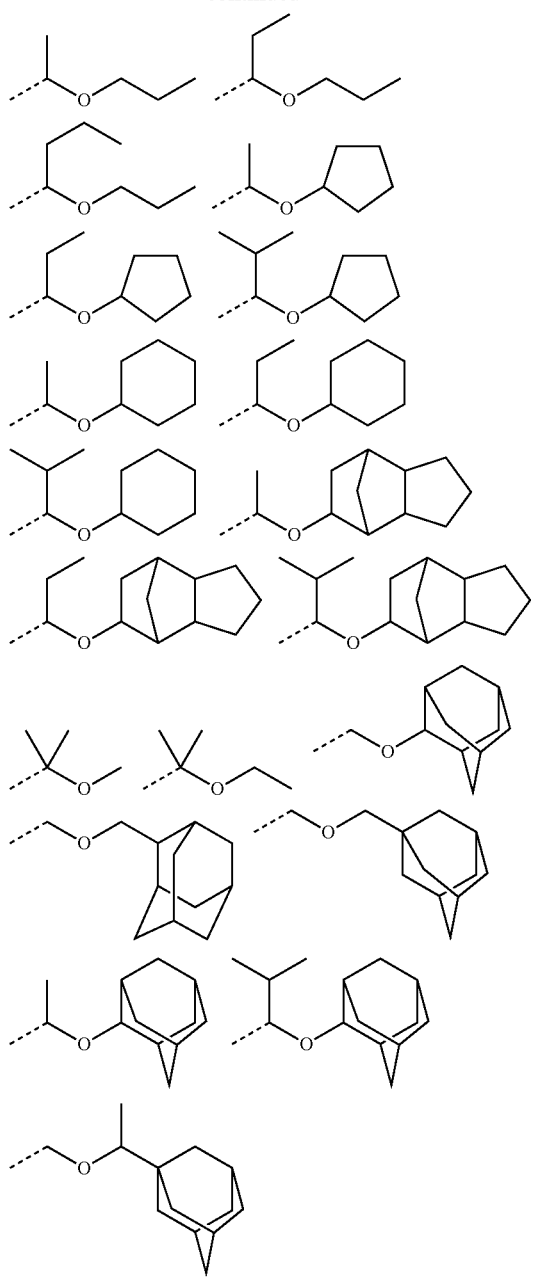

Examples of cyclic ones of the acid labile groups represented by the formula (L1) specifically include a tetrahydrofuran-2-yl group, 2-methyltetrahydrofuran-2-yl group, tetrahydropyran-2-yl group, 2-methyltetrahydropyran-2-yl group, and the like.

Examples of the acid labile group of the formula (L2) specifically include a tert-butyl group, tert-amyl group, and the following groups:

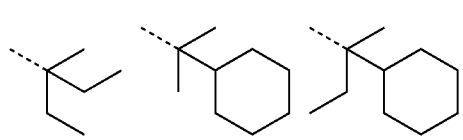

-continued

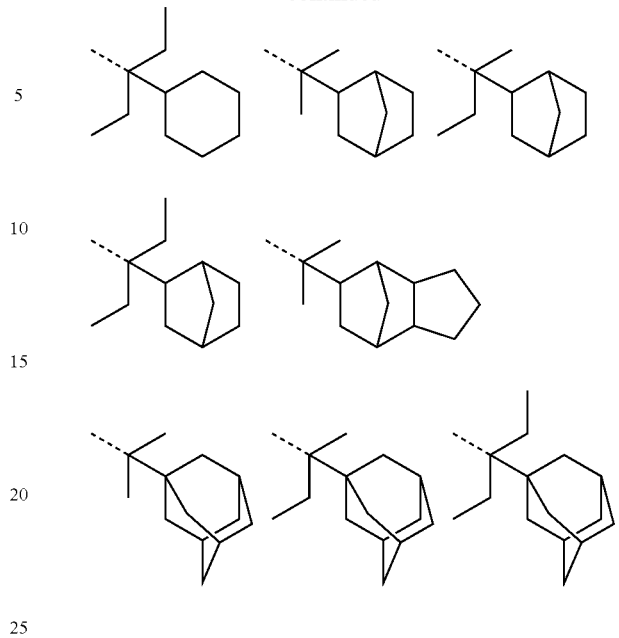

Examples of the acid labile group of the formula (L3) specifically include a 1-methylcyclopentyl group, 1-ethylcyclopentyl group, 1-n-propylcyclopentyl group, 1-isopropylcyclopentyl group, 1-n-butylcyclopentyl group, 1-sec-butylcyclopentyl group, 1-cyclohexylcyclopentyl group, 1-(4-methoxy-n-butyl)cyclopentyl group, 1-(bicyclo[2.2.1]heptan-2-yl)cyclopentyl group, 1-(7-oxabicyclo[2.2.1]heptan-2-yl)cyclopentyl group, 1-methylcyclohexyl group, 1-ethylcyclohexyl group, 3-methyl-1-cyclopenten-3-yl group, 3-ethyl-1-cyclopenten-3-yl group, 3-methyl-1-cyclohexen-3-yl group, 3-ethyl-1-cyclohexen-3-yl group, and the like.

Particularly preferable as the acid labile groups of the formula (L4) are groups represented by the following formulae (L4-1) to (L4-4):

(L4-1)

(L4-2)

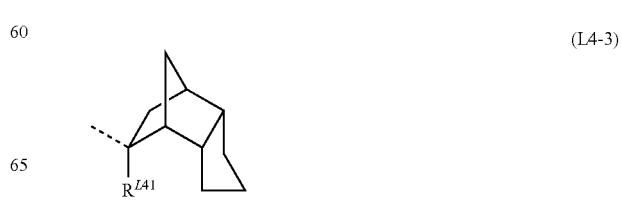
(L4-3)

(L4-4)

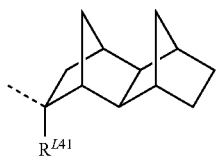

In the general formulae (L4-1) to (L4-4), broken lines each indicate a bonding position and a bonding direction. $R^{L41}$'s each independently represent a monovalent hydrocarbon group such as a straight, branched, or cyclic alkyl group and the like having 1 to 10 carbon atoms, and examples thereof specifically include a methyl group, ethyl group, propyl group, isopropyl group, n-butyl group, sec-butyl group, tert-butyl group, tert-amyl group, n-pentyl group, n-hexyl group, cyclopentyl group, cyclohexyl group, and the like.

Although examples of the groups of the general formulae (L4-1) to (L4-4) include an enantiomer, diastereomer, and the like, these general formulae (L4-1) to (L4-4) embracingly represent all of these stereoisomers. These stereoisomers may each be used solely, or may be used as a mixture.

For example, the general formula (L4-3) is to embracingly represent one kind or a mixture of two kinds selected from groups represented by the following general formulae (L4-3-1) and (L4-3-2):

(L4-3-1)

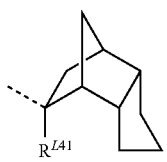

(L4-3-2)

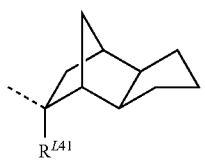

wherein $R^{L41}$ represents the same meaning as before.

Further, the general formula (L4-4) is to embracingly represent one kind or a mixture of two or more kinds selected from groups represented by the following general formulae (L4-4-1) to (L4-4-4):

(L4-4-1)

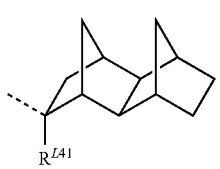

(L4-4-2)

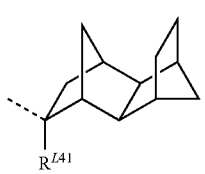

(L4-4-3)

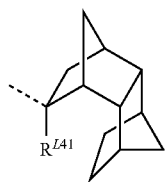

(L4-4-4)

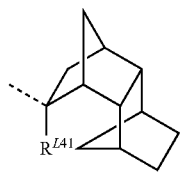

wherein $R^{L41}$ represents the same meaning as before.

The general formulae (L4-1) to (L4-4), (L4-3-1) and (L4-3-2), and formulae (L4-4-1) to (L4-4-4) are to embracingly represent even enantiomers and enantiomer mixtures of the groups represented by these formulae.

It is noted that the bonding direction of each of the groups of the general formulae (L4-1) to (L4-4), (L4-3-1) and (L4-3-2), and formulae (L4-4-1) to (L4-4-4) is placed at an exo side relative to the bicyclo[2.2.1]heptane ring, thereby realizing a higher reactivity in an acid catalyzed elimination reaction (Japanese Patent Application Laid-Open Publication No. 2000-336121). In production of monomers each having a tertiary exo-alkyl group having a bicyclo[2.2.1]heptane structure as a substituent group, the monomers occasionally contain monomers each substituted with an endo-alkyl group represented by the following general formulae (L4-1-endo) to (L4-4-endo); where the exo ratio is preferably 50% or more, and the exo ratio is more preferably 80% or more, for realization of an excellent reactivity:

(L4-1-endo)

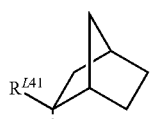

(L4-2-endo)

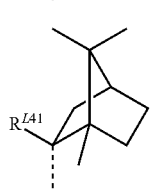

(L4-3-endo)

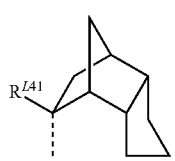

(L4-4-endo)

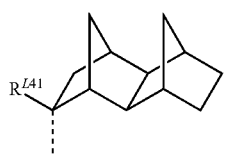

wherein $R^{L41}$ represents the same meaning as before.

Examples of the acid labile group of the formula (L4) specifically include the following groups:

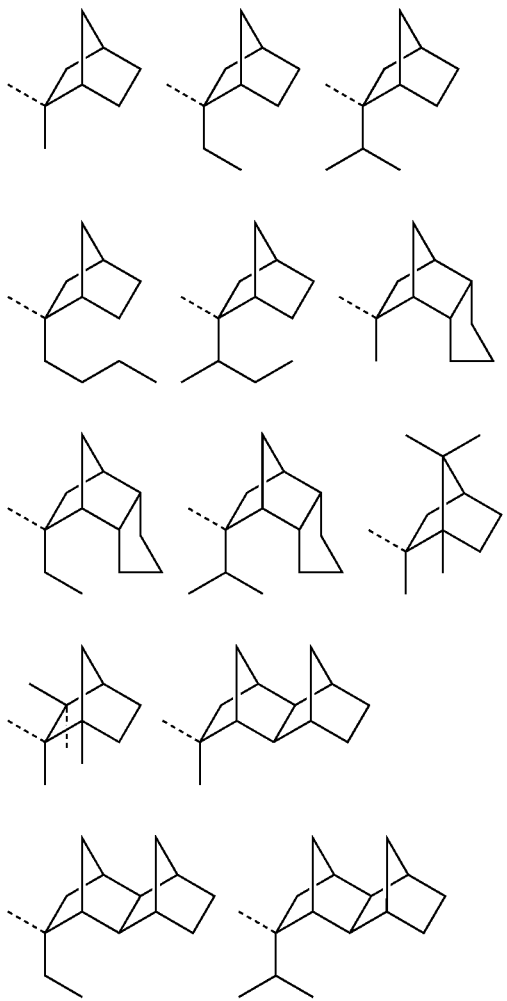

Examples of the acid labile group of the formula (L5) specifically include the following groups:

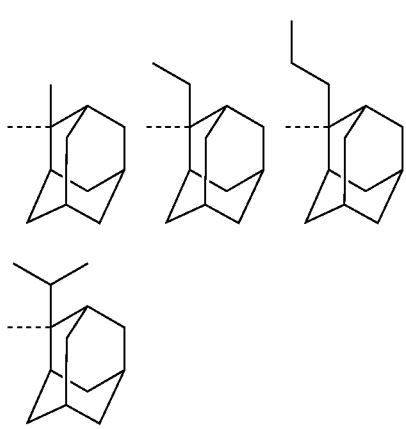

Examples of the acid labile group of the formula (L6) specifically include the following groups:

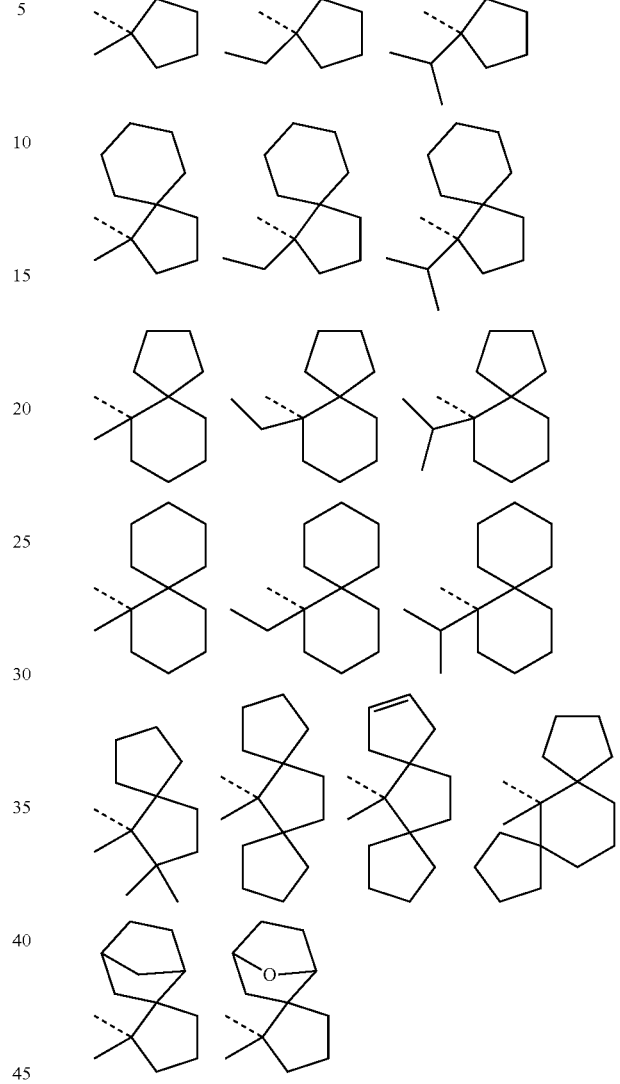

Examples of the acid labile group of the formula (L7) specifically include the following groups:

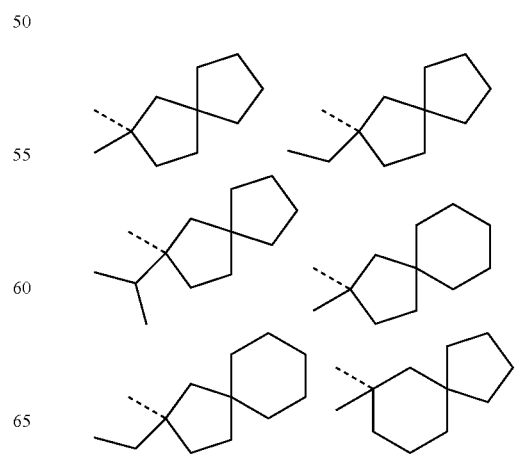

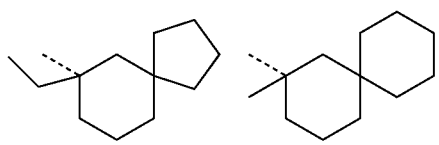
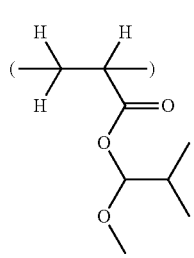
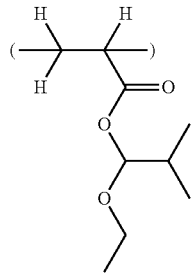
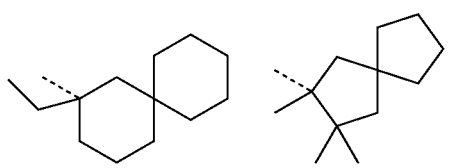
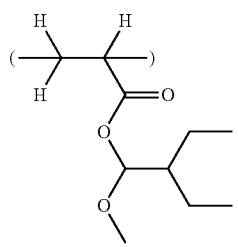
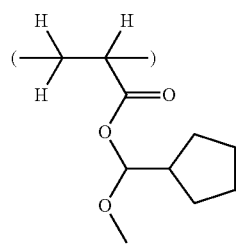
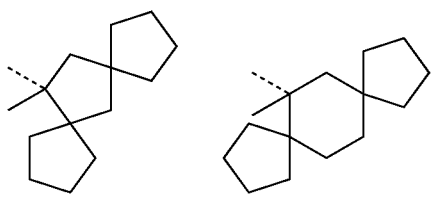
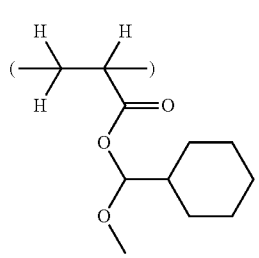
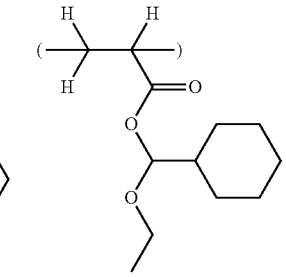
Examples of the acid labile group of the formula (L8) specifically include the following groups:
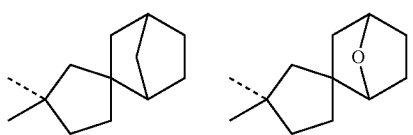
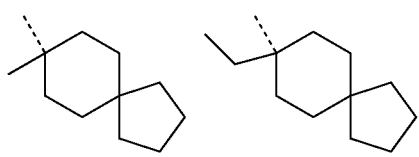
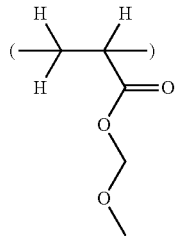
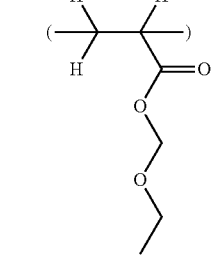
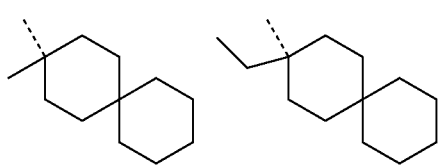
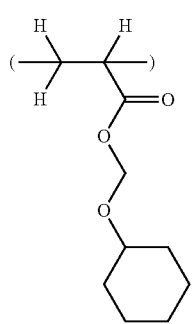
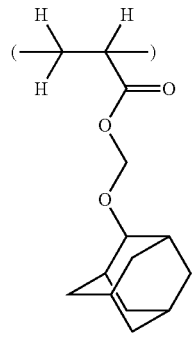
Shown below are specific examples of the acid labile repeating unit (6) having the above exemplified acid labile group, without limited thereto:

-continued
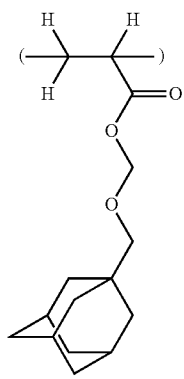 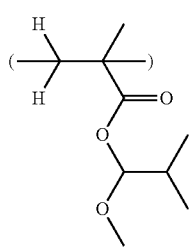
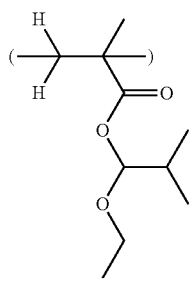 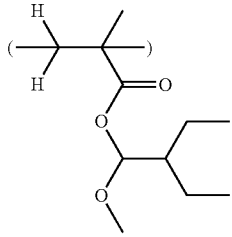
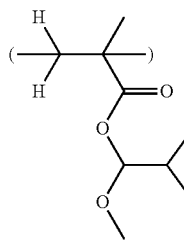 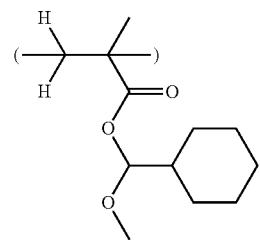
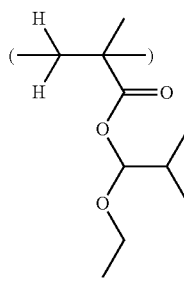 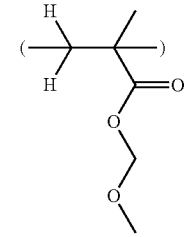
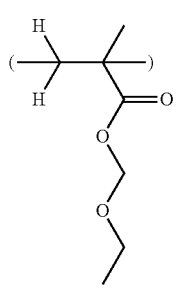 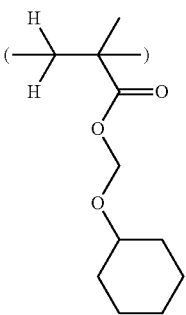
-continued
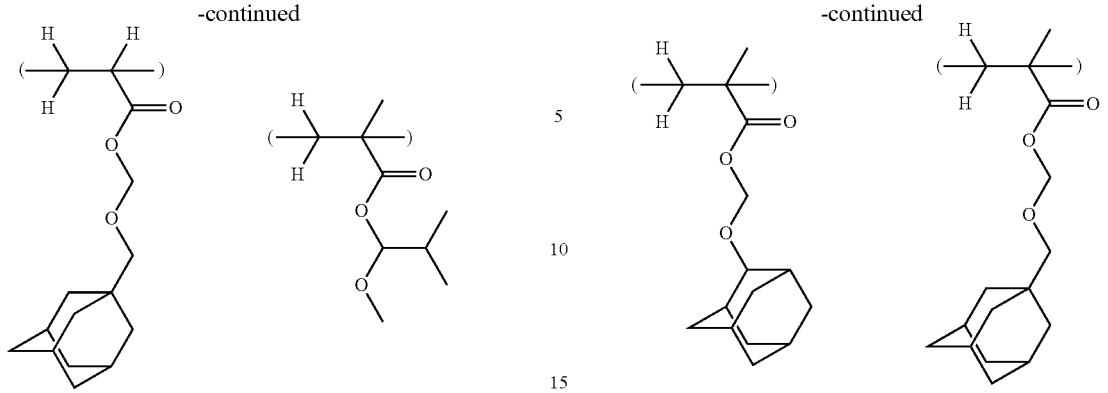
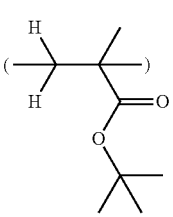 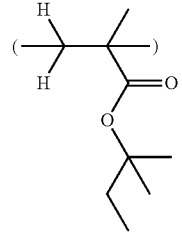
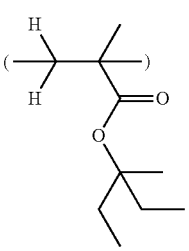 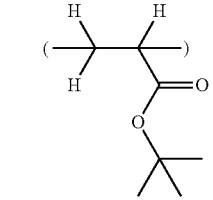
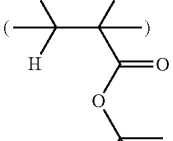 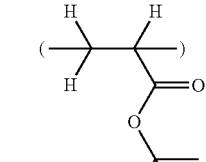
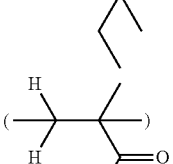 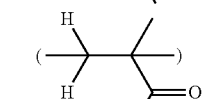
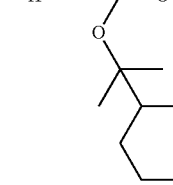 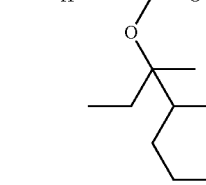
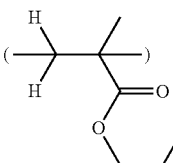 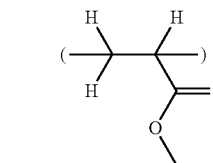
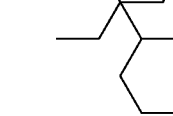 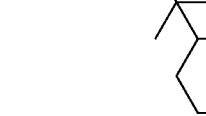

-continued
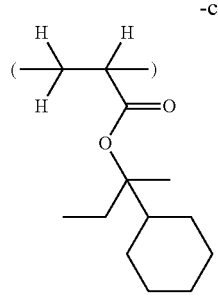 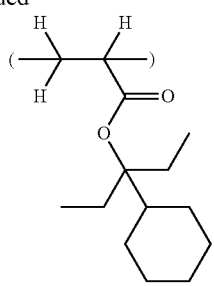
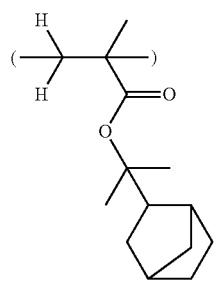 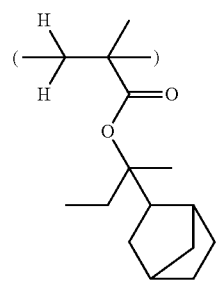
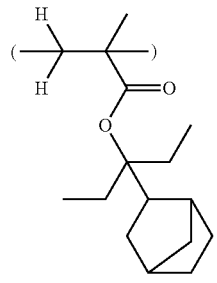 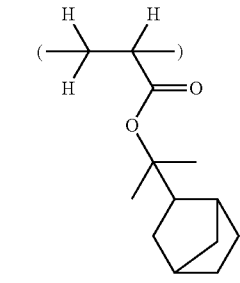
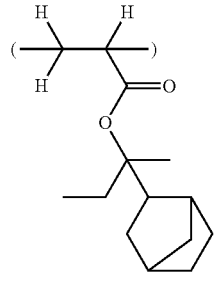 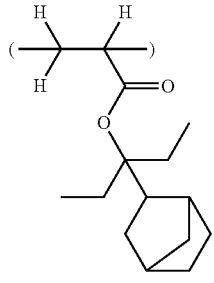
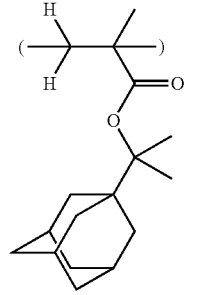 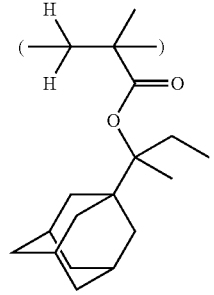
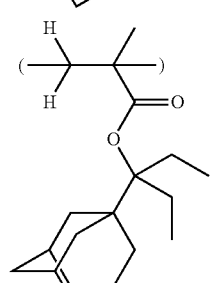 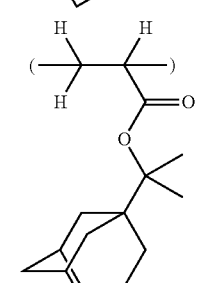
-continued
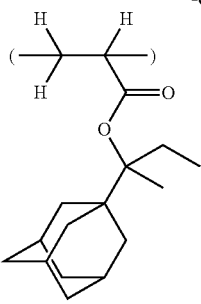 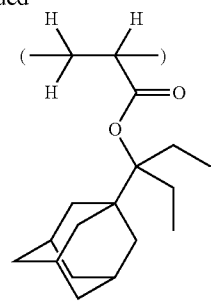
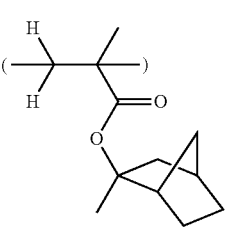 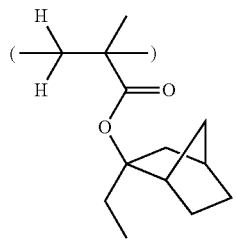
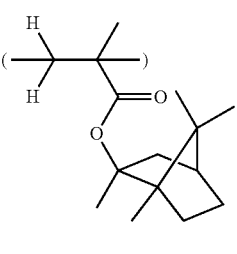 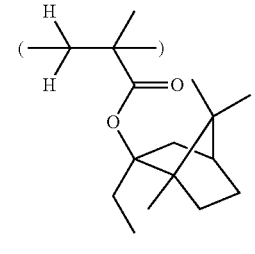
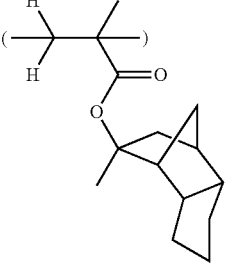 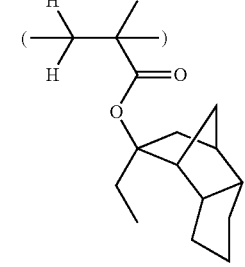
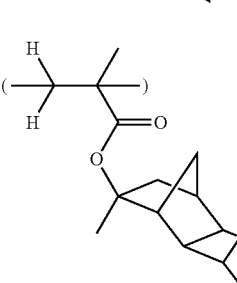 
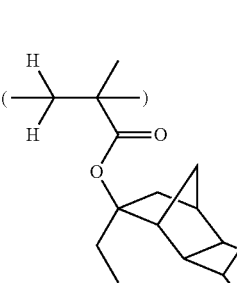 

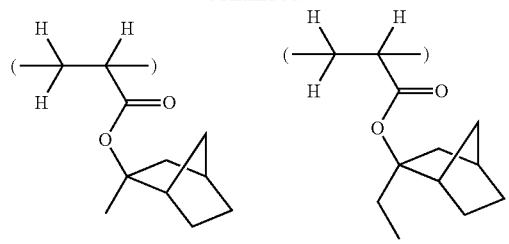
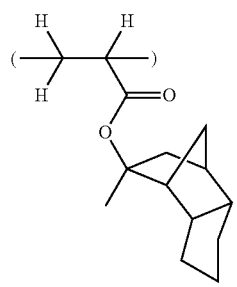
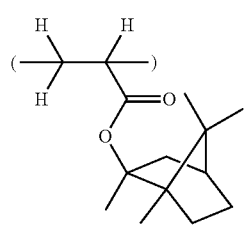
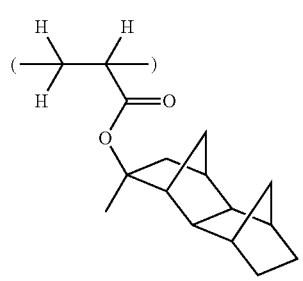
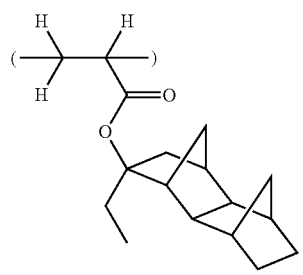
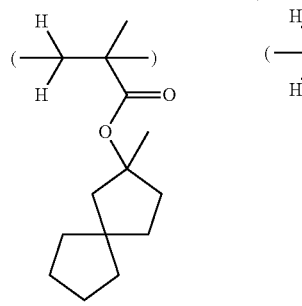
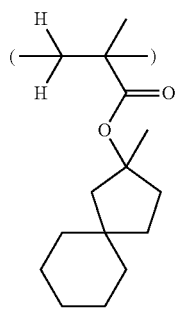
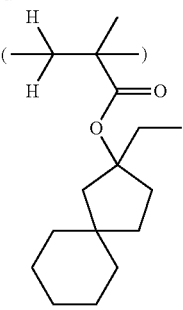
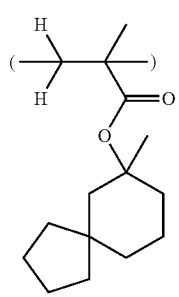
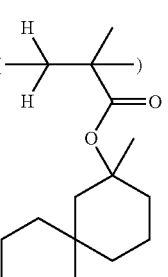
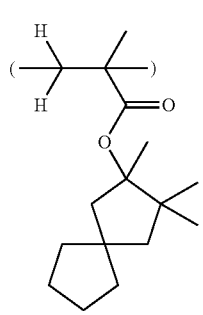
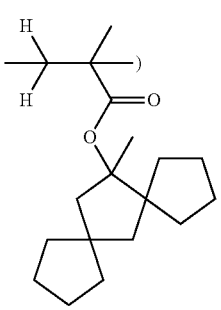
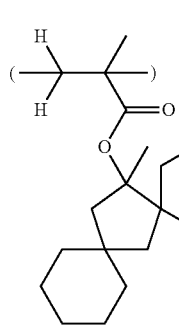
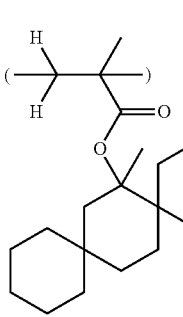

-continued
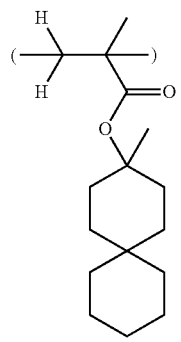 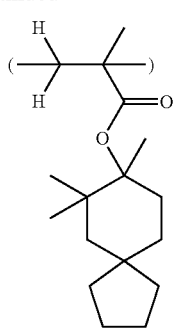
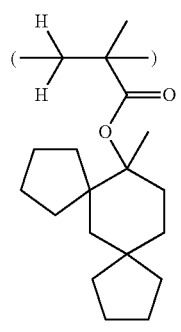 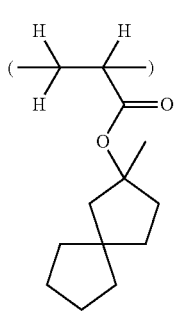
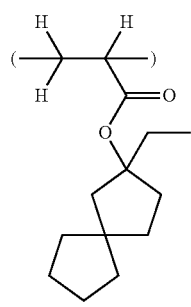 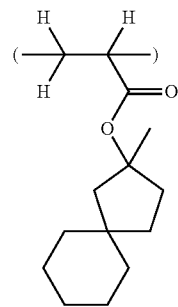
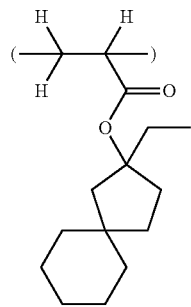 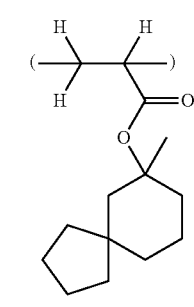
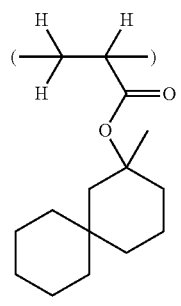 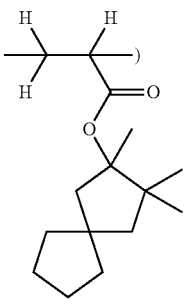
-continued
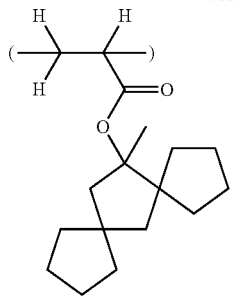 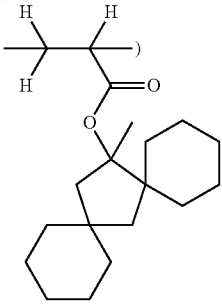
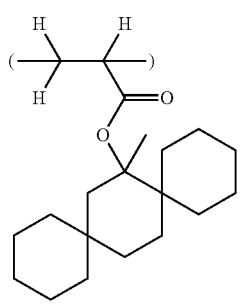 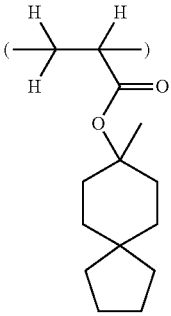
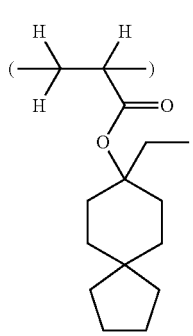 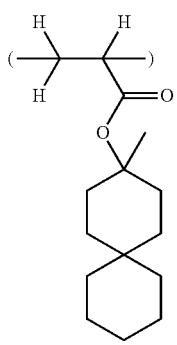
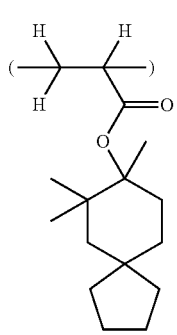 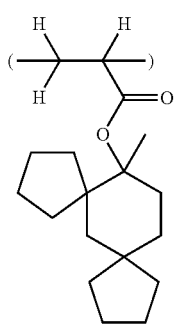
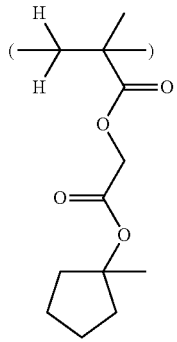 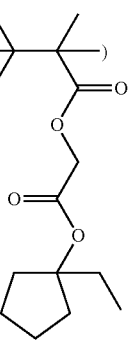

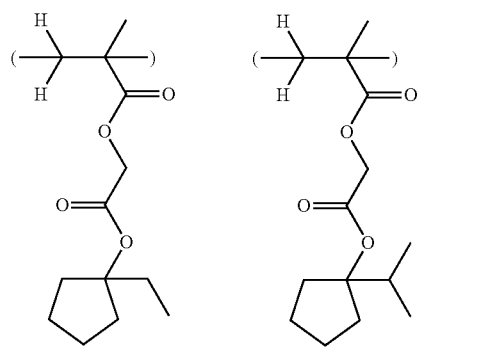
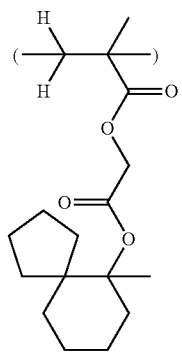
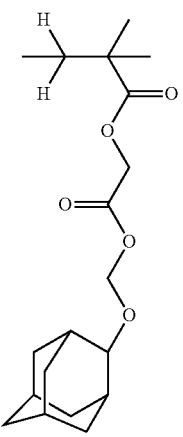
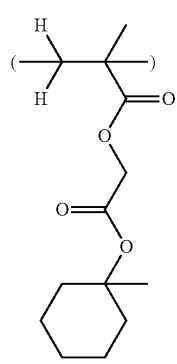
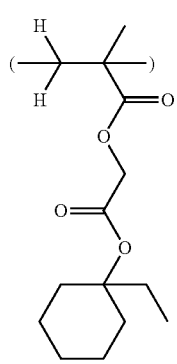
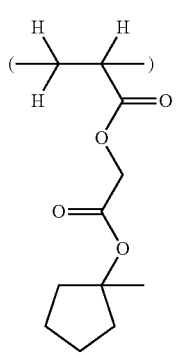
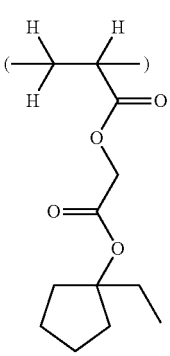
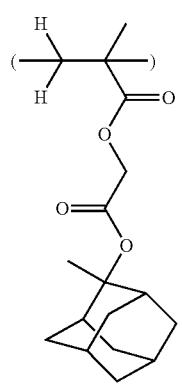
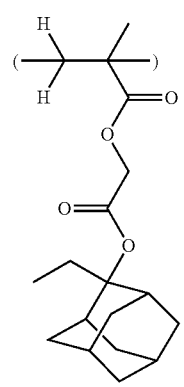
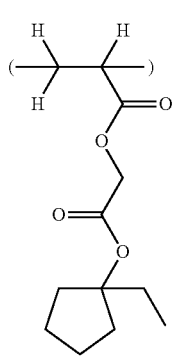
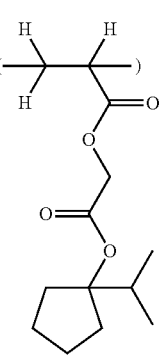
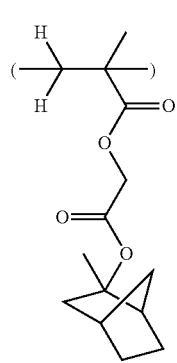
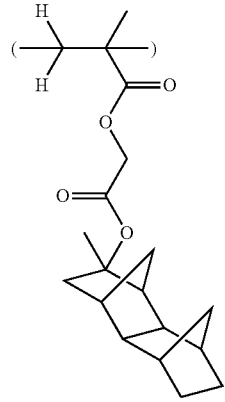
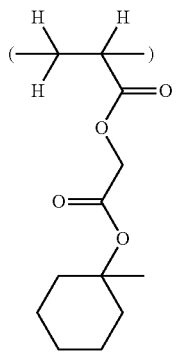
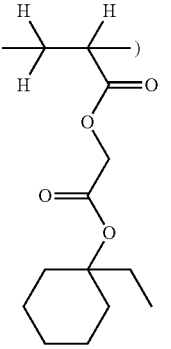

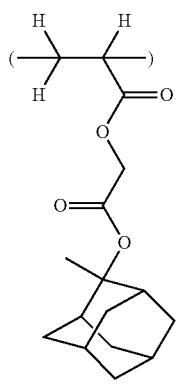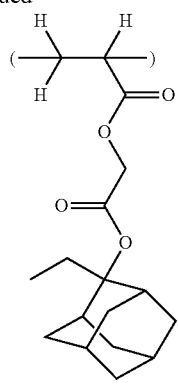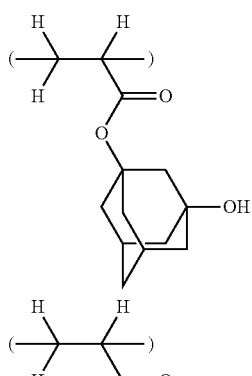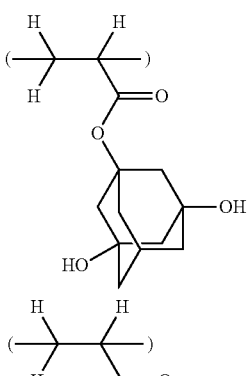

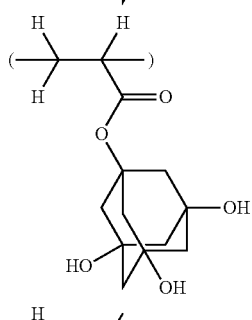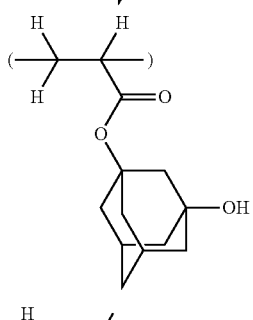

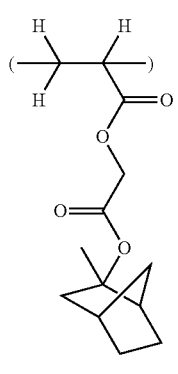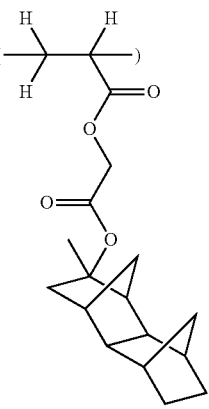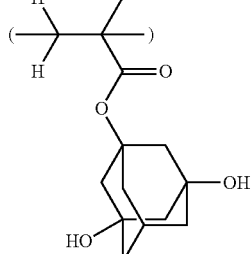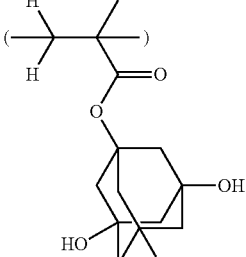

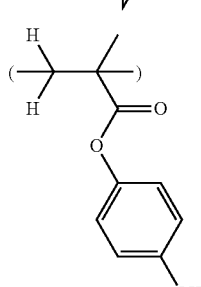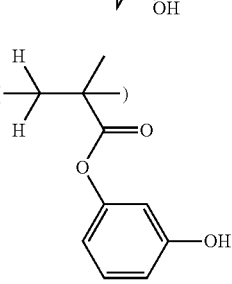

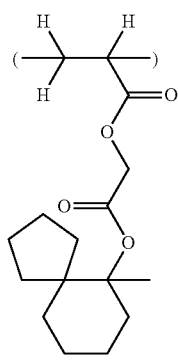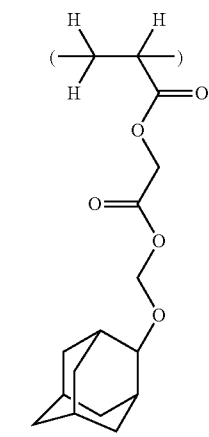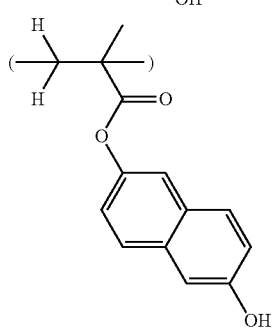

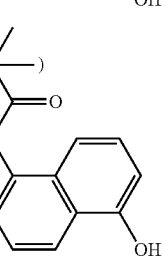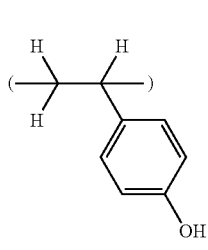

It is preferable that the polymer of the component (A) further contain, in addition to the repeating unit having the structure shown by the above general formulae (1) and/or (2), a repeating unit having an adhesive group of a hydroxyl group and/or a lactone ring. When the polymer of the component (A) contains a repeating unit having an adhesive group of a hydroxyl group and a lactone ring as described above, LWR can be improved more effectively.

As the specific examples of the repeating unit having an adhesive group of a hydroxyl group and a lactone group, the following repeating units, though not limited to them, can be mentioned.

35
-continued
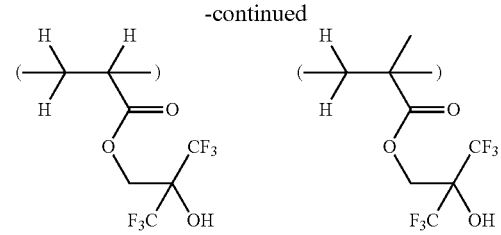
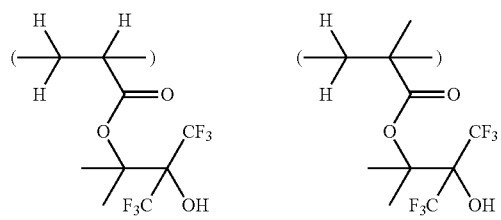
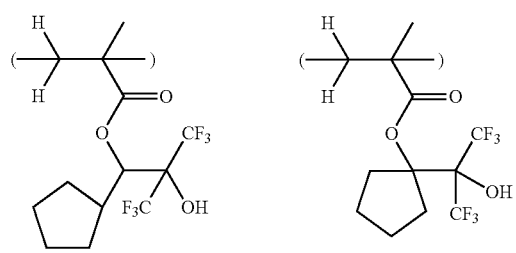
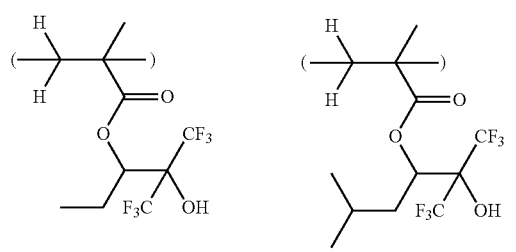
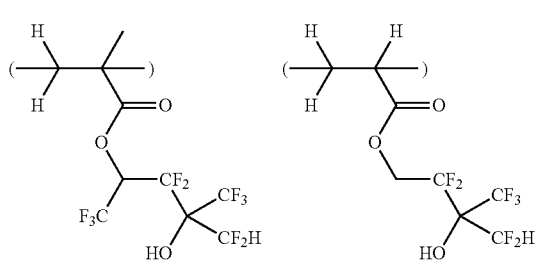
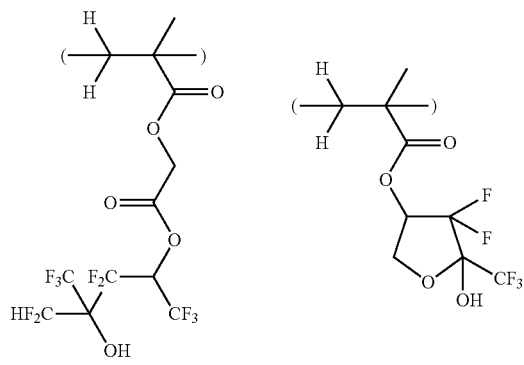
36
-continued
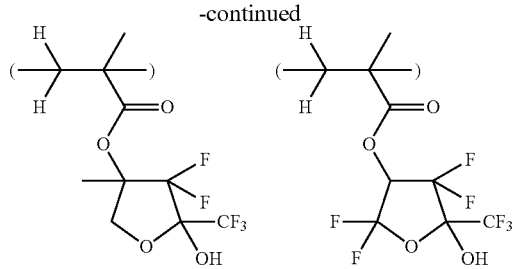
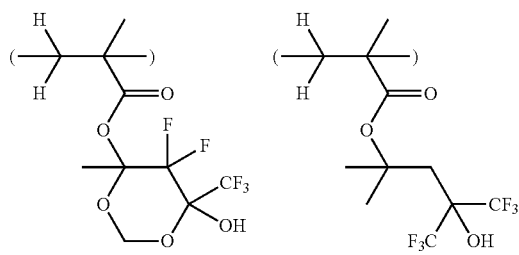
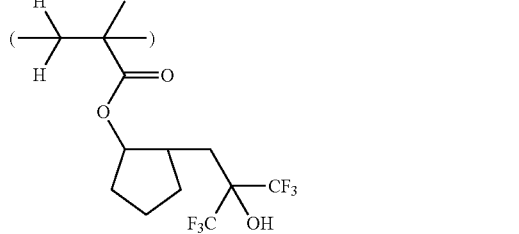
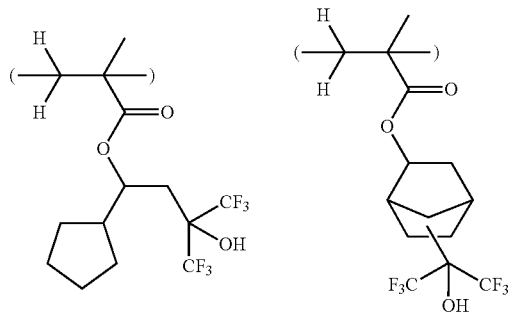
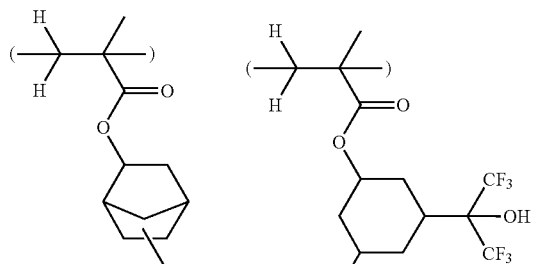
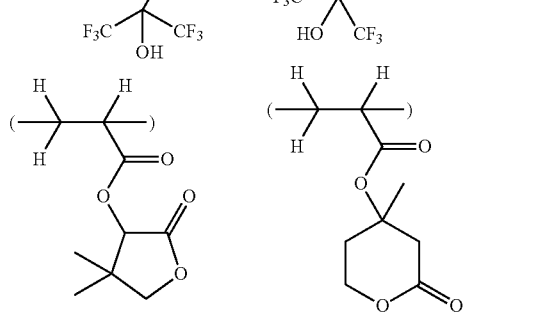

-continued
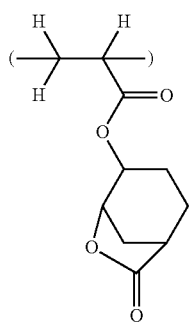 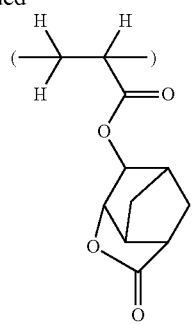 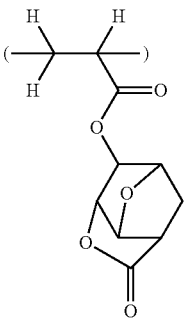 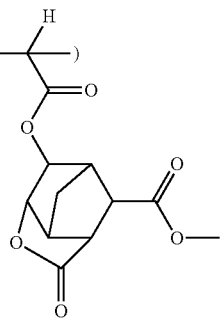
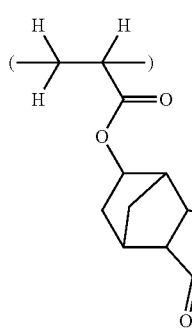 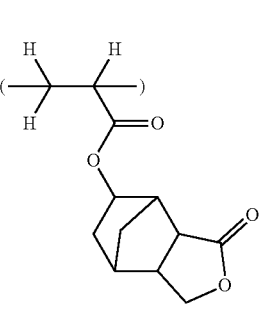 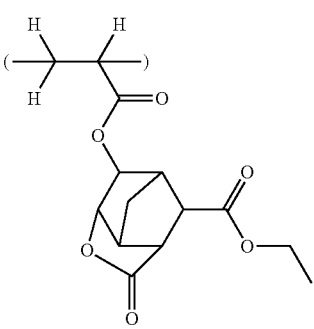
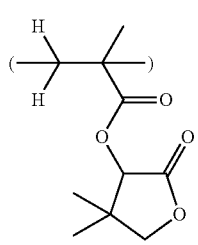 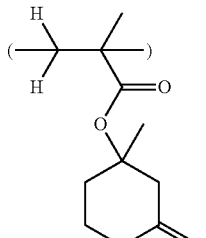 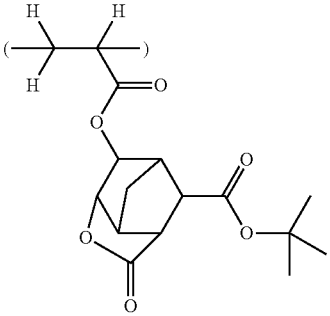
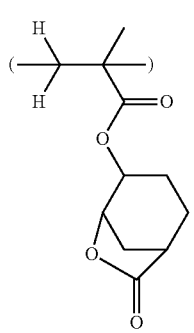 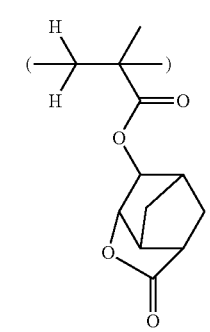 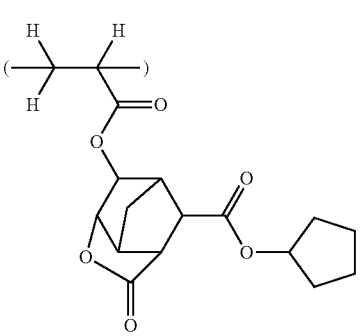
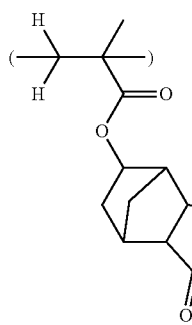 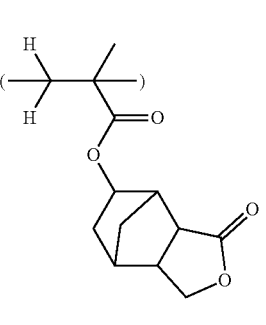 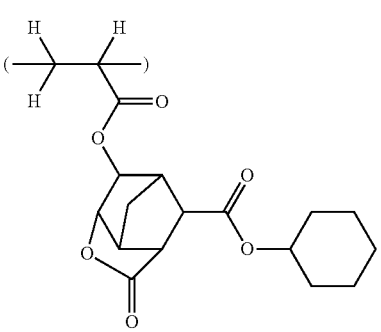

-continued
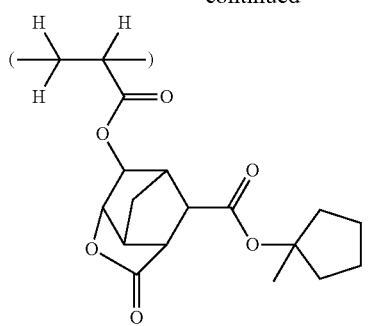
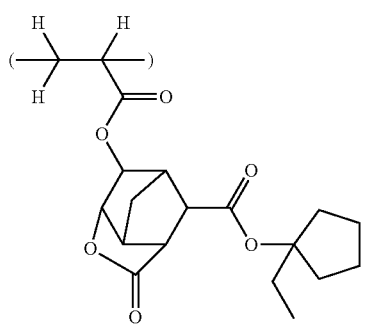
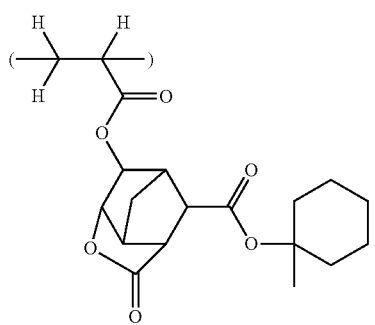
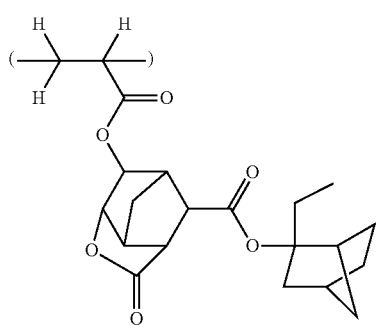
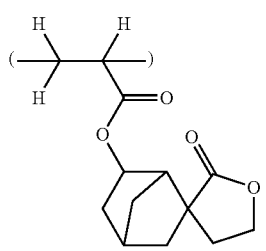
-continued
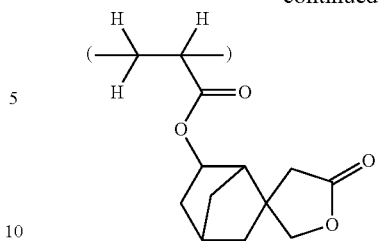
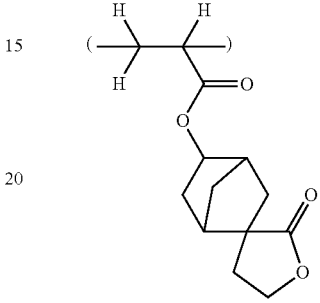
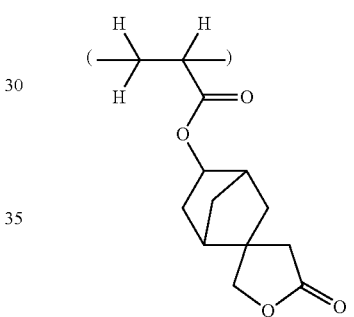
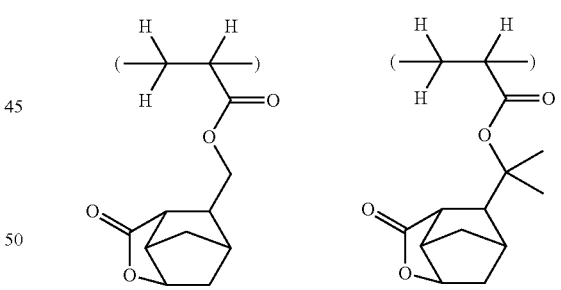
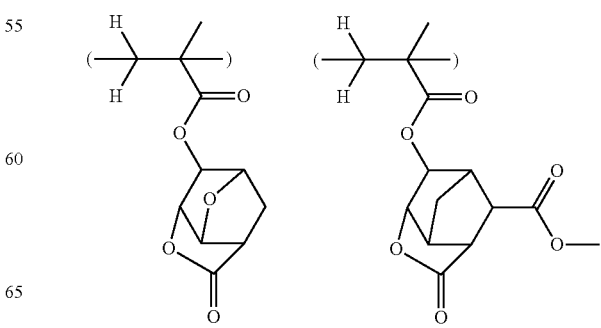

41
-continued
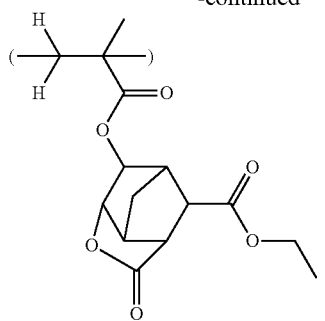
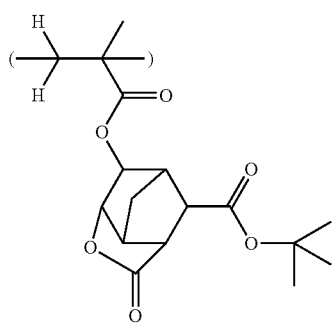
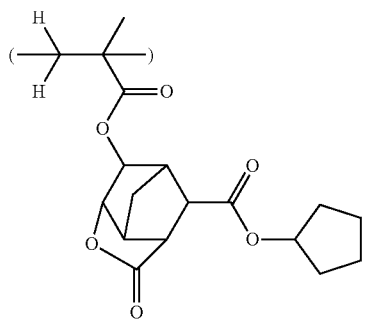
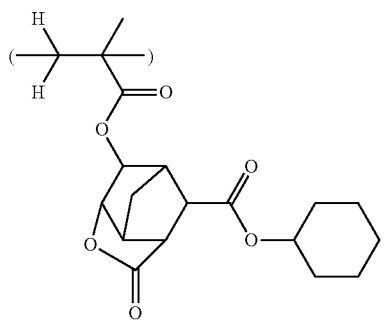
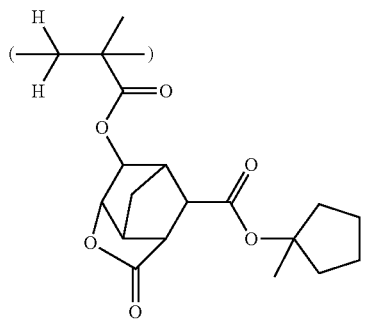
42
-continued
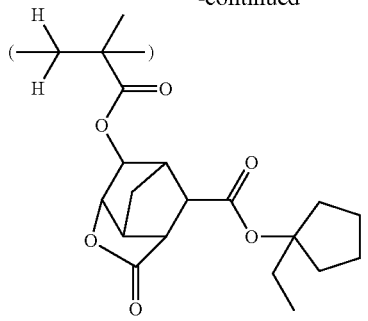
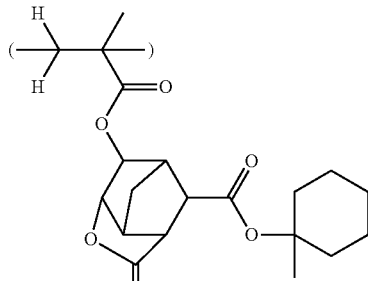
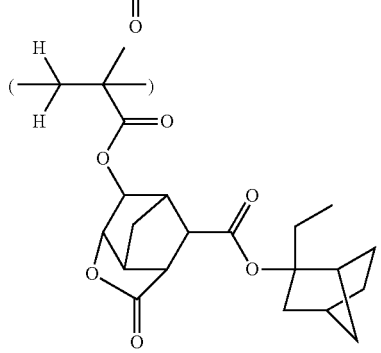
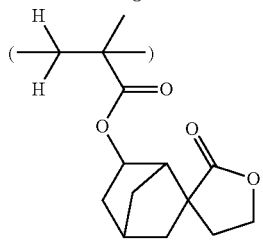
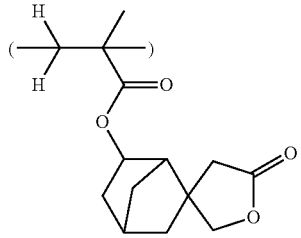
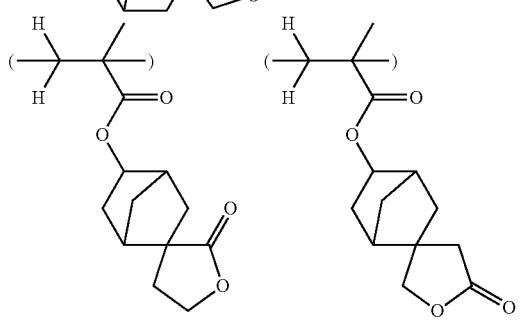

-continued

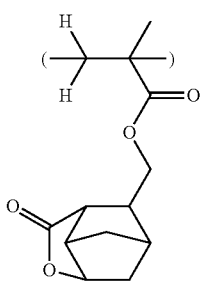 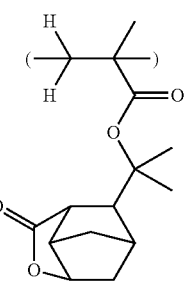

In addition, the polymer of the component (A) of the resist composition of the present invention may contain, as appropriate, a repeating unit other than the repeating unit having a structure shown by the above general formulae (1) and/or (2), the acid-labile unit shown by the above general formula (6), and the unit having a hydroxyl group and/or a lactone group; as illustrative examples of such unit, a unit containing a carboxyl group and a fluoroalkyl group can be mentioned. Specific examples thereof are shown below, but not limited to them.

However, especially in the case of a carboxyl group, content of the repeating unit containing a carboxyl group is preferably 10% or less by mole relative to total repeating units. Within this range, there is no fear of losing pattern rectangularity or deterioration of pattern fall resistance by swelling; and in addition, there is a case that dissolution rate may be effectively controlled.

In addition, the acid-labile unit may include a unit having a bridged cyclic structure.

When amount of this unit is less than 10% by mole relative to total repeating units, it is confirmed that pattern fall during the time of development can be avoided more surely, and there is no fear of deterioration of LWR; and thus, this amount is preferable.

Specific examples of these units containing a carboxyl group or a fluoroalkyl group and the unit having a bridged cyclic structure are shown below, though not limited to them.

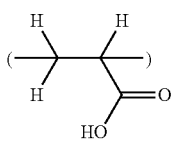 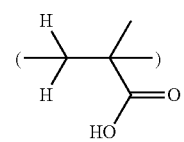

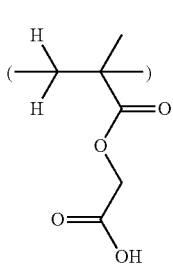 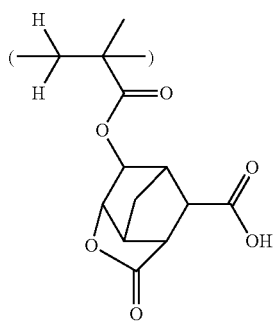

-continued

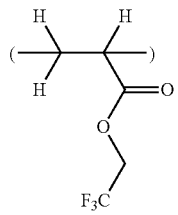 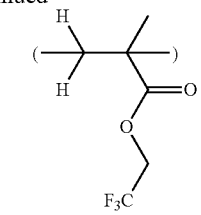

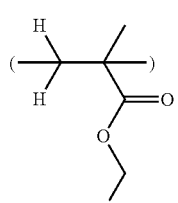 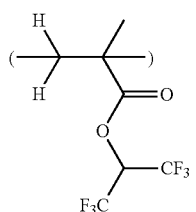

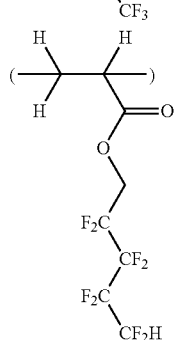 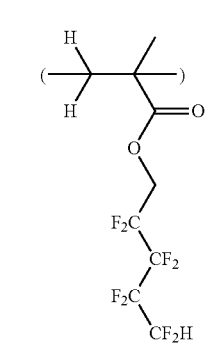

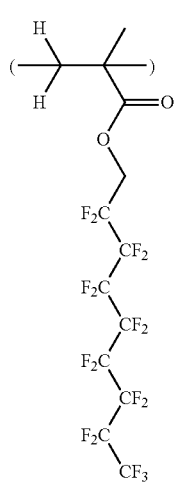 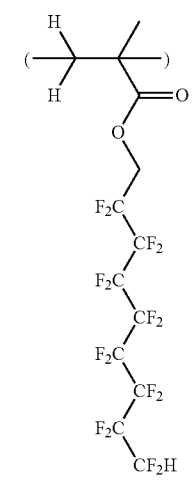

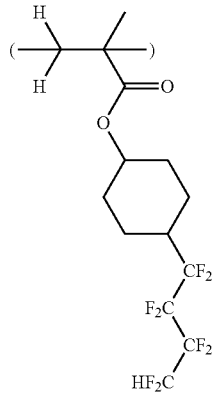 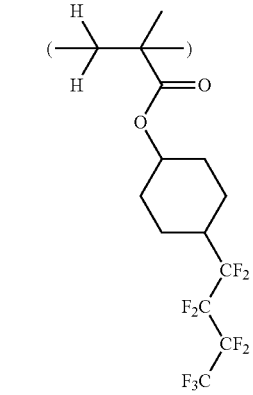

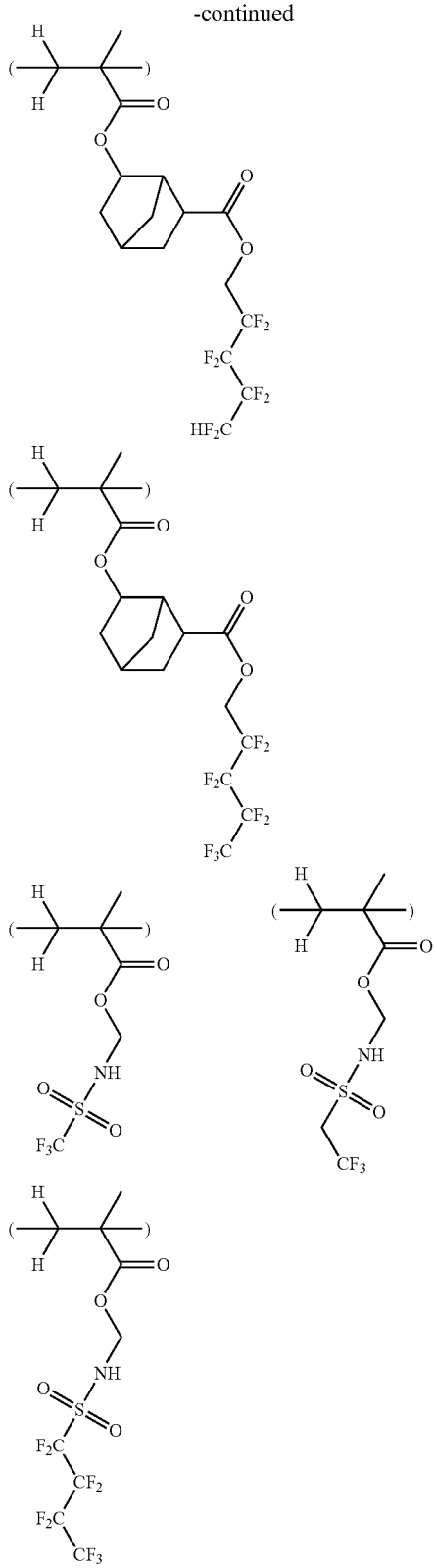

mole, total content of the acid-labile units shown by the above general formula (6) is made "b %" by mole, total content of the repeating units having a hydroxyl group is made "c %" by mole, and total content of the repeating units having a lactone ring is made "d %" by mole, it is preferable that they satisfy the following conditions:

$a+b+c+d=100$, $30 \le a \le 80$, $0 \le b \le 50$, $0 \le c \le 50$, and $20 \le d \le 70$, or particularly preferable that they satisfy the following conditions:

$a+b+c+d=100$, $30 \le a \le 80$, $0 \le b \le 40$, $0 \le c \le 20$, and $20 \le d \le 50$.

As to the molecular weight of the polymer of the component (A) in the resist composition of the present invention, when the weight-average molecular weight (Mw) thereof is too small, dissolution into water takes place easily, while when the weight-average molecular weight thereof is too large, it may cause, with a high possibility, a poor dissolution into an alkaline solution and an application defect during the time of spin coating. From this point of view, the weight-average molecular weight thereof by a gel permeation chromatography (GPC) is in the range of 1,000 to 500,000, or preferably in the range of 2,000 to 30,000, based on the polystyrene-equivalent molecular weight.

The acid generated by the photo acid generator of the component (B) contained in the resist composition of the present invention is a sulfonic acid shown by the following general formula (3).

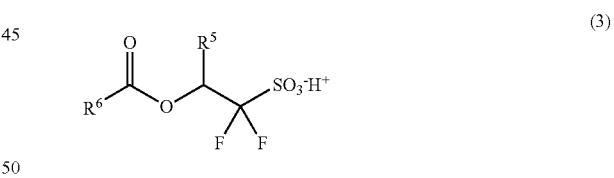

(3)

(In the formula, $R^5$ represents a hydrogen atom or a trifluoromethyl group. $R^6$ represents a linear, a branched, or a cyclic alkyl group, substituted or unsubstituted, having 1 to 23 carbon atoms, or an aryl group, substituted or unsubstituted, having 6 to 14 carbon atoms.)

As the specific examples of the sulfonic acid shown by the above general formula (3), compounds having the following structures, though not limited to them, can be mentioned.

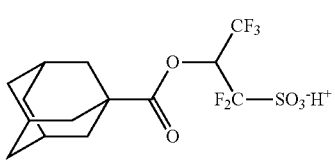

As to each of the composition ratios of the respective repeating units that constitute the polymer of the component (A) in the resist composition of the present invention, when total content of the acid-labile units having a structure shown by the above general formulae (1) and/or (2) is made "a %" by -continued
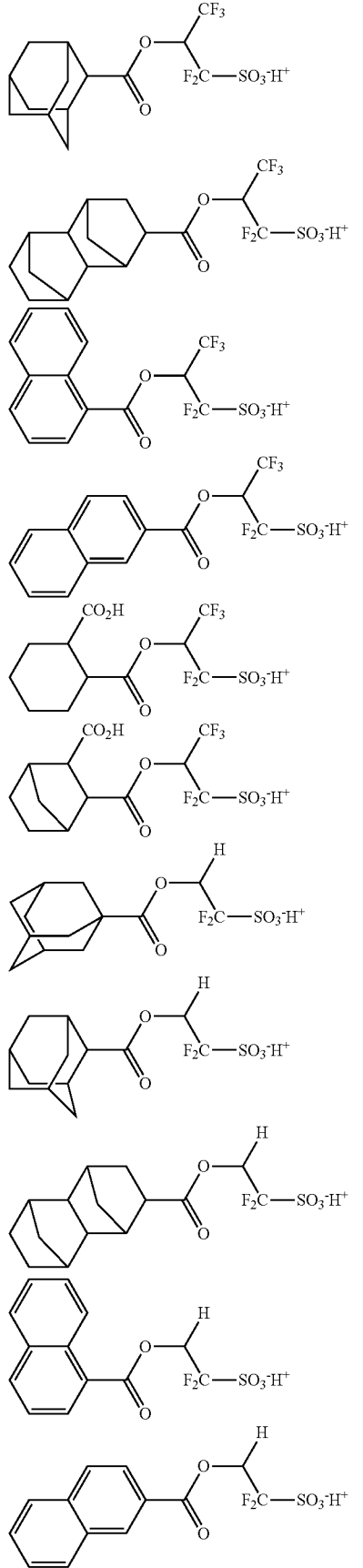
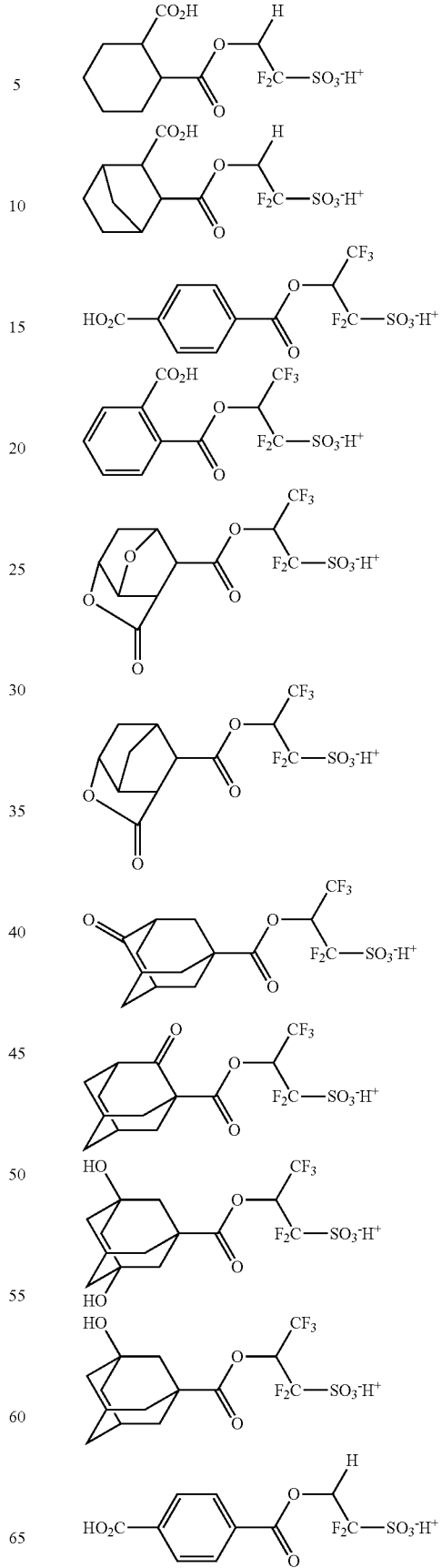

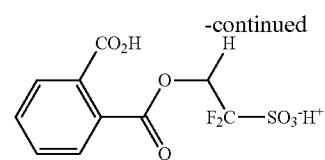
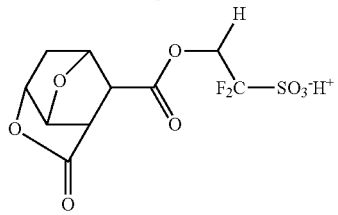
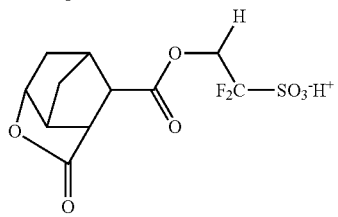
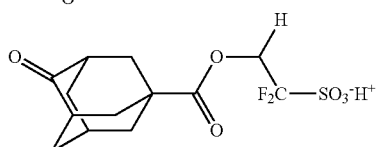
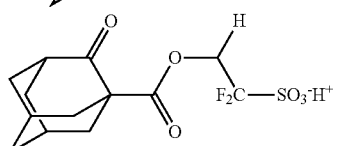
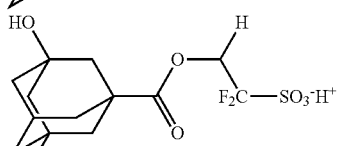
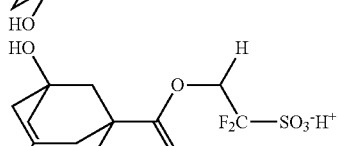
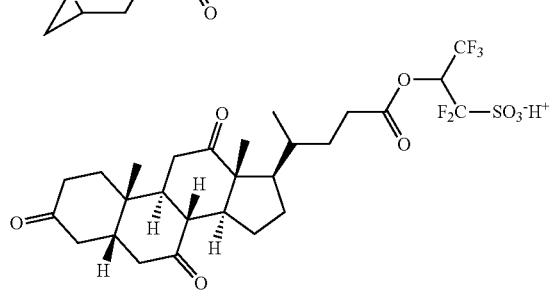
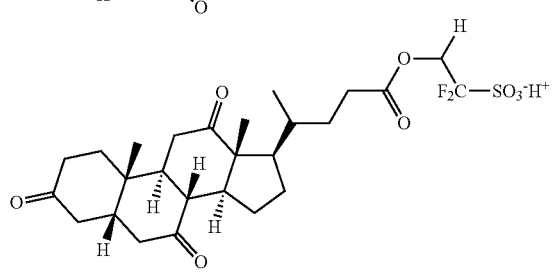

The photo acid generator of the component (B) contained in the resist composition of the present invention generates a sulfonic acid shown by the above general formula (3) by responding to a high energy beam. As the specific example of the photo acid generator of the component (B), a photo acid generator shown by the following general formula (B-1) can be mentioned:

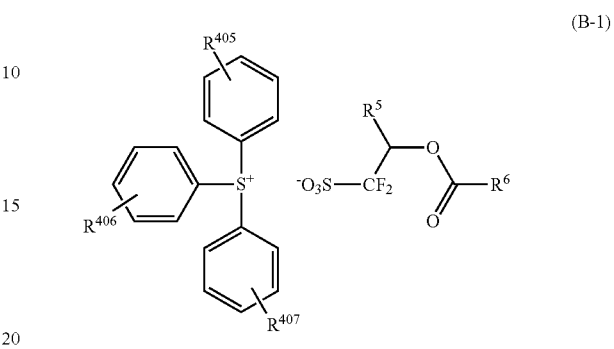

(B-1)

wherein $R^5$ and $R^6$ represent the same meanings as before. Each $R^{405}$, $R^{406}$, and $R^{407}$ independently represents a hydrogen atom, or a linear, a branched, or a cyclic monovalent hydrocarbon group having 1 to 20 carbon atoms and optionally containing a hetero atom, especially an alkyl group or an alkoxy group; and specific example of the hydrocarbon group optionally containing a hetero atom includes a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, a cyclohexyl group, an ethyl cyclopentyl group, a butyl cyclopentyl group, an ethyl cyclohexyl group, a butyl cyclohexyl group, an adamantyl group, an ethyl adamantyl group, a butyl adamantyl group, a group having a hetero atom group such as —O—, —S—, —SO—, —SO$_2$—, —NH—, —C(=O)—, —C(=O)O—, and —C(=O)NH— inserted between an arbitrary carbon-carbon bond of the foregoing groups, and a group having an arbitrary hydrogen atom of the foregoing groups substituted with a functional group such as —OH, —NH$_2$, —CHO, and —CO$_2$H.

It is preferable that amount of the photo acid generator of the component (B) be 2 to 10% by weight relative to amount of the polymer of the component (A) and amount of the onium sulfonate of the component (C) be more than amount of the photo acid generator of the component (B) in terms of mole, because with these amounts there are no problems in deterioration of resolution and in occurrence of foreign matters during development and resist removal.

The photo acid generator of the component (B) when $R^5$ in the above general formula (3) is a trifluoromethyl group can be synthesized with referring to Japanese Patent Laid-Open Publication No. 2007-145797.

For example, the synthesis can be done by reacting an aliphatic carboxylic acid ester or an aromatic carboxylic acid ester of 1,1,3,3,3-pentafluoropropene-2-yl represented by 1,1,3,3,3-pentafluoropropene-2-yl benzoate developed by using 1,1,1,3,3,3-hexafluoro-2-propanol as a starting raw material (refer to Japanese Patent Laid-Open Publication No. H06-157381) with sodium hydrogen sulfite or with sodium sulfite in the presence of a radical initiator such as azobisisobutyronitrile and benzoyl peroxide in water, an alcohol, or the mixture thereof as a solvent. To mention further, a sulfonium salt having a structure of a carboxylic acid ester different from that of the original carboxylic acid ester can be obtained as following; namely, a portion of the carboxylic acid ester in the sulfonate of the sulfonate salt obtained by the foregoing method is decomposed by hydrolysis by using an alkali such as sodium hydroxide and potassium hydroxide or by solvolysis by using an alcohol and an alkali, and then, the product thereof is reacted appropriately with an aliphatic carboxylic acid halide or an aliphatic carboxylic acid anhydride, with an aromatic carboxylic acid halide or an aromatic carboxylic acid anhydride, or with the like. Details of these can be found in Japanese Patent Laid-Open Publication No. 2007-145797 and so on.

The photo acid generator of the component (B) when $R^5$ in the above general formula (3) is a hydrogen atom can be synthesized with referring to Japanese Patent Laid-Open Publication No. 2009-7327.

For example, 2-bromo-2,2-difluoroethanol is reacted with a carboxylic acid chloride of various kinds to obtain a fluorine-containing brominated ester, which is then reacted with a sulfination agent such as a dithionite salt for sulfination to obtain a fluorine-containing sulfinate salt. This fluorine-containing sulfinate salt is oxidized by using an oxidizing agent such as hydrogen peroxide to obtain a fluorine-containing sulfonate salt, which is then reacted with a heretofore known onium salt to obtain an onium fluorine-containing sulfonate salt. Details of these can be found in Japanese Patent Laid-Open Publication No. 2009-7327.

The onium sulfonate of the component (C) in the resist composition of the present invention is shown by the following general formula (4).

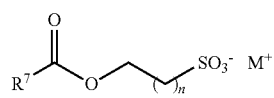

(4)

(In the formula, $R^7$ represents a monovalent hydrocarbon group optionally containing a hetero atom, excluding the cases that $R^7$ represents a vinyl group and an isopropenyl group. "n" represents an integer of 1 to 3, and $M^+$ represents a counter cation having a substituent and is any of a sulfonium cation, an iodonium cation, and an ammonium cation.)

Here, as an illustrative example of the onium sulfonate of the component (C), a sulfonium sulfonate shown by the following general formula (5) can be mentioned. Meanwhile, a synthesis method for the sulfonium sulfonate shown by the following general formula (5) can be referred to the paragraph [0177] in Japanese Patent Laid-Open Publication No. 2010-155824.

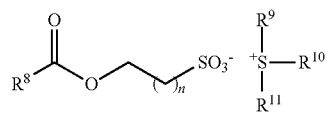

(5)

(In the formula, $R^8$ represents a monovalent hydrocarbon group optionally containing a hetero atom. "n" represents an integer of 1 to 3. Each $R^9$, $R^{10}$, and $R^{11}$ independently represent any of a linear or a branched alkyl group, alkenyl group, and oxoalkyl group, substituted or unsubstituted, having 1 to 10 carbon atoms, or any of an aryl, an aralkyl, and an aryl oxoalkyl group, substituted or unsubstituted, having 6 to 18 carbon atoms, or any two or more of $R^9$, $R^{10}$, and $R^{11}$ may be bonded with each other to form a ring together with a sulfur atom in the formula.)

As the specific example of the onium sulfonate shown by the above general formula (4), a compound having a structure containing each of a sulfonium cation, an iodonium cation, or an ammonium cation, though not limited to them, can be mentioned.

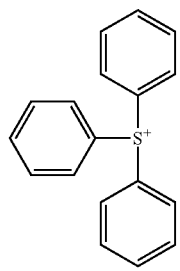 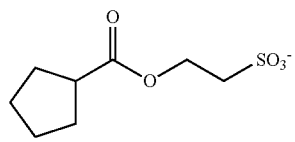

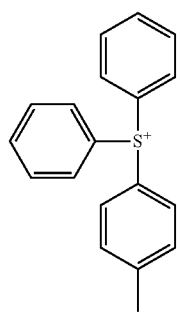 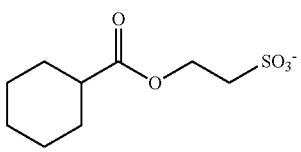

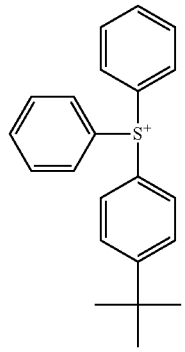 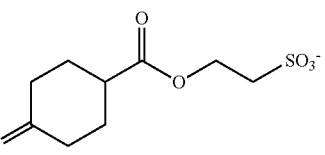

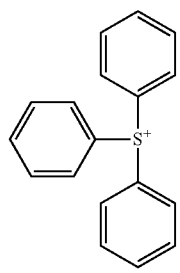

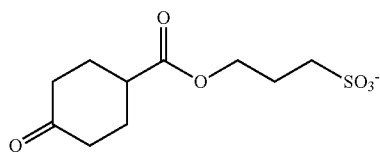

53
-continued
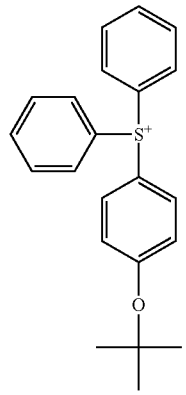 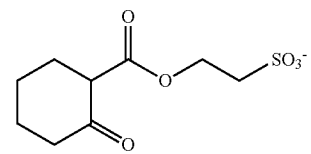
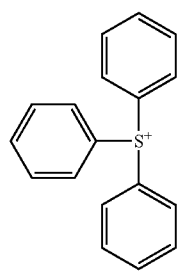
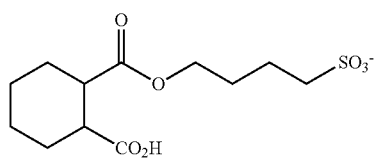
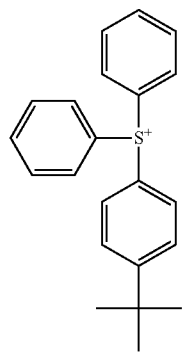 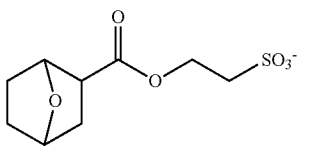
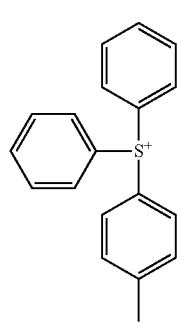 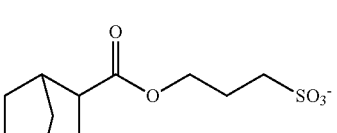
54
-continued
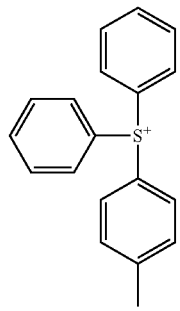
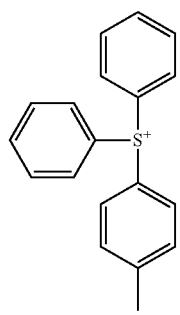
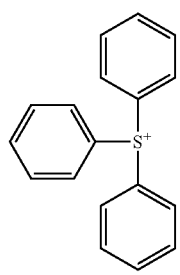
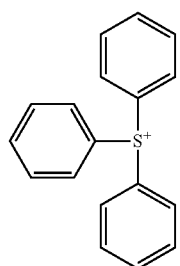
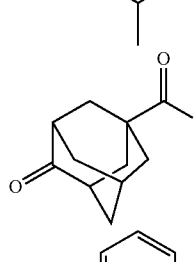
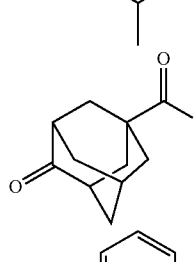
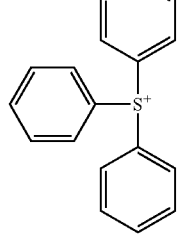

55
-continued
56
-continued
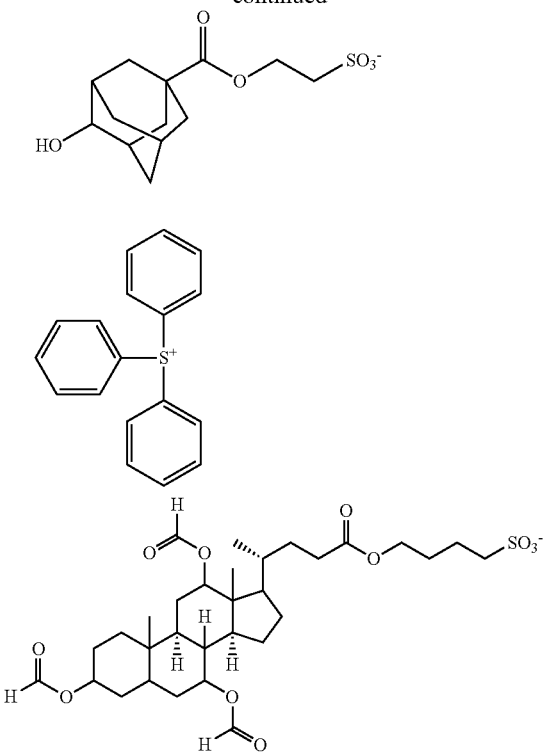
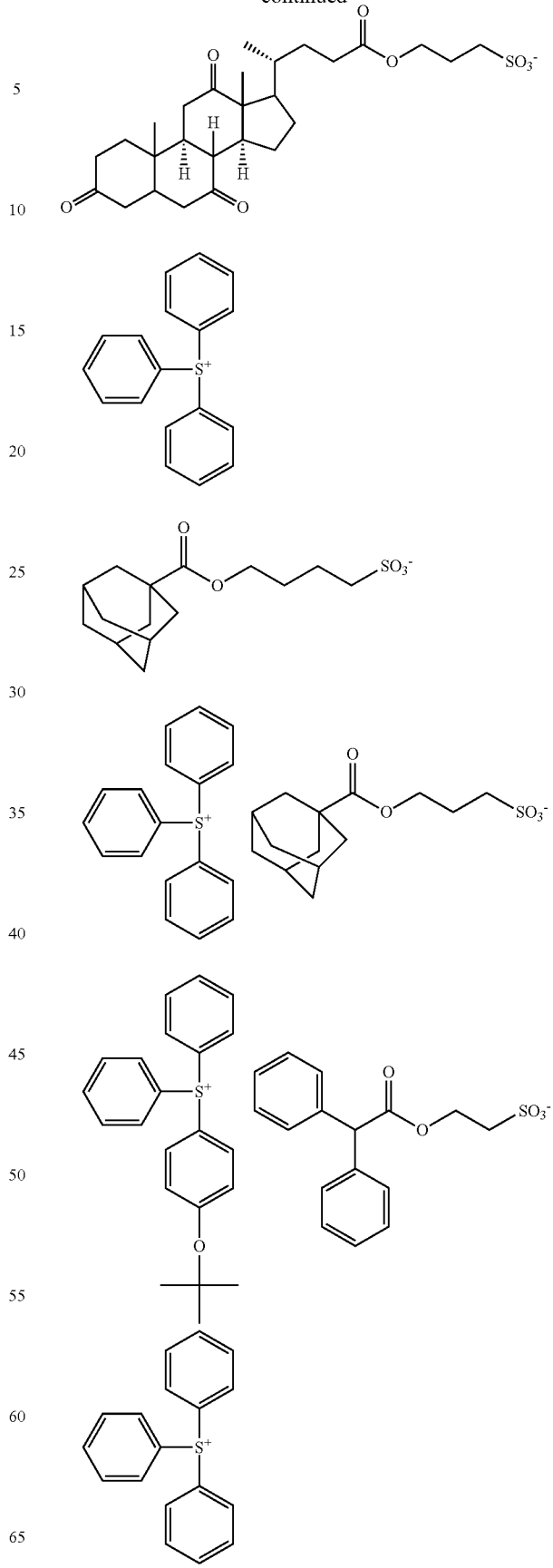

57
-continued
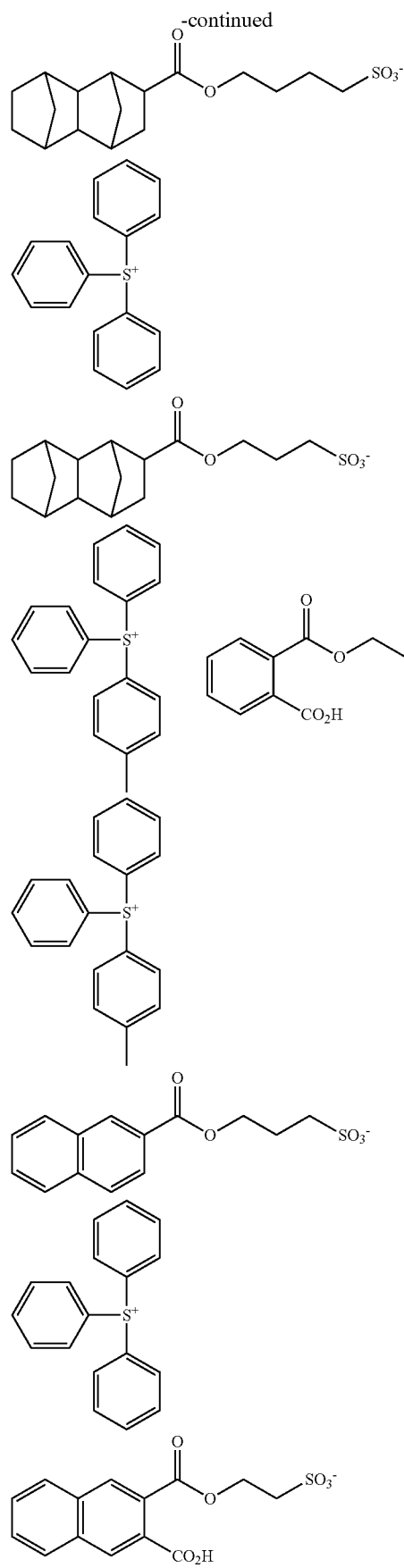
58
-continued
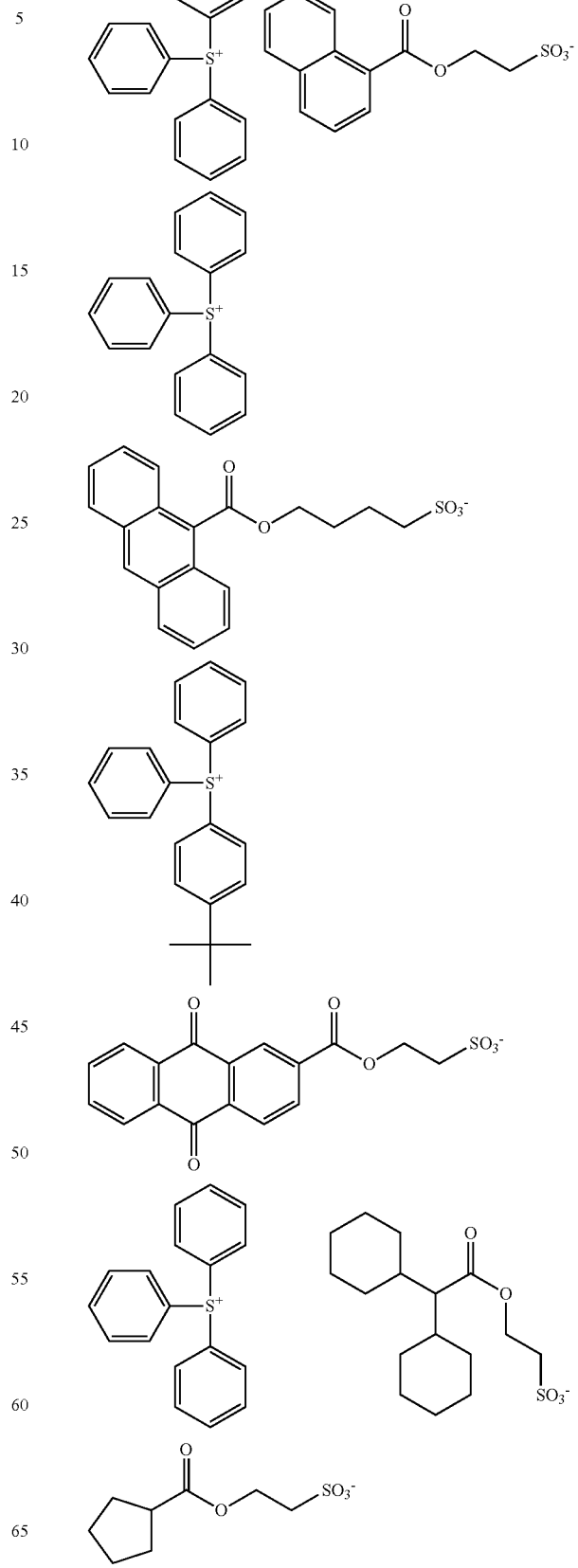

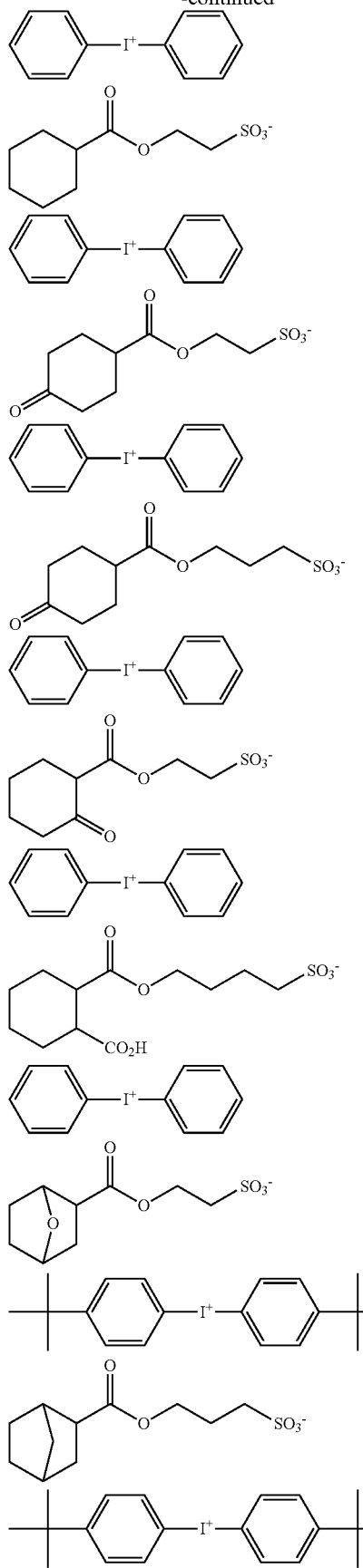
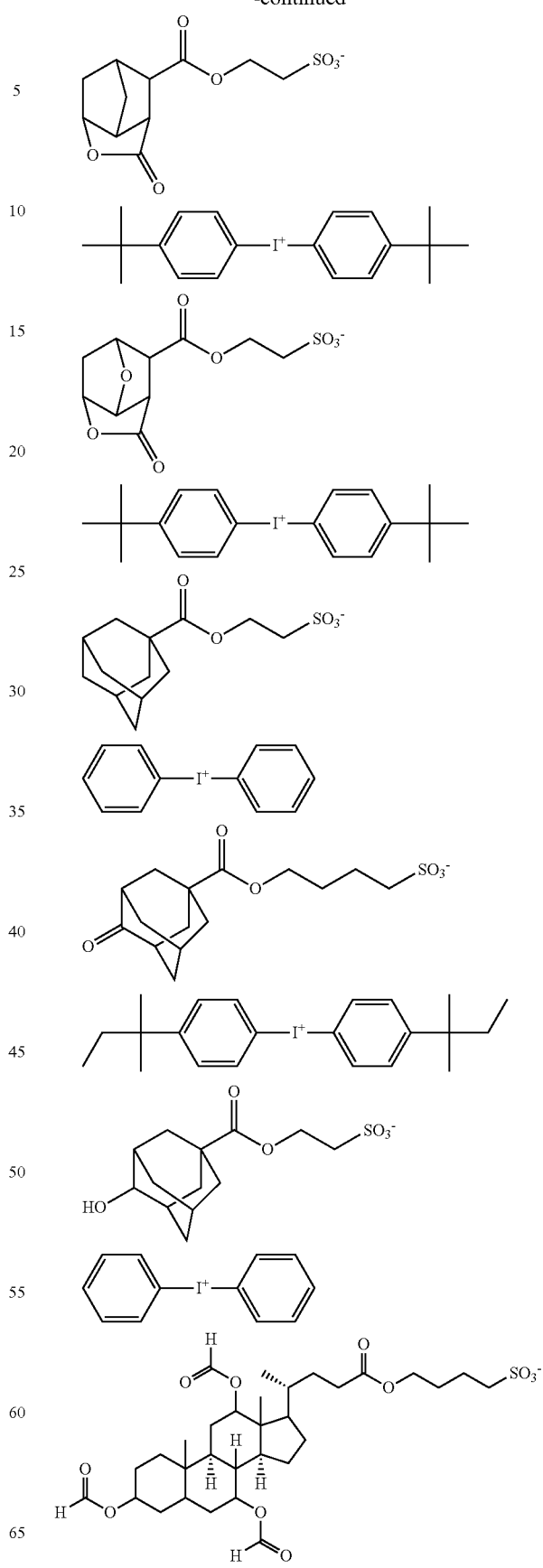

61
-continued
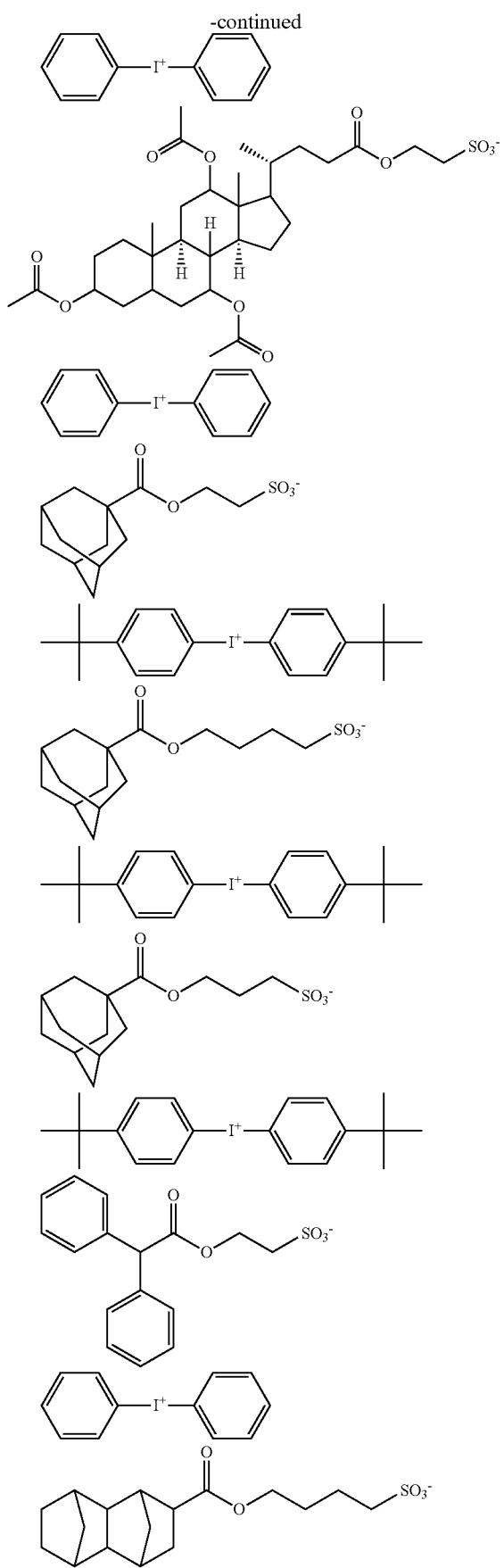
62
-continued
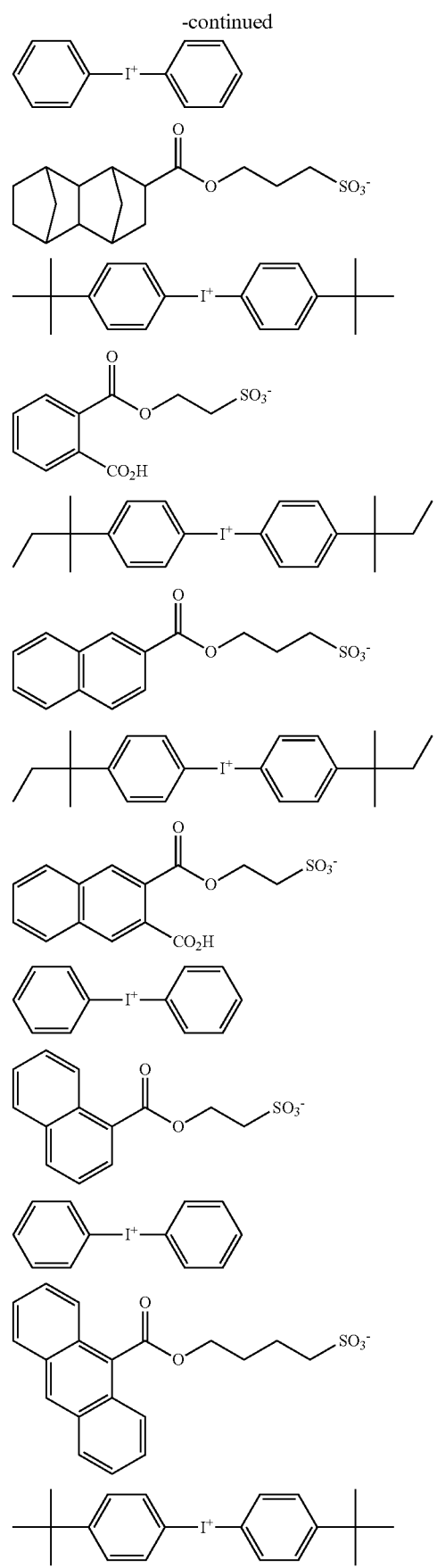

63
-continued
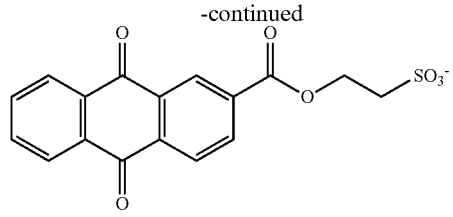
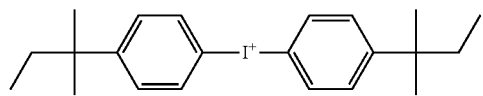
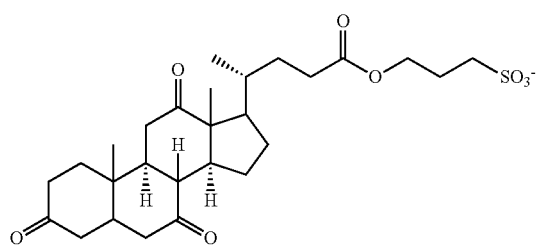
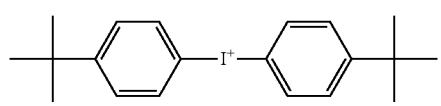
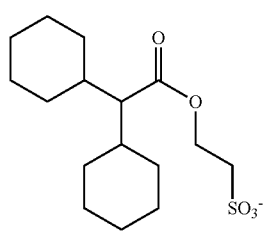
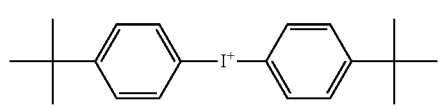
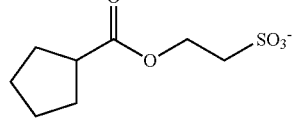
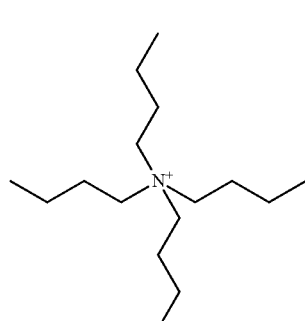
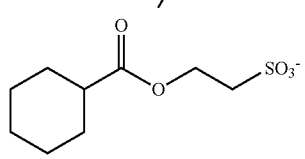
64
-continued
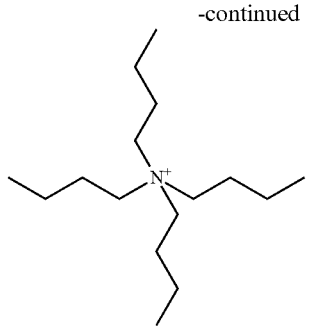
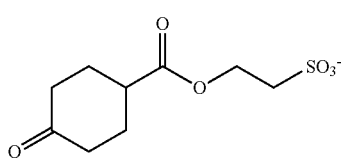
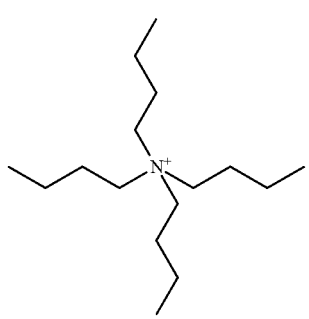
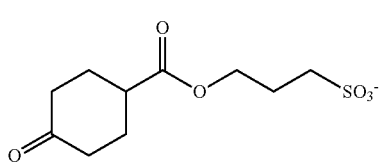
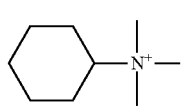
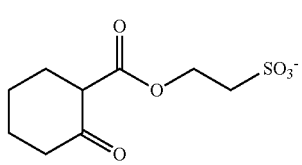
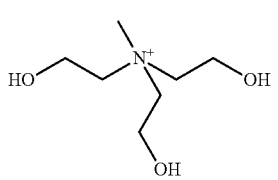
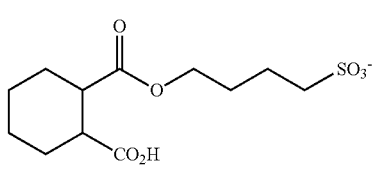

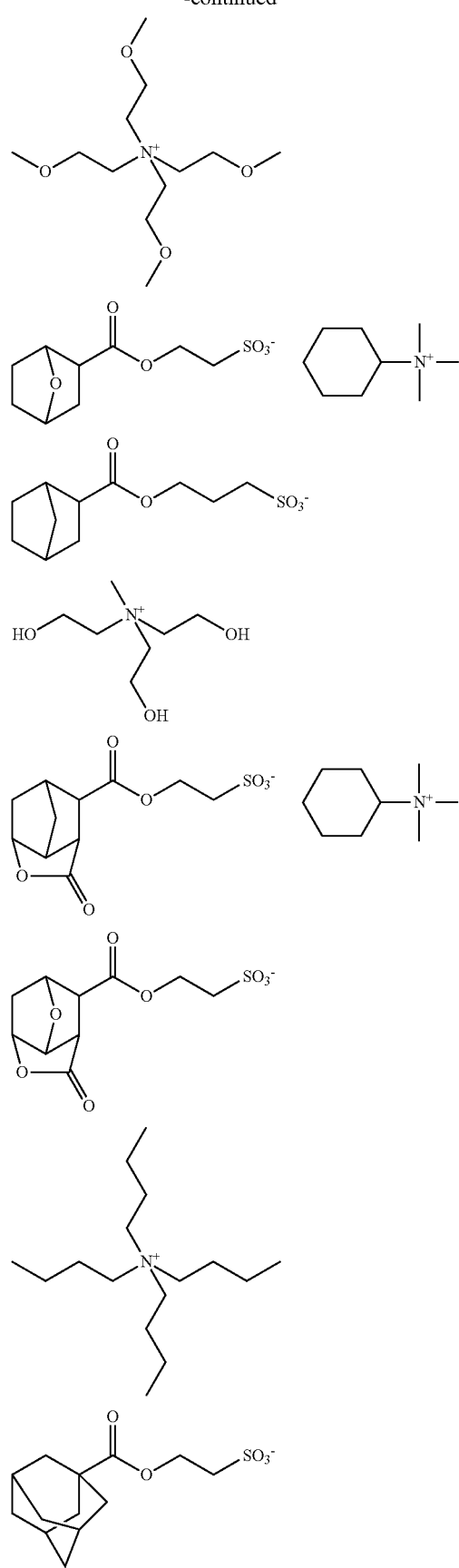
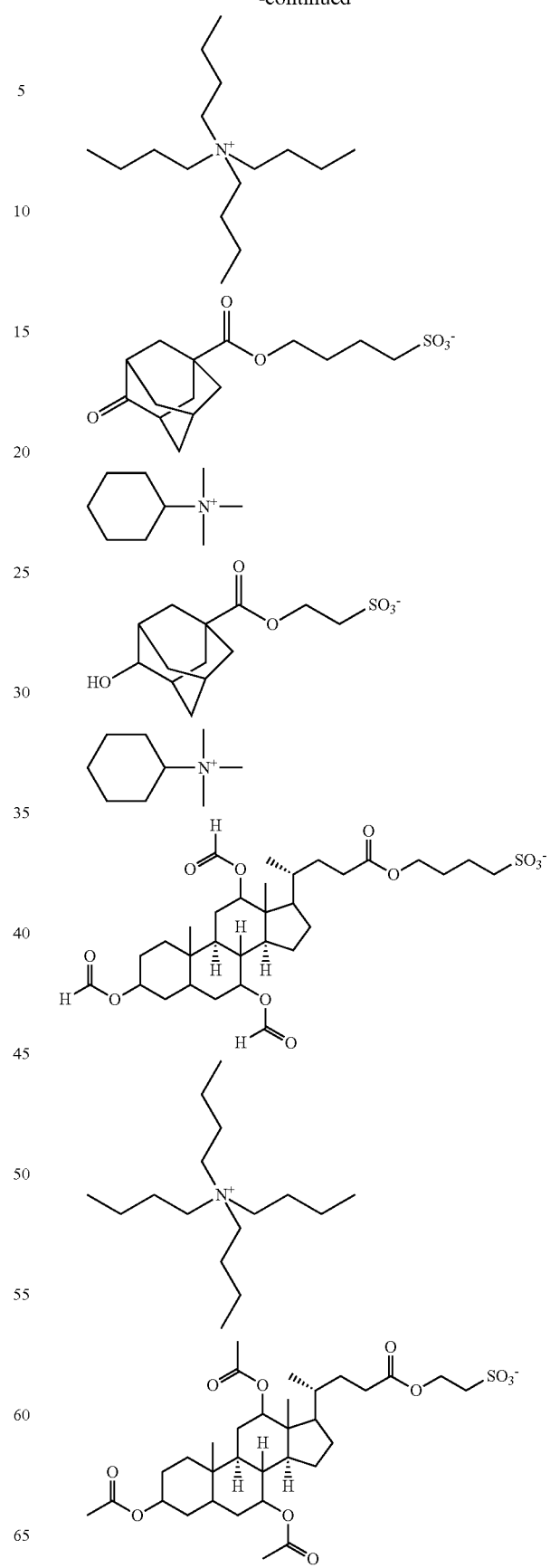

67
-continued
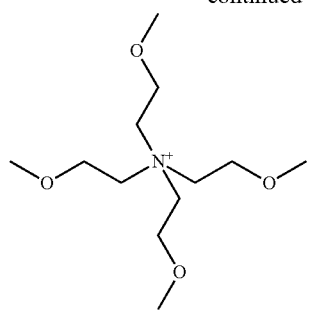
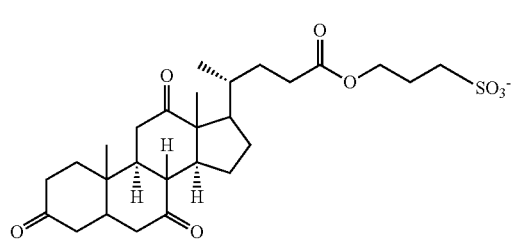
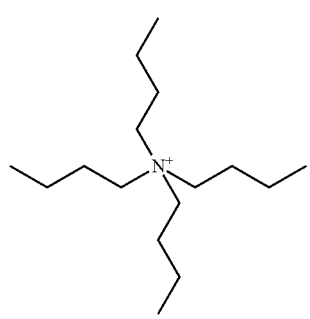
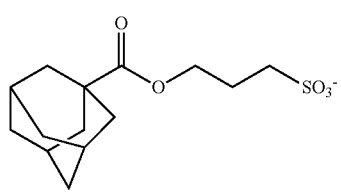
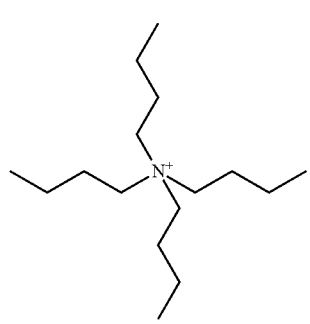
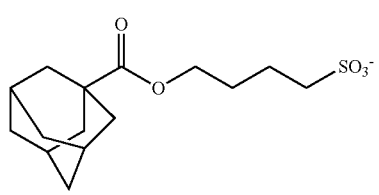
68
-continued
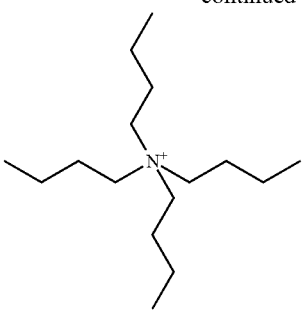
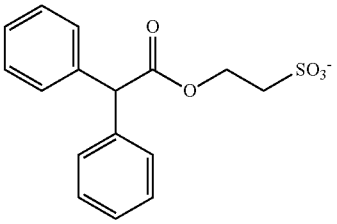
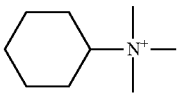
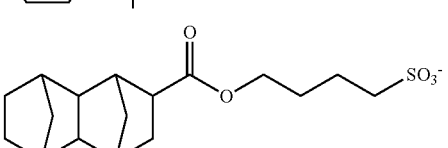
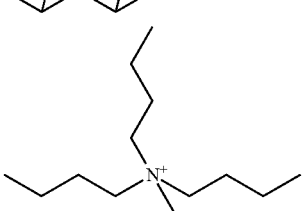
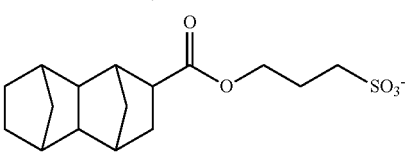
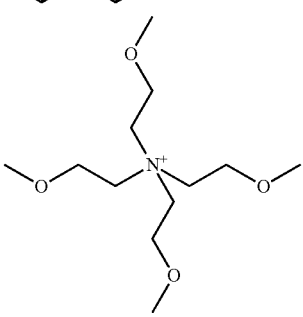
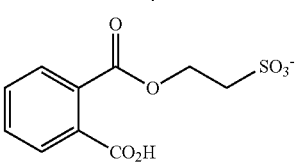

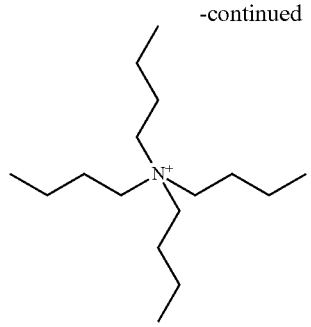
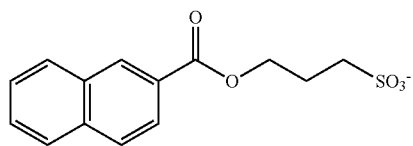
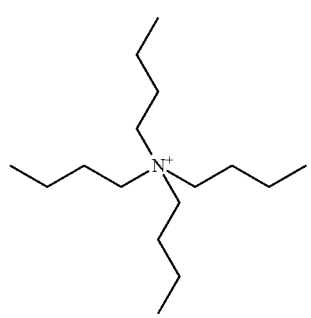
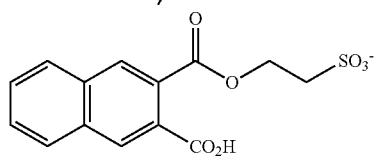
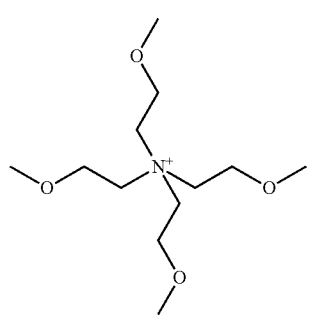
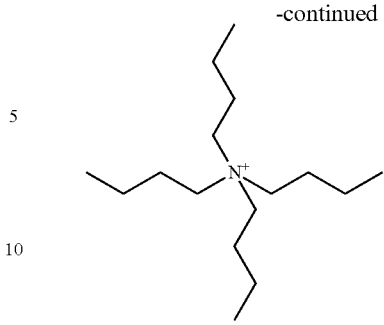
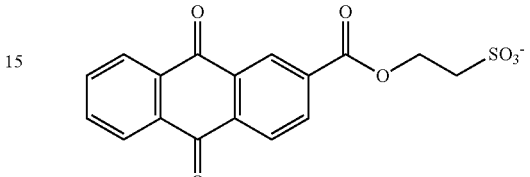
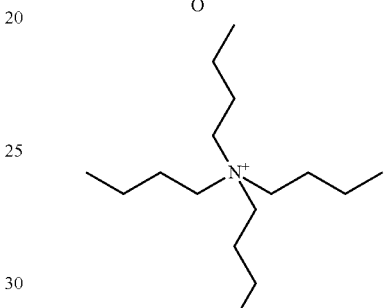
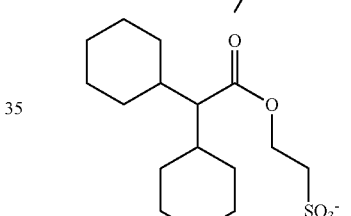
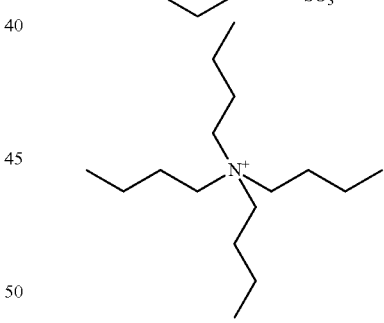
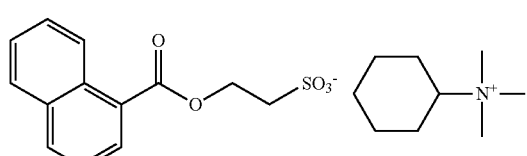
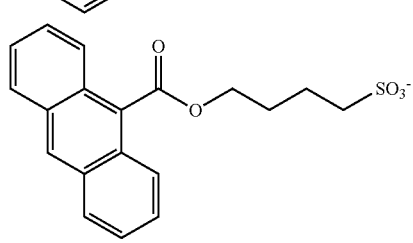

Blending amount of the onium sulfonate quencher shown by the above general formula (4) of the component (C) relative to 100 parts by mass of the polymer of the component (A) is preferably 2 to 30 parts by mass, in particular, 5 to 15 parts by mass.

Into the resist composition of the present invention may be added a compound generating an acid by an acid (acid-proliferation compound). These compounds can be found in Japanese Patent Laid-Open Publication No. 2009-269953.

Blending amount of the acid-proliferation compound in the resist composition of the present invention is 2 or less parts by mass, or preferably 1 or less part by mass, relative to 100 parts by mass of the base resin in the resist composition. When the amount is 2 or less parts by mass, there are no fears of difficulty in controlling acid diffusion, deterioration in resolution and pattern profile; and thus, this amount is preferable.

In addition, into the resist composition of the present invention may be added a compound having weight-average molecular weight of 3,000 or less and being capable of changing its solubility into an alkaline developer by action of an organic acid derivative or an acid (this compound is referred to as a dissolution inhibitor); and similarly to each component mentioned above, reference can be made to those compounds described in Japanese Patent Laid-Open Publication No. 2009-269953. By blending the dissolution inhibitor, difference in dissolution rates between an exposed area and an unexposed area can be made further large so that resolution can be improved further.

As to the organic solvent used in the resist composition of the present invention, any organic solvent can be used, provided that the solvent can dissolve the base resin, the acid generator, the quencher, other additives, and so on. By blending the organic solvent, for example, a coating property of the resist composition to a substrate and so on can be improved. Example of the organic solvent like this includes a ketone such as cyclohexanone and methyl-2-n-amyl ketone; an alcohol such as 3-methoxybutanol, 3-methyl-3-methoxybutanol, 1-methoxy-2-propanol, and 1-ethoxy-2-propanol; an ether such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and a lactone such as γ-butyrolactone. These may be used singly or as a mixture of two or more kinds of them, but not limited to them. In the present invention, diethylene glycol dimethyl ether, 1-ethoxy-2-propanol, propylene glycol monomethyl ether acetate, and a mixed solvent of them, which have the highest solubility to the acid generator in the resist composition among these solvents, are preferably used.

Amount of the organic solvent is preferably 200 to 5,000 parts by mass, or in particular 400 to 4,000 parts by mass, relative to 100 parts by mass of the base resin in the resist composition.

Into the resist composition of the present invention may be added a basic compound. By blending a basic compound, resolution can be improved further. Example of the basic compound includes, as described in paragraphs [0146] to [0164] of Japanese Patent Laid-Open Publication No. 2008-111103, a primary, a secondary, and a tertiary amine, in particular, an amine compound containing a hydroxy group, an ether group, an ester group, a lactone ring, a cyano group, and a sulfonate ester group, or a compound containing a carbamate group described in Japanese Patent Laid-Open Publication No. 2001-166476; and the addition amount of them is preferably 0 to 4 parts by mass relative to 100 parts by mass of the base resin.

Into the resist composition of the present invention may be added a surfactant component; and example of the surfactant component includes an alkaline-soluble surfactant described in Japanese Patent Laid-Open Publication No. 2008-122932, though not particularly limited to it. By adding the surfactant, a coating property of the resist composition can be improved or controlled further.

The surfactant may be used as a mixture of them, wherein total amount of the mixture is 0.001 to 20 parts by mass, or preferably 0.01 to 10 parts by mass, relative to 100 parts by mass of the base resin of the present invention.

Into the resist composition of the present invention may be added, in addition to the foregoing components (A) to (C), a thermal acid generator, for example, a thermal acid generator shown by the general formula (Pla-3) described in paragraphs [0062] to [0066] of Japanese Patent Laid-Open Publication No. 2007-199653. The adding amount of it is preferably 0.1 to 10 parts by mass relative to 100 parts by mass of the base resin of the resist composition.

The present invention provides a patterning process using the resist composition mentioned above.

The patterning process using the resist composition of the present invention may be carried out by using a heretofore known lithography technology, for example, as following; the resist composition is applied onto a substrate for manufacturing an integrated circuit (such as Si, $SiO_2$, SiN, SiON, TiN, WSi, BPSG, SOG, and a substrate attached with an organic antireflective film), or a substrate for manufacturing a mask circuit (such as Cr, CrO, CrON, and MoSi) by such a method as a spin coating method so as to give the film thickness of 0.05 to 2.0 μm, and then this is prebaked on a hot plate at temperature of 60 to 150° C. and time for 1 to 10 minutes, or preferably at 80 to 140° C. for 1 to 5 minutes. Then, a mask to form an intended pattern is put on the formed resist film, which is then exposed to a high energy beam such as a deep ultraviolet ray, an excimer laser, an X-ray, and an electron beam with the exposure dose of 1 to 200 $mJ/cm^2$, or preferably 10 to 100 $mJ/cm^2$. Alternatively, direct drawing is conducted by an electron beam without intervention of a mask for patterning. The exposure may be done not only by a usual exposure method but also especially by an immersion method in which a liquid is inserted between a mask and a resist. In the latter case, a water-insoluble top coat may be used. Then, a post exposure bake (PEB) is carried out on a hot plate at temperature of 60 to 150° C. and time for 1 to 5 minutes, or preferably at 80 to 140° C. for 1 to 3 minutes. Thereafter, development is carried out by using a developer of an alkaline aqueous solution such as tetramethyl ammonium hydroxide (TMAH) with concentration of 0.1 to 5% by mass, or preferably 2 to 3% by mass, and time for 0.1 to 3 minutes, or preferably for 0.5 to 2 minutes, with a usual method such as a dip method, a puddle method, and a spray method, to form an intended pattern on the substrate. The resist composition of the present invention is most suitable for fine patterning especially by using a deep ultraviolet beam or an excimer beam with a wavelength of 250 to 180 nm, or an X-ray beam, or an electron beam, among the high energy beams.

The water-insoluble top coat used to prevent elution of the resist film from occurring and to improve a water-repellent property on the film surface can be classified into roughly two kinds. One is a type that the top coat needs to be removed, prior to alkaline development, by an organic solvent not dissolving the resist film (organic-solvent-removing type), and the other is a type that the top coat is removed simultaneously with removal of a soluble part of the resist film to an alkaline developer (alkaline-soluble type).

The latter is preferably a material obtained by dissolving a polymer as a base, having a 1,1,1,3,3,3-hexafluoro-2-propanol residue, that is not soluble in water but soluble in an alkaline developer, into an alcohol solvent having four or more carbon atoms, an ether solvent having 8 to 12 carbon atoms, or a mixed solvent of them. Alternatively, a material obtained by dissolving a surfactant, not soluble in water but soluble in an alkaline developer, into an alcohol solvent having four or more carbon atoms, an ether solvent having 8 to 12 carbon atoms, or a mixed solvent of them as mentioned above may be used.

A patterning process may be carried out, after formation of a photoresist film, by extraction of the acid generator and so on from film surface by rinsing with pure water (post-soaking), or by washing particles out, or by rinsing to remove water that is remained on the film after exposure (post-soaking).

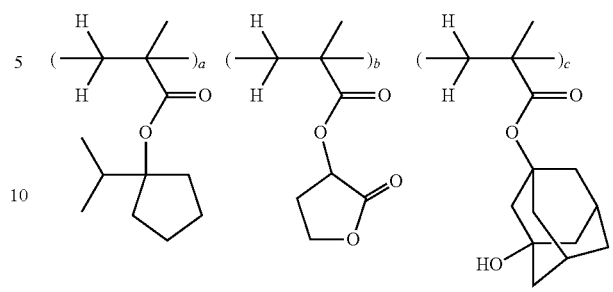

Polymer 4

(a = 0.50, b = 0.40, c = 0.10, Mw = 7,700)

EXAMPLES

Hereinafter, the present invention will be explained by showing Examples and Comparative Examples; but the present invention is not restricted by them.

Synthesis Example

Synthesis of Polymer 4

Under a nitrogen atmosphere, 21.27 g of 1-(1-methylethyl)cyclopentyl methacrylate, 14.7 g of 2-oxotetrahydrofurane-3-yl methacrylate, 5.12 g of 3-hydroxy-1-adamantyl methacrylate, 0.57 g of 2,2'-azobisisobutyronitrile, and 0.1 g of 2-mercaptoethanol were dissolved into 22.09 g of propylene glycol monomethyl ether acetate and 18.97 g of γ-butyrolactone to obtain a solution. This solution was gradually added into 6.28 g of propylene glycol monomethyl ether acetate and 5.39 g of γ-butyrolactone during four hours at 80° C. with stirring under a nitrogen atmosphere. After completion of the gradual addition, stirring was continued for two hours with keeping the temperature at 80° C.; and then, after cooling to room temperature, a resulting polymer solution was gradually added into 320 g of methanol. A precipitated solid matter was separated by filtration, washed with 120 g of methanol for two times, and then dried at 50° C. under vacuum for 16 hours to obtain a polymer shown by the following formula (Polymer 4) as a white powder solid. The yield was 17.19 g (86%). Here, Mw indicates the weight-average molecular weight measured by GPC (polystyrene-standard).

Synthesis Example

Syntheses of Polymers 1 to 3 and 5 to 38

Resins (Polymers 1 to 3 and 5 to 38) were prepared by the procedure similar to that for synthesis of Polymer 4 mentioned above except that kinds of each monomer and blending ratio thereof were changed.

Composition, Molecular Weight, and Dispersity of Each Polymer

Composition ratio (% by mol) of repeating units that constitute the polymer used for the present evaluation, and molecular weight and dispersity thereof are shown in Table 1. Structures of each repeating unit are shown in Tables 2 and 3. In Table 2, ALU-1 to ALU-4 are the acid-labile units that are indispensable in the polymer of the component (A) of the present invention (repeating units having a structure shown by the above general formula (1) or (2)). ALU-5 to ALU-8 in Table 2 and Unit 1 to Unit 5 in Table 3 are composition units other than the acid-labile units that are indispensable in the polymer of the component (A) (repeating units having a structure shown by the above general formula (1) or (2)). Accordingly, Polymer 1 to Polymer 30 correspond to the polymer of the component (A) of the present invention. Polymer 31 to Polymer 38 are polymers of Comparative Examples.

TABLE 1

|  | Unit No. 1 | ratio | Unit No. 2 | ratio | Unit No. 3 | ratio | Unit No. 4 | ratio | Unit No. 5 | ratio | Mw | Dispersity |
|---|---|---|---|---|---|---|---|---|---|---|---|---|
| Polymer-1 | ALU-1 | 50 | Unit-2 | 40 | Unit-5 | 10 |  |  |  |  | 8220 | 1.81 |
| Polymer-2 | ALU-1 | 50 | Unit-1 | 40 | Unit-5 | 10 |  |  |  |  | 8300 | 1.66 |
| Polymer-3 | ALU-1 | 50 | Unit-2 | 50 |  |  |  |  |  |  | 7610 | 1.75 |
| Polymer-4 | ALU-2 | 50 | Unit-2 | 40 | Unit-5 | 10 |  |  |  |  | 7700 | 1.93 |
| Polymer-5 | ALU-2 | 50 | Unit-1 | 40 | Unit-5 | 10 |  |  |  |  | 8140 | 1.71 |
| Polymer-6 | ALU-2 | 50 | Unit-2 | 50 |  |  |  |  |  |  | 9500 | 2.10 |
| Polymer-7 | ALU-1 | 60 | Unit-2 | 40 |  |  |  |  |  |  | 7520 | 1.91 |
| Polymer-8 | ALU-2 | 60 | Unit-2 | 40 |  |  |  |  |  |  | 8800 | 1.72 |
| Polymer-9 | ALU-1 | 50 | Unit-3 | 40 | Unit-5 | 10 |  |  |  |  | 8230 | 1.79 |
| Polymer-10 | ALU-1 | 50 | Unit-4 | 40 | Unit-5 | 10 |  |  |  |  | 7750 | 1.80 |
| Polymer-11 | ALU-2 | 50 | Unit-4 | 40 | Unit-5 | 10 |  |  |  |  | 6830 | 1.83 |
| Polymer-12 | ALU-3 | 50 | Unit-2 | 40 | Unit-5 | 10 |  |  |  |  | 8800 | 1.76 |
| Polymer-13 | ALU-3 | 50 | Unit-1 | 40 | Unit-5 | 10 |  |  |  |  | 7900 | 1.89 |
| Polymer-14 | ALU-3 | 50 | Unit-2 | 50 |  |  |  |  |  |  | 8650 | 1.75 |
| Polymer-15 | ALU-4 | 50 | Unit-2 | 40 | Unit-5 | 10 |  |  |  |  | 9000 | 1.67 |
| Polymer-16 | ALU-4 | 50 | Unit-1 | 40 | Unit-5 | 10 |  |  |  |  | 7660 | 1.95 |
| Polymer-17 | ALU-4 | 50 | Unit-2 | 50 |  |  |  |  |  |  | 8800 | 1.81 |
| Polymer-18 | ALU-3 | 60 | Unit-2 | 40 |  |  |  |  |  |  | 7200 | 1.67 |
| Polymer-19 | ALU-3 | 50 | Unit-4 | 40 | Unit-5 | 10 |  |  |  |  | 7200 | 1.82 |
| Poiymer-20 | ALU-4 | 60 | Unit-2 | 40 |  |  |  |  |  |  | 8450 | 1.72 |
| Polymer-21 | ALU-4 | 50 | Unit-3 | 40 | Unit-5 | 10 |  |  |  |  | 7950 | 1.92 |
| Polymer-22 | ALU-4 | 50 | Unit-4 | 50 |  |  |  |  |  |  | 7550 | 1.84 |
| Polymer-23 | ALU-5 | 10 | ALU-1 | 40 | Unit-5 | 10 | Unit-2 | 20 | Unit-3 | 20 | 9000 | 2.76 |

TABLE 1-continued

|  | Unit No. 1 | ratio | Unit No. 2 | ratio | Unit No. 3 | ratio | Unit No. 4 | ratio | Unit No. 5 | ratio | Mw | Dispersity |
|---|---|---|---|---|---|---|---|---|---|---|---|---|
| Polymer-24 | ALU-5 | 10 | ALU-2 | 40 | Unit-5 | 10 | Unit-2 | 20 | Unit-3 | 20 | 8775 | 1.95 |
| Polymer-25 | ALU-5 | 10 | ALU-1 | 50 | Unit-2 | 10 | Unit-3 | 30 | | | 8900 | 1.68 |
| Polymer-26 | ALU-5 | 10 | ALU-2 | 50 | Unit-2 | 20 | Unit-3 | 30 | | | 8890 | 1.98 |
| Polymer-27 | ALU-7 | 10 | ALU-1 | 40 | Unit-5 | 10 | Unit-2 | 20 | Unit-3 | 20 | 7900 | 2.00 |
| Polymer-28 | ALU-7 | 10 | ALU-2 | 40 | Unit-5 | 10 | Unit-2 | 20 | Unit-3 | 20 | 7560 | 1.90 |
| Polymer-29 | ALU-8 | 10 | ALU-1 | 50 | Unit-2 | 10 | Unit-3 | 30 | | | 9150 | 1.77 |
| Polymer-30 | ALU-8 | 10 | ALU-2 | 50 | Unit-2 | 20 | Unit-3 | 30 | | | 9900 | 1.84 |
| Polymer-31 | ALU-5 | 50 | Unit-1 | 40 | Unit-5 | 10 | | | | | 9200 | 1.98 |
| Polymer-32 | ALU-5 | 50 | Unit-2 | 50 | | | | | | | 8800 | 1.80 |
| Polymer-33 | ALU-7 | 50 | Unit-1 | 40 | Unit-5 | 10 | | | | | 8200 | 1.88 |
| Polymer-34 | ALU-7 | 50 | Unit-2 | 40 | Unit-5 | 10 | | | | | 9000 | 2.00 |
| Polymer-35 | ALU-7 | 50 | Unit-2 | 50 | | | | | | | 9650 | 1.87 |
| Polymer-36 | ALU-8 | 50 | Unit-1 | 40 | Unit-5 | 10 | | | | | 7500 | 1.99 |
| Polymer-37 | ALU-8 | 50 | Unit-2 | 40 | Unit-5 | 10 | | | | | 7600 | 1.73 |
| Polymer-38 | ALU-8 | 50 | Unit-2 | 50 | | | | | | | 7050 | 1.88 |

TABLE 2

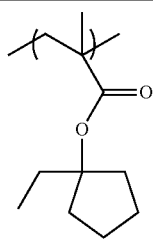

ALU-1

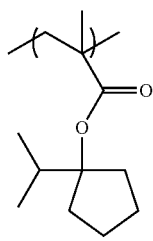

ALU-2

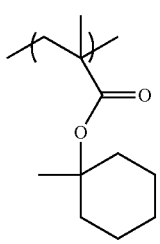

ALU-3

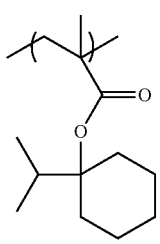

ALU-4

TABLE 2-continued

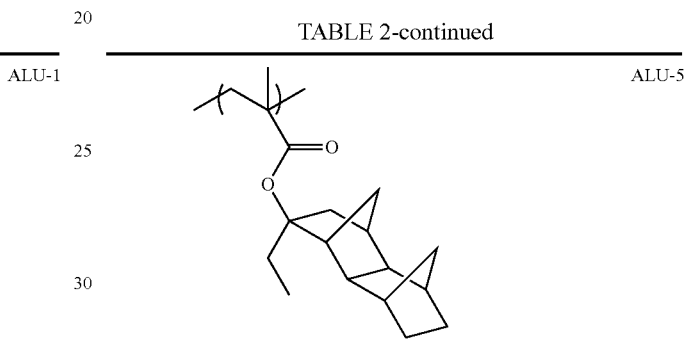

ALU-5

ALU-6

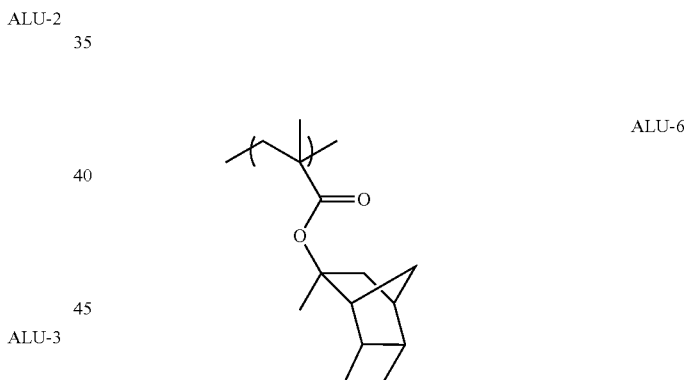

ALU-7

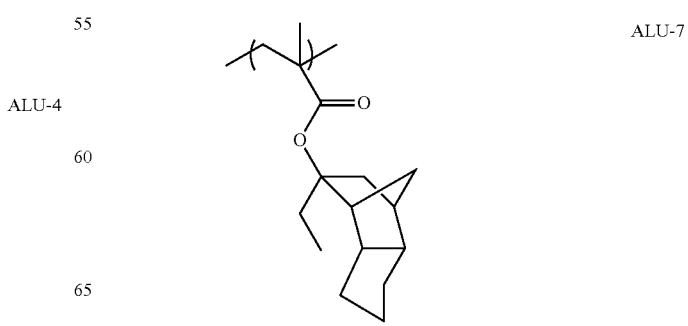

TABLE 2-continued

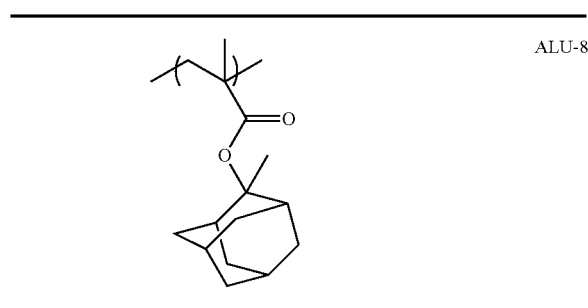
ALU-8

TABLE 3

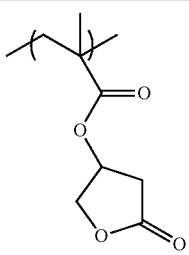
Unit-1

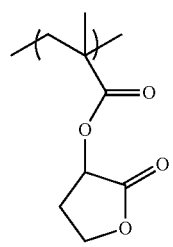
Unit-2

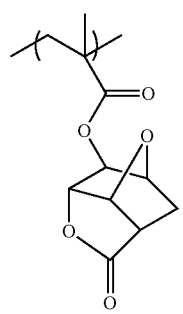
Unit-3

TABLE 3-continued

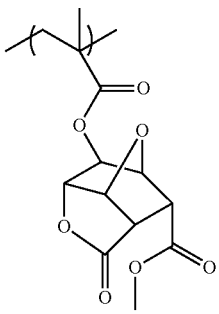
Unit-4

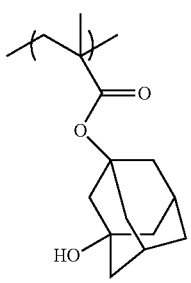
Unit-5

Preparation of Resist Compositions: PR 1 to PR 310

In addition to the polymer mentioned above, a photo acid generator, an onium sulfonate quencher, a thermal acid generator, and an alkaline-soluble surfactant were dissolved into a solvent, and then the resulting solution was filtered through a filter (pore diameter of 0.2 μm) made of Teflon (registered trade name) to prepare each of resist compositions of the present invention shown in the following Tables 4 to 8 (PR 1 to PR 230). As the comparative samples, resist compositions shown in the following Tables 9 and 10 were prepared (PR 231 to PR 310). Structures of each of the photo acid generators in Tables 4 to 10 are shown in Table 11, structures of each of the onium sulfonates used as the quencher are shown in Tables 12 and 13, structure of the thermal acid generator (TAG-1) is shown in Table 14, and structures of each of the alkaline-soluble surfactants (SF-1 and SF-2) are shown in Table 15. PAG 1 to PAG 3 in Table 11 correspond to the photo acid generator (B), which is an indispensable component of the resist composition of the present invention, and PAG 4 and PAG 5 are photo acid generators of Comparative Examples. Onium sulfonate SQ 1 to SQ 6 in Table 12 correspond to the onium sulfonates (C) indispensable in the resist composition of the present invention, and SQ 7 to SQ 10 are onium sulfonate of Comparative Examples.

TABLE 4

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-1  | Polymer-1 (80) | PAG-1 (5.1) |           | SQ-1 (6.4) | SF-2 (5.0) | PGMEA(2700) GBL(300) |
| PR-2  | Polymer-1 (80) | PAG-1 (5.1) |           | SQ-3 (7.9) | SF-2 (5.0) | PGMEA(2700) GBL(300) |
| PR-3  | Polymer-1 (80) | PAG-1 (5.1) |           | SQ-5 (6.2) | SF-2 (5.0) | PGMEA(2700) GBL(300) |
| PR-4  | Polymer-1 (80) | PAG-3 (5.5) | TAG-1 (0.5) | SQ-1 (6.4) | SF-2 (5.0) | PGMEA(2700) GBL(300) |
| PR-5  | Polymer-1 (80) | PAG-3 (5.5) |           | SQ-3 (7.9) | SF-2 (5.0) | PGMEA(2700) GBL(300) |
| PR-6  | Polymer-1 (80) | PAG-3 (5.5) |           | SQ-5 (6.2) | SF-2 (5.0) | PGMEA(2700) GBL(300) |
| PR-7  | Polymer-2 (80) | PAG-1 (5.1) |           | SQ-1 (6.4) | SF-2 (5.0) | PGMEA(2700) GBL(300) |
| PR-8  | Polymer-2 (80) | PAG-1 (5.1) |           | SQ-3 (7.9) | SF-2 (5.0) | PGMEA(2700) GBL(300) |
| PR-9  | Polymer-2 (80) | PAG-1 (5.1) |           | SQ-5 (6.2) | SF-2 (5.0) | PGMEA(2700) GBL(300) |
| PR-10 | Polymer-2 (80) | PAG-3 (5.5) |           | SQ-1 (6.4) | SF-2 (5.0) | PGMEA(2700) GBL(300) |
| PR-11 | Polymer-2 (80) | PAG-3 (5.5) |           | SQ-3 (7.9) | SF-2 (5.0) | PGMEA(2700) GBL(300) |
| PR-12 | Polymer-2 (80) | PAG-3 (5.5) |           | SQ-5 (6.2) | SF-2 (5.0) | PGMEA(2700) GBL(300) |

TABLE 4-continued

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-13 | Polymer-3 (80) | PAG-1 (5.1) | | SQ-1 (6.4) | SF-2 (5.0) | PGMEA(2700) GBL(300) |
| PR-14 | Polymer-3 (80) | PAG-1 (5.1) | | SQ-3 (7.9) | SF-2 (5.0) | PGMEA(2700) GBL(300) |
| PR-15 | Polymer-3 (80) | PAG-1 (5.1) | | SQ-5 (6.2) | SF-2 (5.0) | PGMEA(2700) GBL(300) |
| PR-16 | Polymer-3 (80) | PAG-3 (5.5) | | SQ-1 (6.4) | SF-2 (5.0) | PGMEA(2700) GBL(300) |
| PR-17 | Polymer-3 (80) | PAG-3 (5.5) | | SQ-3 (7.9) | SF-2 (5.0) | PGMEA(2700) GBL(300) |
| PR-18 | Polymer-3 (80) | PAG-3 (5.5) | | SQ-5 (6.2) | SF-2 (5.0) | PGMEA(2700) GBL(300) |
| PR-19 | Polymer-4 (80) | PAG-1 (5.1) | | SQ-1 (6.4) | SF-2 (5.0) | PGMEA(2700) GBL(300) |
| PR-20 | Polymer-4 (80) | PAG-1 (5.1) | | SQ-3 (7.9) | SF-2 (5.0) | PGMEA(2700) GBL(300) |
| PR-21 | Polymer-4 (80) | PAG-1 (5.1) | | SQ-5 (6.2) | SF-2 (5.0) | PGMEA(2700) GBL(300) |
| PR-22 | Polymer-4 (80) | PAG-3 (5.5) | | SQ-1 (6.4) | SF-2 (5.0) | PGMEA(2700) GBL(300) |
| PR-23 | Polymer-4 (80) | PAG-3 (5.5) | | SQ-3 (7.9) | SF-2 (5.0) | PGMEA(2700) GBL(300) |
| PR-24 | Polymer-4 (80) | PAG-3 (5.5) | | SQ-5 (6.2) | SF-2 (5.0) | PGMEA(2700) GBL(300) |
| PR-25 | Polymer-5 (80) | PAG-1 (5.1) | | SQ-1 (6.4) | SF-2 (5.0) | PGMEA(2700) GBL(300) |
| PR-26 | Polymer-5 (80) | PAG-1 (5.1) | | SQ-3 (7.9) | SF-2 (5.0) | PGMEA(2700) GBL(300) |
| PR-27 | Polymer-5 (80) | PAG-1 (5.1) | | SQ-5 (6.2) | SF-2 (5.0) | PGMEA(2700) GBL(300) |
| PR-28 | Polymer-5 (80) | PAG-3 (5.5) | | SQ-1 (6.4) | SF-2 (5.0) | PGMEA(2700) GBL(300) |
| PR-29 | Polymer-5 (80) | PAG-3 (5.5) | | SQ-3 (7.9) | SF-2 (5.0) | PGMEA(2700) GBL(300) |
| PR-30 | Polymer-5 (80) | PAG-3 (5.5) | | SQ-5 (6.2) | SF-2 (5.0) | PGMEA(2700) GBL(300) |
| PR-31 | Polymer-6 (80) | PAG-1 (5.1) | | SQ-1 (6.4) | SF-2 (5.0) | PGMEA(2700) GBL(300) |
| PR-32 | Polymer-6 (80) | PAG-1 (5.1) | | SQ-3 (7.9) | SF-2 (5.0) | PGMEA(2700) GBL(300) |
| PR-33 | Polymer-6 (80) | PAG-1 (5.1) | | SQ-5 (6.2) | SF-2 (5.0) | PGMEA(2700) GBL(300) |
| PR-34 | Polymer-6 (80) | PAG-3 (5.5) | | SQ-1 (6.4) | SF-2 (5.0) | PGMEA(2700) GBL(300) |
| PR-35 | Polymer-6 (80) | PAG-3 (5.5) | | SQ-3 (7.9) | SF-2 (5.0) | PGMEA(2700) GBL(300) |
| PR-36 | Polymer-6 (80) | PAG-3 (5.5) | | SQ-5 (6.2) | SF-2 (5.0) | PGMEA(2700) GBL(300) |
| PR-37 | Polymer-7 (80) | PAG-1 (5.1) | | SQ-1 (6.4) | SF-2 (5.0) | PGMEA(2700) GBL(300) |
| PR-38 | Polymer-7 (80) | PAG-1 (5.1) | | SQ-3 (7.9) | SF-2 (5.0) | PGMEA(2700) GBL(300) |
| PR-39 | Polymer-7 (80) | PAG-1 (5.1) | | SQ-5 (6.2) | SF-2 (5.0) | PGMEA(2700) GBL(300) |
| PR-40 | Polymer-7 (80) | PAG-3 (5.5) | | SQ-1 (6.4) | SF-2 (5.0) | PGMEA(2700) GBL(300) |
| PR-41 | Polymer-7 (80) | PAG-3 (5.5) | | SQ-3 (7.9) | SF-2 (5.0) | PGMEA(2700) GBL(300) |
| PR-42 | Polymer-7 (80) | PAG-3 (5.5) | | SQ-5 (6.2) | SF-2 (5.0) | PGMEA(2700) GBL(300) |
| PR-43 | Polymer-8 (80) | PAG-1 (5.1) | | SQ-1 (6.4) | SF-2 (5.0) | PGMEA(2700) GBL(300) |
| PR-44 | Polymer-8 (80) | PAG-1 (5.1) | | SQ-3 (7.9) | SF-2 (5.0) | PGMEA(2700) GBL(300) |
| PR-45 | Polymer-8 (80) | PAG-1 (5.1) | | SQ-5 (6.2) | SF-2 (5.0) | PGMEA(2700) GBL(300) |
| PR-46 | Polymer-8 (80) | PAG-3 (5.5) | | SQ-1 (6.4) | SF-2 (5.0) | PGMEA(2700) GBL(300) |
| PR-47 | Polymer-8 (80) | PAG-3 (5.5) | | SQ-3 (7.9) | SF-2 (5.0) | PGMEA(2700) GBL(300) |
| PR-48 | Polymer-8 (80) | PAG-3 (5.5) | | SQ-5 (6.2) | SF-2 (5.0) | PGMEA(2700) GBL(300) |
| PR-49 | Polymer-9 (80) | PAG-1 (5.1) | | SQ-1 (6.4) | SF-2 (5.0) | PGMEA(2700) GBL(300) |
| PR-50 | Polymer-9 (80) | PAG-1 (5.1) | | SQ-3 (7.9) | SF-2 (5.0) | PGMEA(2700) GBL(300) |

TABLE 5

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-51 | Polymer-9 (80) | PAG-1 (5.1) | | SQ-5 (6.2) | SF-1 (5.0) | PGMEA(2700) GBL(300) |
| PR-52 | Polymer-9 (80) | PAG-3 (5.5) | | SQ-1 (6.4) | SF-1 (5.0) | PGMEA(2700) GBL(300) |
| PR-53 | Polymer-9 (80) | PAG-3 (5.5) | | SQ-3 (7.9) | SF-1 (5.0) | PGMEA(2700) GBL(300) |
| PR-54 | Polymer-9 (80) | PAG-3 (5.5) | | SQ-5 (6.2) | SF-1 (5.0) | PGMEA(2700) GBL(300) |
| PR-55 | Polymer-10 (80) | PAG-1 (5.1) | | SQ-1 (6.4) | SF-1 (5.0) | PGMEA(2700) GBL(300) |
| PR-56 | Polymer-10 (80) | PAG-1 (5.1) | TAG-1 (0.5) | SQ-3 (7.9) | SF-1 (5.0) | PGMEA(2700) GBL(300) |
| PR-57 | Polymer-10 (80) | PAG-1 (5.1) | | SQ-5 (6.2) | SF-1 (5.0) | PGMEA(2700) GBL(300) |
| PR-58 | Polymer-10 (80) | PAG-3 (5.5) | | SQ-1 (6.4) | SF-1 (5.0) | PGMEA(2700) GBL(300) |
| PR-59 | Polymer-10 (80) | PAG-3 (5.5) | | SQ-3 (7.9) | SF-1 (5.0) | PGMEA(2700) GBL(300) |
| PR-60 | Polymer-10 (80) | PAG-3 (5.5) | | SQ-5 (6.2) | SF-1 (5.0) | PGMEA(2700) GBL(300) |
| PR-61 | Polymer-11 (80) | PAG-1 (5.1) | | SQ-1 (6.4) | SF-1 (5.0) | PGMEA(2700) GBL(300) |
| PR-62 | Polymer-11 (80) | PAG-1 (5.1) | | SQ-3 (7.9) | SF-1 (5.0) | PGMEA(2700) GBL(300) |
| PR-63 | Polymer-11 (80) | PAG-1 (5.1) | | SQ-5 (6.2) | SF-1 (5.0) | PGMEA(2700) GBL(300) |
| PR-64 | Polymer-11 (80) | PAG-3 (5.5) | | SQ-1 (6.4) | SF-1 (5.0) | PGMEA(2700) GBL(300) |
| PR-65 | Polymer-11 (80) | PAG-3 (5.5) | | SQ-3 (7.9) | SF-1 (5.0) | PGMEA(2700) GBL(300) |
| PR-66 | Polymer-11 (80) | PAG-3 (5.5) | | SQ-5 (6.2) | SF-1 (5.0) | PGMEA(2700) GBL(300) |
| PR-67 | Polymer-12 (80) | PAG-1 (5.1) | | SQ-1 (6.4) | SF-1 (5.0) | PGMEA(2700) GBL(300) |
| PR-68 | Polymer-12 (80) | PAG-1 (5.1) | | SQ-3 (7.9) | SF-1 (5.0) | PGMEA(2700) GBL(300) |
| PR-69 | Polymer-12 (80) | PAG-1 (5.1) | | SQ-5 (6.2) | SF-1 (5.0) | PGMEA(2700) GBL(300) |
| PR-70 | Polymer-12 (80) | PAG-2 (5.5) | | SQ-1 (6.4) | SF-1 (5.0) | PGMEA(2700) GBL(300) |
| PR-71 | Polymer-12 (80) | PAG-2 (5.5) | | SQ-3 (7.9) | SF-1 (5.0) | PGMEA(2700) GBL(300) |
| PR-72 | Polymer-12 (80) | PAG-2 (5.5) | | SQ-5 (6.2) | SF-1 (5.0) | PGMEA(2700) GBL(300) |
| PR-73 | Polymer-13 (80) | PAG-1 (5.1) | | SQ-1 (6.4) | SF-1 (5.0) | PGMEA(2700) GBL(300) |
| PR-74 | Polymer-13 (80) | PAG-1 (5.1) | | SQ-3 (7.9) | SF-1 (5.0) | PGMEA(2700) GBL(300) |
| PR-75 | Polymer-13 (80) | PAG-1 (5.1) | | SQ-5 (6.2) | SF-1 (5.0) | PGMEA(2700) GBL(300) |
| PR-76 | Polymer-13 (80) | PAG-2 (4.5) | | SQ-1 (6.4) | SF-1 (5.0) | PGMEA(2700) GBL(300) |

TABLE 5-continued

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-77 | Polymer-13 (80) | PAG-2 (4.5) | | SQ-3 (7.9) | SF-1 (5.0) | PGMEA(2700) GBL(300) |
| PR-78 | Polymer-13 (80) | PAG-2 (4.5) | | SQ-5 (6.2) | SF-1 (5.0) | PGMEA(2700) GBL(300) |
| PR-79 | Polymer-14 (80) | PAG-1 (5.1) | | SQ-1 (6.4) | SF-1 (5.0) | PGMEA(2700) GBL(300) |
| PR-80 | Polymer-14 (80) | PAG-1 (5.1) | | SQ-3 (7.9) | SF-1 (5.0) | PGMEA(2700) GBL(300) |
| PR-81 | Polymer-14 (80) | PAG-1 (5.1) | | SQ-5 (6.2) | SF-1 (5.0) | PGMEA(2700) GBL(300) |
| PR-82 | Polymer-14 (80) | PAG-2 (4.5) | | SQ-1 (6.4) | SF-1 (5.0) | PGMEA(2700) GBL(300) |
| PR-83 | Polymer-14 (80) | PAG-2 (4.5) | | SQ-3 (7.9) | SF-1 (5.0) | PGMEA(2700) GBL(300) |
| PR-84 | Polymer-14 (80) | PAG-2 (4.5) | | SQ-5 (6.2) | SF-1 (5.0) | PGMEA(2700) GBL(300) |
| PR-85 | Polymer-15 (80) | PAG-1 (5.1) | | SQ-1 (6.4) | SF-1 (5.0) | PGMEA(2700) GBL(300) |
| PR-86 | Polymer-15 (80) | PAG-1 (5.1) | | SQ-3 (7.9) | SF-1 (5.0) | PGMEA(2700) GBL(300) |
| PR-87 | Polymer-15 (80) | PAG-1 (5.1) | | SQ-5 (6.2) | SF-1 (5.0) | PGMEA(2700) GBL(300) |
| PR-88 | Polymer-15 (80) | PAG-2 (4.5) | | SQ-1 (6.4) | SF-1 (5.0) | PGMEA(2700) GBL(300) |
| PR-89 | Polymer-15 (80) | PAG-2 (4.5) | | SQ-3 (7.9) | SF-1 (5.0) | PGMEA(2700) GBL(300) |
| PR-90 | Polymer-15 (80) | PAG-2 (4.5) | | SQ-5 (6.2) | SF-1 (5.0) | PGMEA(2700) GBL(300) |
| PR-91 | Polymer-16 (80) | PAG-1 (5.1) | | SQ-1 (6.4) | SF-1 (5.0) | PGMEA(2700) GBL(300) |
| PR-92 | Polymer-16 (80) | PAG-1 (5.1) | | SQ-3 (7.9) | SF-1 (5.0) | PGMEA(2700) GBL(300) |
| PR-93 | Polymer-16 (80) | PAG-1 (5.1) | | SQ-5 (6.2) | SF-1 (5.0) | PGMEA(2700) GBL(300) |
| PR-94 | Polymer-16 (80) | PAG-2 (4.5) | | SQ-1 (6.4) | SF-1 (5.0) | PGMEA(2700) GBL(300) |
| PR-95 | Polymer-16 (80) | PAG-2 (4.5) | | SQ-3 (7.9) | SF-1 (5.0) | PGMEA(2700) GBL(300) |
| PR-96 | Polymer-16 (80) | PAG-2 (4.5) | | SQ-5 (6.2) | SF-1 (5.0) | PGMEA(2700) GBL(300) |
| PR-97 | Polymer-17 (80) | PAG-1 (5.1) | | SQ-1 (6.4) | SF-1 (5.0) | PGMEA(2700) GBL(300) |
| PR-98 | Polymer-17 (80) | PAG-1 (5.1) | | SQ-3 (7.9) | SF-1 (5.0) | PGMEA(2700) GBL(300) |
| PR-99 | Polymer-17 (80) | PAG-1 (5.1) | | SQ-5 (6.2) | SF-1 (5.0) | PGMEA(2700) GBL(300) |
| PR-100 | Polymer-17 (80) | PAG-2 (4.5) | | SQ-1 (6.4) | SF-1 (5.0) | PGMEA(2700) GBL(300) |

TABLE 6

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-101 | Polymer-17 (80) | PAG-2 (4.5) | | SQ-3 (7.9) | SF-2 (5.0) | PGMEA(2700) GBL(300) |
| PR-102 | Polymer-17 (80) | PAG-2 (4.5) | | SQ-5 (6.2) | SF-2 (5.0) | PGMEA(2700) GBL(300) |
| PR-103 | Polymer-18 (80) | PAG-1 (5.1) | TAG-1 (0.5) | SQ-1 (6.4) | SF-2 (5.0) | PGMEA(2700) GBL(300) |
| PR-104 | Polymer-18 (80) | PAG-1 (5.1) | | SQ-3 (7.9) | SF-2 (5.0) | PGMEA(2700) GBL(300) |
| PR-105 | Polymer-18 (80) | PAG-1 (5.1) | | SQ-5 (6.2) | SF-2 (5.0) | PGMEA(2700) GBL(300) |
| PR-106 | Polymer-18 (80) | PAG-2 (4.5) | | SQ-1 (6.4) | SF-2 (5.0) | PGMEA(2700) GBL(300) |
| PR-107 | Polymer-18 (80) | PAG-2 (4.5) | | SQ-3 (7.9) | SF-2 (5.0) | PGMEA(2700) GBL(300) |
| PR-108 | Polymer-18 (80) | PAG-2 (4.5) | | SQ-5 (6.2) | SF-2 (5.0) | PGMEA(2700) GBL(300) |
| PR-109 | Polymer-19 (80) | PAG-1 (5.1) | | SQ-1 (6.4) | SF-2 (5.0) | PGMEA(2700) GBL(300) |
| PR-110 | Polymer-19 (80) | PAG-1 (5.1) | | SQ-3 (7.9) | SF-2 (5.0) | PGMEA(2700) GBL(300) |
| PR-111 | Polymer-19 (80) | PAG-1 (5.1) | | SQ-5 (6.2) | SF-2 (5.0) | PGMEA(2700) GBL(300) |
| PR-112 | Polymer-19 (80) | PAG-2 (4.5) | TAG-1 (0.5) | SQ-1 (6.4) | SF-2 (5.0) | PGMEA(2700) GBL(300) |
| PR-113 | Polymer-19 (80) | PAG-2 (4.5) | | SQ-3 (7.9) | SF-2 (5.0) | PGMEA(2700) GBL(300) |
| PR-114 | Polymer-19 (80) | PAG-2 (4.5) | | SQ-5 (6.2) | SF-2 (5.0) | PGMEA(2700) GBL(300) |
| PR-115 | Polymer-20 (80) | PAG-1 (5.1) | | SQ-1 (6.4) | SF-2 (5.0) | PGMEA(2700) GBL(300) |
| PR-116 | Polymer-20 (80) | PAG-1 (5.1) | | SQ-3 (7.9) | SF-2 (5.0) | PGMEA(2700) GBL(300) |
| PR-117 | Polymer-20 (80) | PAG-1 (5.1) | | SQ-5 (6.2) | SF-2 (5.0) | PGMEA(2700) GBL(300) |
| PR-118 | Polymer-20 (80) | PAG-2 (4.5) | | SQ-1 (6.4) | SF-2 (5.0) | PGMEA(2700) GBL(300) |
| PR-119 | Polymer-20 (80) | PAG-2 (4.5) | | SQ-3 (7.9) | SF-2 (5.0) | PGMEA(2700) GBL(300) |
| PR-120 | Polymer-20 (80) | PAG-2 (4.5) | | SQ-5 (6.2) | SF-2 (5.0) | PGMEA(2700) GBL(300) |
| PR-121 | Polymer-21 (80) | PAG-1 (5.1) | | SQ-1 (6.4) | SF-2 (5.0) | PGMEA(2700) GBL(300) |
| PR-122 | Polymer-21 (80) | PAG-1 (5.1) | | SQ-3 (7.9) | SF-2 (5.0) | PGMEA(2700) GBL(300) |
| PR-123 | Polymer-21 (80) | PAG-1 (5.1) | | SQ-5 (6.2) | SF-2 (5.0) | PGMEA(2700) GBL(300) |
| PR-124 | Polymer-21 (80) | PAG-2 (4.5) | | SQ-1 (6.4) | SF-2 (5.0) | PGMEA(2700) GBL(300) |
| PR-125 | Polymer-21 (80) | PAG-2 (4.5) | | SQ-3 (7.9) | SF-2 (5.0) | PGMEA(2700) GBL(300) |
| PR-126 | Polymer-21 (80) | PAG-2 (4.5) | | SQ-5 (6.2) | SF-2 (5.0) | PGMEA(2700) GBL(300) |
| PR-127 | Polymer-22 (80) | PAG-1 (5.1) | | SQ-1 (6.4) | SF-2 (5.0) | PGMEA(2700) GBL(300) |
| PR-128 | Polymer-22 (80) | PAG-1 (5.1) | | SQ-3 (7.9) | SF-2 (5.0) | PGMEA(2700) GBL(300) |
| PR-129 | Polymer-22 (80) | PAG-1 (5.1) | | SQ-5 (6.2) | SF-2 (5.0) | PGMEA(2700) GBL(300) |
| PR-130 | Polymer-22 (80) | PAG-2 (4.5) | | SQ-1 (6.4) | SF-2 (5.0) | PGMEA(2700) GBL(300) |
| PR-131 | Polymer-22 (80) | PAG-2 (4.5) | | SQ-3 (7.9) | SF-2 (5.0) | PGMEA(2700) GBL(300) |
| PR-132 | Polymer-22 (80) | PAG-2 (4.5) | | SQ-5 (6.2) | SF-2 (5.0) | PGMEA(2700) GBL(300) |
| PR-133 | Polymer-23 (80) | PAG-1 (6.3) | | SQ-1 (5.3) | SF-2 (5.0) | PGMEA(2700) GBL(300) |
| PR-134 | Polymer-23 (80) | PAG-1 (6.3) | TAG-1 (0.5) | SQ-1 (4.8) | SF-1 (5.0) | PGMEA(2700) GBL(300) |
| PR-135 | Polymer-23 (80) | PAG-1 (5.1) | | SQ-3 (7.9) | SF-1 (5.0) | PGMEA(2700) GBL(300) |
| PR-136 | Polymer-23 (80) | PAG-1 (5.1) | | SQ-4 (8.1) | SF-1 (5.0) | PGMEA(2700) GBL(300) |
| PR-137 | Polymer-23 (80) | PAG-1 (5.1) | | SQ-5 (6.2) | SF-1 (5.0) | PGMEA(2700) GBL(300) |
| PR-138 | Polymer-23 (80) | PAG-1 (5.1) | | SQ-6 (6.3) | SF-1 (5.0) | PGMEA(2700) GBL(300) |
| PR-139 | Polymer-23 (80) | PAG-3 (5.5) | | SQ-1 (6.4) | SF-1 (5.0) | PGMEA(2700) GBL(300) |
| PR-140 | Polymer-23 (80) | PAG-3 (5.5) | | SQ-2 (6.6) | SF-1 (5.0) | PGMEA(2700) GBL(300) |

TABLE 6-continued

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-141 | Polymer-23 (80) | PAG-3 (5.5) |  | SQ-3 (7.9) | SF-1 (5.0) | PGMEA(2700) GBL(300) |
| PR-142 | Polymer-23 (80) | PAG-3 (5.5) | TAG-1 (0.5) | SQ-4 (8.1) | SF-1 (5.0) | PGMEA(2700) GBL(300) |
| PR-143 | Polymer-23 (80) | PAG-3 (5.5) |  | SQ-5 (6.2) | SF-1 (5.0) | PGMEA(2700) GBL(300) |
| PR-144 | Polymer-23 (80) | PAG-3 (5.5) |  | SQ-6 (6.3) | SF-1 (5.0) | PGMEA(2700) GBL(300) |
| PR-145 | Polymer-24 (80) | PAG-1 (5.1) |  | SQ-1 (6.4) | SF-1 (5.0) | PGMEA(2700) GBL(300) |
| PR-146 | Polymer-24 (80) | PAG-1 (5.1) |  | SQ-2 (6.6) | SF-1 (5.0) | PGMEA(2700) GBL(300) |
| PR-147 | Polymer-24 (80) | PAG-1 (5.1) |  | SQ-3 (7.9) | SF-1 (5.0) | PGMEA(2700) GBL(300) |
| PR-148 | Polymer-24 (80) | PAG-1 (5.1) |  | SQ-4 (8.1) | SF-1 (5.0) | PGMEA(2700) GBL(300) |
| PR-149 | Polymer-24 (80) | PAG-3 (5.5) |  | SQ-1 (6.4) | SF-1 (5.0) | PGMEA(2700) GBL(300) |
| PR-150 | Polymer-24 (80) | PAG-3 (5.5) |  | SQ-2 (6.6) | SF-1 (5.0) | PGMEA(2700) GBL(300) |

TABLE 7

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-151 | Polymer-24 (80) | PAG-3 (5.5) |  | SQ-3 (7.9) | SF-1 (5.0) | PGMEA(2700) GBL(300) |
| PR-152 | Polymer-24 (80) | PAG-3 (5.5) |  | SQ-4 (8.1) | SF-1 (5.0) | PGMEA(2700) GBL(300) |
| PR-153 | Polymer-25 (80) | PAG-1 (5.1) |  | SQ-1 (6.4) | SF-1 (5.0) | PGMEA(2700) GBL(300) |
| PR-154 | Polymer-25 (80) | PAG-1 (5.1) |  | SQ-2 (6.6) | SF-1 (5.0) | PGMEA(2700) GBL(300) |
| PR-155 | Polymer-25 (80) | PAG-1 (5.1) |  | SQ-3 (7.9) | SF-1 (5.0) | PGMEA(2700) GBL(300) |
| PR-156 | Polymer-25 (80) | PAG-1 (5.1) |  | SQ-4 (8.1) | SF-1 (5.0) | PGMEA(2700) GBL(300) |
| PR-157 | Polymer-25 (80) | PAG-3 (5.5) |  | SQ-1 (6.4) | SF-1 (5.0) | PGMEA(2700) GBL(300) |
| PR-158 | Polymer-25 (80) | PAG-3 (5.5) |  | SQ-2 (6.6) | SF-1 (5.0) | PGMEA(2700) GBL(300) |
| PR-159 | Polymer-25 (80) | PAG-3 (5.5) |  | SQ-3 (7.9) | SF-1 (5.0) | PGMEA(2700) GBL(300) |
| PR-160 | Polymer-25 (80) | PAG-3 (5.5) |  | SQ-4 (8.1) | SF-1 (5.0) | PGMEA(2700) GBL(300) |
| PR-161 | Polymer-26 (80) | PAG-1 (5.1) |  | SQ-1 (6.4) | SF-1 (5.0) | PGMEA(2700) GBL(300) |
| PR-162 | Polymer-26 (80) | PAG-1 (5.1) |  | SQ-2 (6.6) | SF-1 (5.0) | PGMEA(2700) GBL(300) |
| PR-163 | Polymer-26 (80) | PAG-1 (5.1) |  | SQ-3 (7.9) | SF-1 (5.0) | PGMEA(2700) GBL(300) |
| PR-164 | Polymer-26 (80) | PAG-1 (5.1) |  | SQ-4 (8.1) | SF-1 (5.0) | PGMEA(2700) GBL(300) |
| PR-165 | Polymer-26 (80) | PAG-3 (5.5) |  | SQ-1 (6.4) | SF-1 (5.0) | PGMEA(2700) GBL(300) |
| PR-166 | Polymer-26 (80) | PAG-3 (5.5) |  | SQ-2 (6.6) | SF-1 (5.0) | PGMEA(2700) GBL(300) |
| PR-167 | Polymer-26 (80) | PAG-3 (5.5) |  | SQ-3 (7.9) | SF-1 (5.0) | PGMEA(2700) GBL(300) |
| PR-168 | Polymer-26 (80) | PAG-3 (5.5) |  | SQ-4 (8.1) | SF-1 (5.0) | PGMEA(2700) GBL(300) |
| PR-169 | Polymer-27 (80) | PAG-1 (5.1) |  | SQ-1 (6.4) | SF-1 (5.0) | PGMEA(2700) GBL(300) |
| PR-170 | Polymer-27 (80) | PAG-1 (5.1) |  | SQ-2 (6.6) | SF-1 (5.0) | PGMEA(2700) GBL(300) |
| PR-171 | Polymer-27 (80) | PAG-1 (5.1) |  | SQ-3 (7.9) | SF-1 (5.0) | PGMEA(2700) GBL(300) |
| PR-172 | Polymer-27 (80) | PAG-1 (5.1) |  | SQ-4 (8.1) | SF-1 (5.0) | PGMEA(2700) GBL(300) |
| PR-173 | Polymer-27 (80) | PAG-3 (5.5) |  | SQ-1 (6.4) | SF-1 (5.0) | PGMEA(2700) GBL(300) |
| PR-174 | Polymer-27 (80) | PAG-3 (5.5) |  | SQ-2 (6.6) | SF-1 (5.0) | PGMEA(2700) GBL(300) |
| PR-175 | Polymer-27 (80) | PAG-3 (5.5) |  | SQ-3 (7.9) | SF-1 (5.0) | PGMEA(2700) GBL(300) |
| PR-176 | Polymer-27 (80) | PAG-3 (5.5) |  | SQ-4 (8.1) | SF-1 (5.0) | PGMEA(2700) GBL(300) |
| PR-177 | Polymer-28 (80) | PAG-1 (5.1) |  | SQ-1 (6.4) | SF-1 (5.0) | PGMEA(2700) GBL(300) |
| PR-178 | Polymer-28 (80) | PAG-1 (5.1) |  | SQ-2 (6.6) | SF-1 (5.0) | PGMEA(2700) GBL(300) |
| PR-179 | Polymer-28 (80) | PAG-1 (5.1) |  | SQ-3 (7.9) | SF-1 (5.0) | PGMEA(2700) GBL(300) |
| PR-180 | Polymer-28 (80) | PAG-1 (5.1) |  | SQ-4 (8.1) | SF-1 (5.0) | PGMEA(2700) GBL(300) |
| PR-181 | Polymer-28 (80) | PAG-3 (5.5) |  | SQ-1 (6.4) | SF-1 (5.0) | PGMEA(2700) GBL(300) |
| PR-182 | Polymer-28 (80) | PAG-3 (5.5) |  | SQ-2 (6.6) | SF-1 (5.0) | PGMEA(2700) GBL(300) |
| PR-183 | Polymer-28 (80) | PAG-3 (5.5) |  | SQ-3 (7.9) | SF-1 (5.0) | PGMEA(2700) GBL(300) |
| PR-184 | Polymer-28 (80) | PAG-3 (5.5) |  | SQ-4 (8.1) | SF-1 (5.0) | PGMEA(2700) GBL(300) |
| PR-185 | Polymer-29 (80) | PAG-1 (5.1) |  | SQ-1 (6.4) | SF-1 (5.0) | PGMEA(2700) GBL(300) |
| PR-186 | Polymer-29 (80) | PAG-1 (5.1) |  | SQ-2 (6.6) | SF-1 (5.0) | PGMEA(2700) GBL(300) |
| PR-187 | Polymer-29 (80) | PAG-1 (5.1) |  | SQ-3 (7.9) | SF-1 (5.0) | PGMEA(2700) GBL(300) |
| PR-188 | Polymer-29 (80) | PAG-1 (5.1) |  | SQ-4 (8.1) | SF-1 (5.0) | PGMEA(2700) GBL(300) |
| PR-189 | Polymer-29 (80) | PAG-3 (5.5) |  | SQ-1 (6.4) | SF-1 (5.0) | PGMEA(2700) GBL(300) |
| PR-190 | Polymer-29 (80) | PAG-3 (5.5) |  | SQ-2 (6.6) | SF-1 (5.0) | PGMEA(2700) GBL(300) |
| PR-191 | Polymer-29 (80) | PAG-3 (5.5) |  | SQ-3 (7.9) | SF-1 (5.0) | PGMEA(2700) GBL(300) |
| PR-192 | Polymer-29 (80) | PAG-3 (5.5) |  | SQ-4 (8.1) | SF-1 (5.0) | PGMEA(2700) GBL(300) |
| PR-193 | Polymer-30 (80) | PAG-1 (5.1) |  | SQ-1 (6.4) | SF-1 (5.0) | PGMEA(2700) GBL(300) |
| PR-194 | Polymer-30 (80) | PAG-1 (5.1) |  | SQ-2 (6.6) | SF-1 (5.0) | PGMEA(2700) GBL(300) |
| PR-195 | Polymer-30 (80) | PAG-1 (5.1) |  | SQ-3 (7.9) | SF-1 (5.0) | PGMEA(2700) GBL(300) |
| PR-196 | Polymer-30 (80) | PAG-1 (5.1) |  | SQ-4 (8.1) | SF-1 (5.0) | PGMEA(2700) GBL(300) |
| PR-197 | Polymer-30 (80) | PAG-3 (5.5) |  | SQ-1 (6.4) | SF-1 (5.0) | PGMEA(2700) GBL(300) |
| PR-198 | Polymer-30 (80) | PAG-3 (5.5) |  | SQ-2 (6.6) | SF-1 (5.0) | PGMEA(2700) GBL(300) |
| PR-199 | Polymer-30 (80) | PAG-3 (5.5) |  | SQ-3 (7.9) | SF-1 (5.0) | PGMEA(2700) GBL(300) |
| PR-200 | Polymer-30 (80) | PAG-3 (5.5) |  | SQ-4 (8.1) | SF-1 (5.0) | PGMEA(2700) GBL(300) |

TABLE 8

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-201 | Polymer-4 (80) | PAG-1 (7.6) | | SQ-1 (4.3) | SF-2 (5.0) | PGMEA(2700) GBL(300) |
| PR-202 | Polymer-4 (80) | PAG-1 (7.6) | | SQ-3 (5.3) | SF-2 (5.0) | PGMEA(2700) GBL(300) |
| PR-203 | Polymer-4 (80) | PAG-1 (7.6) | | SQ-5 (4.1) | SF-2 (5.0) | PGMEA(2700) GBL(300) |
| PR-204 | Polymer-4 (80) | PAG-3 (8.3) | | SQ-1 (4.3) | SF-2 (5.0) | PGMEA(2700) GBL(300) |
| PR-205 | Polymer-4 (80) | PAG-3 (8.3) | | SQ-3 (5.3) | SF-2 (5.0) | PGMEA(2700) GBL(300) |
| PR-206 | Polymer-4 (80) | PAG-3 (8.3) | | SQ-5 (4.1) | SF-2 (5.0) | PGMEA(2700) GBL(300) |
| PR-207 | Polymer-6 (80) | PAG-1 (7.6) | | SQ-1 (4.3) | SF-2 (5.0) | PGMEA(2700) GBL(300) |
| PR-208 | Polymer-6 (80) | PAG-1 (7.6) | | SQ-3 (5.3) | SF-2 (5.0) | PGMEA(2700) GBL(300) |
| PR-209 | Polymer-6 (80) | PAG-1 (7.6) | | SQ-5 (4.1) | SF-2 (5.0) | PGMEA(2700) GBL(300) |
| PR-210 | Polymer-6 (80) | PAG-3 (8.3) | | SQ-1 (4.3) | SF-2 (5.0) | PGMEA(2700) GBL(300) |
| PR-211 | Polymer-6 (80) | PAG-3 (8.3) | | SQ-3 (5.3) | SF-2 (5.0) | PGMEA(2700) GBL(300) |
| PR-212 | Polymer-6 (80) | PAG-3 (8.3) | | SQ-5 (4.1) | SF-2 (5.0) | PGMEA(2700) GBL(300) |
| PR-213 | Polymer-12 (80) | PAG-1 (7.6) | | SQ-1 (4.3) | SF-2 (5.0) | PGMEA(2700) GBL(300) |
| PR-214 | Polymer-12 (80) | PAG-1 (7.6) | | SQ-3 (5.3) | SF-2 (5.0) | PGMEA(2700) GBL(300) |
| PR-215 | Polymer-12 (80) | PAG-1 (7.6) | | SQ-5 (4.1) | SF-2 (5.0) | PGMEA(2700) GBL(300) |
| PR-216 | Polymer-12 (80) | PAG-3 (8.3) | | SQ-1 (4.3) | SF-2 (5.0) | PGMEA(2700) GBL(300) |
| PR-217 | Polymer-12 (80) | PAG-3 (8.3) | | SQ-3 (5.3) | SF-2 (5.0) | PGMEA(2700) GBL(300) |
| PR-218 | Polymer-12 (80) | PAG-3 (8.3) | | SQ-5 (4.1) | SF-2 (5.0) | PGMEA(2700) GBL(300) |
| PR-219 | Polymer-24 (80) | PAG-1 (7.6) | | SQ-1 (4.3) | SF-2 (5.0) | PGMEA(2700) GBL(300) |
| PR-220 | Polymer-24 (80) | PAG-1 (7.6) | TAG-1 (0.5) | SQ-3 (5.3) | SF-2 (5.0) | PGMEA(2700) GBL(300) |
| PR-221 | Polymer-24 (80) | PAG-1 (7.6) | | SQ-5 (4.1) | SF-2 (5.0) | PGMEA(2700) GBL(300) |
| PR-222 | Polymer-24 (80) | PAG-3 (8.3) | | SQ-1 (4.3) | SF-2 (5.0) | PGMEA(2700) GBL(300) |
| PR-223 | Polymer-24 (80) | PAG-3 (8.3) | | SQ-3 (5.3) | SF-2 (5.0) | PGMEA(2700) GBL(300) |
| PR-224 | Polymer-24 (80) | PAG-3 (8.3) | | SQ-5 (4.1) | SF-2 (5.0) | PGMEA(2700) GBL(300) |
| PR-225 | Polymer-29 (80) | PAG-1 (7.6) | | SQ-1 (4.3) | SF-2 (5.0) | PGMEA(2700) GBL(300) |
| PR-226 | Polymer-29 (80) | PAG-1 (7.6) | | SQ-3 (5.3) | SF-2 (5.0) | PGMEA(2700) GBL(300) |
| PR-227 | Polymer-29 (80) | PAG-1 (7.6) | | SQ-5 (4.1) | SF-2 (5.0) | PGMEA(2700) GBL(300) |
| PR-228 | Polymer-29 (80) | PAG-3 (8.3) | | SQ-1 (4.3) | SF-2 (5.0) | PGMEA(2700) GBL(300) |
| PR-229 | Polymer-29 (80) | PAG-3 (8.3) | | SQ-3 (5.3) | SF-2 (5.0) | PGMEA(2700) GBL(300) |
| PR-230 | Polymer-29 (80) | PAG-3 (8.3) | | SQ-5 (4.1) | SF-2 (5.0) | PGMEA(2700) GBL(300) |

TABLE 9

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-231 | Polymer-31 (80) | PAG-1 (5.1) | | SQ-1 (6.4) | SF-2 (5.0) | PGMEA(2700) GBL(300) |
| PR-232 | Polymer-31 (80) | PAG-1 (5.1) | | SQ-2 (6.6) | SF-2 (5.0) | PGMEA(2700) GBL(300) |
| PR-233 | Polymer-32 (80) | PAG-1 (5.1) | | SQ-1 (6.4) | SF-2 (5.0) | PGMEA(2700) GBL(300) |
| PR-234 | Polymer-32 (80) | PAG-1 (5.1) | | SQ-2 (6.6) | SF-2 (5.0) | PGMEA(2700) GBL(300) |
| PR-235 | Polymer-33 (80) | PAG-1 (5.1) | | SQ-1 (6.4) | SF-2 (5.0) | PGMEA(2700) GBL(300) |
| PR-236 | Polymer-33 (80) | PAG-1 (5.1) | | SQ-2 (6.6) | SF-2 (5.0) | PGMEA(2700) GBL(300) |
| PR-237 | Polymer-34 (80) | PAG-1 (5.1) | | SQ-1 (6.4) | SF-2 (5.0) | PGMEA(2700) GBL(300) |
| PR-238 | Polymer-34 (80) | PAG-1 (5.1) | | SQ-2 (6.6) | SF-2 (5.0) | PGMEA(2700) GBL(300) |
| PR-239 | Polymer-35 (80) | PAG-1 (5.1) | | SQ-1 (6.4) | SF-2 (5.0) | PGMEA(2700) GBL(300) |
| PR-240 | Polymer-35 (80) | PAG-1 (5.1) | | SQ-2 (6.6) | SF-2 (5.0) | PGMEA(2700) GBL(300) |
| PR-241 | Polymer-36 (80) | PAG-1 (5.1) | | SQ-1 (6.4) | SF-2 (5.0) | PGMEA(2700) GBL(300) |
| PR-242 | Polymer-36 (80) | PAG-1 (5.1) | | SQ-2 (6.6) | SF-2 (5.0) | PGMEA(2700) GBL(300) |
| PR-243 | Polymer-37 (80) | PAG-1 (5.1) | | SQ-1 (6.4) | SF-2 (5.0) | PGMEA(2700) GBL(300) |
| PR-244 | Polymer-37 (80) | PAG-1 (5.1) | | SQ-2 (6.6) | SF-2 (5.0) | PGMEA(2700) GBL(300) |
| PR-245 | Polymer-38 (80) | PAG-1 (5.1) | | SQ-1 (6.4) | SF-2 (5.0) | PGMEA(2700) GBL(300) |
| PR-246 | Polymer-38 (80) | PAG-1 (5.1) | | SQ-2 (6.6) | SF-2 (5.0) | PGMEA(2700) GBL(300) |
| PR-247 | Polymer-4 (80) | PAG-4 (4.4) | | SQ-1 (6.4) | SF-2 (5.0) | PGMEA(2700) GBL(300) |
| PR-248 | Polymer-4 (80) | PAG-4 (4.4) | | SQ-2 (6.6) | SF-2 (5.0) | PGMEA(2700) GBL(300) |
| PR-249 | Polymer-4 (80) | PAG-5 (4.4) | | SQ-1 (6.4) | SF-2 (5.0) | PGMEA(2700) GBL(300) |
| PR-250 | Polymer-4 (80) | PAG-5 (4.4) | | SQ-2 (6.6) | SF-2 (5.0) | PGMEA(2700) GBL(300) |
| PR-251 | Polymer-6 (80) | PAG-4 (4.4) | | SQ-1 (6.4) | SF-2 (5.0) | PGMEA(2700) GBL(300) |
| PR-252 | Polymer-6 (80) | PAG-4 (4.4) | | SQ-2 (6.6) | SF-2 (5.0) | PGMEA(2700) GBL(300) |
| PR-253 | Polymer-6 (80) | PAG-5 (4.4) | | SQ-1 (6.4) | SF-2 (5.0) | PGMEA(2700) GBL(300) |
| PR-254 | Polymer-6 (80) | PAG-5 (4.4) | | SQ-2 (6.6) | SF-2 (5.0) | PGMEA(2700) GBL(300) |
| PR-255 | Polymer-12 (80) | PAG-4 (4.4) | | SQ-1 (6.4) | SF-2 (5.0) | PGMEA(2700) GBL(300) |
| PR-256 | Polymer-12 (80) | PAG-4 (4.4) | | SQ-2 (6.6) | SF-2 (5.0) | PGMEA(2700) GBL(300) |
| PR-257 | Polymer-12 (80) | PAG-5 (4.4) | | SQ-1 (6.4) | SF-2 (5.0) | PGMEA(2700) GBL(300) |
| PR-258 | Polymer-12 (80) | PAG-5 (4.4) | | SQ-2 (6.6) | SF-2 (5.0) | PGMEA(2700) GBL(300) |
| PR-259 | Polymer-14 (80) | PAG-4 (4.4) | | SQ-1 (6.4) | SF-2 (5.0) | PGMEA(2700) GBL(300) |
| PR-260 | Polymer-14 (80) | PAG-4 (4.4) | | SQ-2 (6.6) | SF-2 (5.0) | PGMEA(2700) GBL(300) |

TABLE 9-continued

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-261 | Polymer-14 (80) | PAG-5 (4.4) | | SQ-1 (6.4) | SF-2 (5.0) | PGMEA(2700) GBL(300) |
| PR-262 | Polymer-14 (80) | PAG-5 (4.4) | | SQ-2 (6.6) | SF-2 (5.0) | PGMEA(2700) GBL(300) |
| PR-263 | Polymer-18 (80) | PAG-4 (4.4) | | SQ-1 (6.4) | SF-2 (5.0) | PGMEA(2700) GBL(300) |
| PR-264 | Polymer-18 (80) | PAG-4 (4.4) | | SQ-2 (6.6) | SF-2 (5.0) | PGMEA(2700) GBL(300) |
| PR-265 | Polymer-18 (80) | PAG-5 (4.4) | | SQ-1 (6.4) | SF-2 (5.0) | PGMEA(2700) GBL(300) |
| PR-266 | Polymer-18 (80) | PAG-5 (4.4) | | SQ-2 (6.6) | SF-2 (5.0) | PGMEA(2700) GBL(300) |
| PR-267 | Polymer-24 (80) | PAG-4 (4.4) | | SQ-1 (6.4) | SF-2 (5.0) | PGMEA(2700) GBL(300) |
| PR-268 | Polymer-24 (80) | PAG-4 (4.4) | | SQ-2 (6.6) | SF-2 (5.0) | PGMEA(2700) GBL(300) |
| PR-269 | Polymer-24 (80) | PAG-5 (4.4) | | SQ-1 (6.4) | SF-2 (5.0) | PGMEA(2700) GBL(300) |

TABLE 10

| Resist | Polymer (parts by mass) | Photo acid generator (parts by mass) | Thermal acid generator (parts by mass) | Quencher (parts by mass) | Alkaline-soluble surfactant (parts by mass) | Solvent (parts by mass) |
|---|---|---|---|---|---|---|
| PR-270 | Polymer-24 (80) | PAG-5 (4.4) | | SQ-2 (6.6) | SF-2 (5.0) | PGMEA(2700) GBL(300) |
| PR-271 | Polymer-25 (80) | PAG-4 (4.4) | | SQ-1 (6.4) | SF-2 (5.0) | PGMEA(2700) GBL(300) |
| PR-272 | Polymer-25 (80) | PAG-4 (4.4) | | SQ-2 (6.6) | SF-2 (5.0) | PGMEA(2700) GBL(300) |
| PR-273 | Polymer-25 (80) | PAG-5 (4.4) | | SQ-1 (6.4) | SF-2 (5.0) | PGMEA(2700) GBL(300) |
| PR-274 | Polymer-25 (80) | PAG-5 (4.4) | | SQ-2 (6.6) | SF-2 (5.0) | PGMEA(2700) GBL(300) |
| PR-275 | Polymer-29 (80) | PAG-4 (4.4) | | SQ-1 (6.4) | SF-2 (5.0) | PGMEA(2700) GBL(300) |
| PR-276 | Polymer-29 (80) | PAG-4 (4.4) | | SQ-2 (6.6) | SF-2 (5.0) | PGMEA(2700) GBL(300) |
| PR-277 | Polymer-29 (80) | PAG-5 (4.4) | | SQ-1 (6.4) | SF-2 (5.0) | PGMEA(2700) GBL(300) |
| PR-278 | Polymer-29 (80) | PAG-5 (4.4) | | SQ-2 (6.6) | SF-2 (5.0) | PGMEA(2700) GBL(300) |
| PR-279 | Polymer-4 (80) | PAG-1 (5.1) | | SQ-7 (6.4) | SF-2 (5.0) | PGMEA(2700) GBL(300) |
| PR-280 | Polymer-4 (80) | PAG-1 (5.1) | | SQ-8 (5.8) | SF-2 (5.0) | PGMEA(2700) GBL(300) |
| PR-281 | Polymer-4 (80) | PAG-1 (5.1) | | SQ-9 (7.3) | SF-2 (5.0) | PGMEA(2700) GBL(300) |
| PR-282 | Polymer-4 (80) | PAG-1 (5.1) | | SQ-10 (5.7) | SF-2 (5.0) | PGMEA(2700) GBL(300) |
| PR-283 | Polymer-6 (80) | PAG-1 (5.1) | | SQ-7 (6.4) | SF-2 (5.0) | PGMEA(2700) GBL(300) |
| PR-284 | Polymer-6 (80) | PAG-1 (5.1) | | SQ-8 (5.8) | SF-2 (5.0) | PGMEA(2700) GBL(300) |
| PR-285 | Polymer-6 (80) | PAG-1 (5.1) | | SQ-9 (7.3) | SF-2 (5.0) | PGMEA(2700) GBL(300) |
| PR-286 | Polymer-6 (80) | PAG-1 (5.1) | | SQ-10 (5.7) | SF-2 (5.0) | PGMEA(2700) GBL(300) |
| PR-287 | Polymer-12 (80) | PAG-1 (5.1) | | SQ-7 (6.4) | SF-2 (5.0) | PGMEA(2700) GBL(300) |
| PR-288 | Polymer-12 (80) | PAG-1 (5.1) | | SQ-8 (5.8) | SF-2 (5.0) | PGMEA(2700) GBL(300) |
| PR-289 | Polymer-12 (80) | PAG-1 (5.1) | | SQ-9 (7.3) | SF-2 (5.0) | PGMEA(2700) GBL(300) |
| PR-290 | Polymer-12 (80) | PAG-1 (5.1) | | SQ-10 (5.7) | SF-2 (5.0) | PGMEA(2700) GBL(300) |
| PR-291 | Polymer-14 (80) | PAG-1 (5.1) | | SQ-7 (6.4) | SF-2 (5.0) | PGMEA(2700) GBL(300) |
| PR-292 | Polymer-14 (80) | PAG-1 (5.1) | | SQ-8 (5.8) | SF-2 (5.0) | PGMEA(2700) GBL(300) |
| PR-293 | Polymer-14 (80) | PAG-1 (5.1) | | SQ-9 (7.3) | SF-2 (5.0) | PGMEA(2700) GBL(300) |
| PR-294 | Polymer-14 (80) | PAG-1 (5.1) | | SQ-10 (5.7) | SF-2 (5.0) | PGMEA(2700) GBL(300) |
| PR-295 | Polymer-18 (80) | PAG-1 (5.1) | | SQ-7 (6.4) | SF-2 (5.0) | PGMEA(2700) GBL(300) |
| PR-296 | Polymer-18 (80) | PAG-1 (5.1) | | SQ-8 (5.8) | SF-2 (5.0) | PGMEA(2700) GBL(300) |
| PR-297 | Polymer-18 (80) | PAG-1 (5.1) | TAG-1 (0.5) | SQ-9 (7.3) | SF-2 (5.0) | PGMEA(2700) GBL(300) |
| PR-298 | Polymer-18 (80) | PAG-1 (5.1) | TAG-1 (0.5) | SQ-10 (5.7) | SF-2 (5.0) | PGMEA(2700) GBL(300) |
| PR-299 | Polymer-24 (80) | PAG-1 (5.1) | TAG-1 (0.5) | SQ-7 (6.4) | SF-2 (5.0) | PGMEA(2700) GBL(300) |
| PR-300 | Polymer-24 (80) | PAG-1 (5.1) | TAG-1 (0.5) | SQ-8 (5.8) | SF-2 (5.0) | PGMEA(2700) GBL(300) |
| PR-301 | Polymer-24 (80) | PAG-1 (5.1) | | SQ-9 (7.3) | SF-2 (5.0) | PGMEA(2700) GBL(300) |
| PR-302 | Polymer-24 (80) | PAG-1 (5.1) | | SQ-10 (5.7) | SF-2 (5.0) | PGMEA(2700) GBL(300) |
| PR-303 | Polymer-25 (80) | PAG-1 (5.1) | | SQ-7 (6.4) | SF-2 (5.0) | PGMEA(2700) GBL(300) |
| PR-304 | Polymer-25 (80) | PAG-1 (5.1) | | SQ-8 (5.8) | SF-2 (5.0) | PGMEA(2700) GBL(300) |
| PR-305 | Polymer-25 (80) | PAG-1 (5.1) | | SQ-9 (7.3) | SF-2 (5.0) | PGMEA(2700) GBL(300) |
| PR-306 | Polymer-25 (80) | PAG-1 (5.1) | | SQ-10 (5.7) | SF-2 (5.0) | PGMEA(2700) GBL(300) |
| PR-307 | Polymer-29 (80) | PAG-1 (5.1) | | SQ-7 (6.4) | SF-2 (5.0) | PGMEA(2700) GBL(300) |
| PR-308 | Polymer-29 (80) | PAG-1 (5.1) | | SQ-8 (5.8) | SF-2 (5.0) | PGMEA(2700) GBL(300) |
| PR-309 | Polymer-29 (80) | PAG-1 (5.1) | | SQ-9 (7.3) | SF-2 (5.0) | PGMEA(2700) GBL(300) |
| PR-310 | Polymer-29 (80) | PAG-1 (5.1) | | SQ-10 (5.7) | SF-2 (5.0) | PGMEA(2700) GBL(300) |

TABLE 11
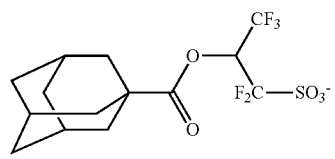 PAG-1
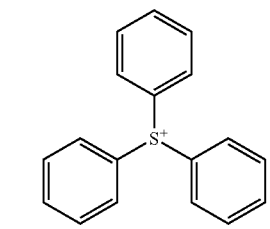 [SMILES: c1ccc([S+](c2ccccc2)c2ccccc2)cc1]
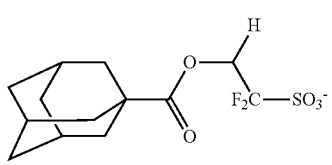 PAG-2
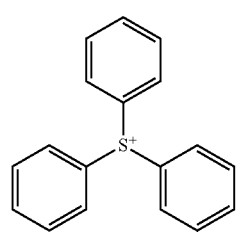 [SMILES: c1ccc([S+](c2ccccc2)c2ccccc2)cc1]
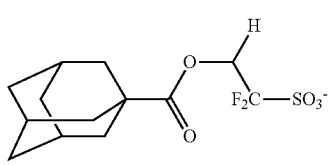 PAG-3
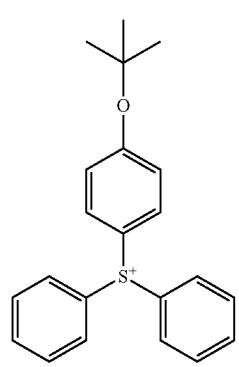 [SMILES: CC(C)(C)Oc1ccc([S+](c2ccccc2)c2ccccc2)cc1]
CF₃CF₂CF₂CF₂SO₃⁻ PAG-4
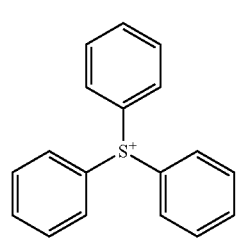 [SMILES: c1ccc([S+](c2ccccc2)c2ccccc2)cc1]
TABLE 11-continued
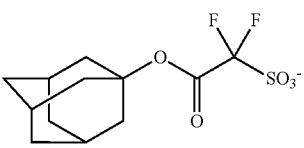 PAG-5
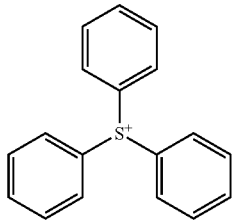 [SMILES: c1ccc([S+](c2ccccc2)c2ccccc2)cc1]
TABLE 12
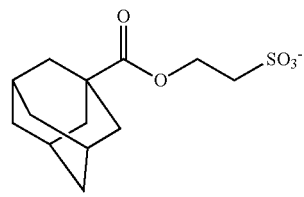 SQ-1
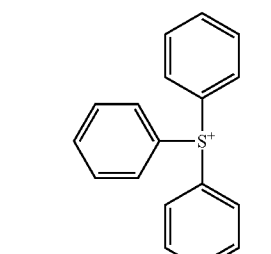 SQ-2
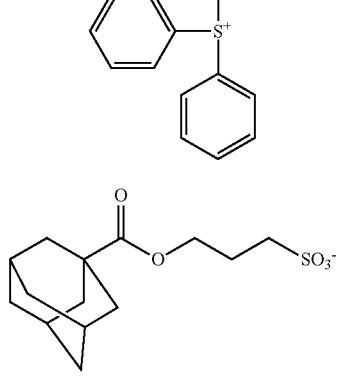
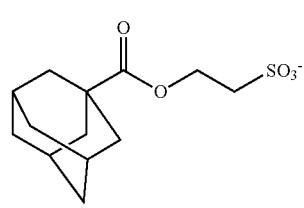 SQ-3

TABLE 12-continued
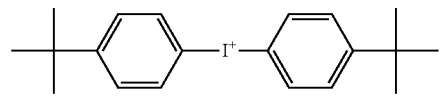 [SMILES: CC(C)(C)c1ccc([I+]c2ccc(C(C)(C)C)cc2)cc1]
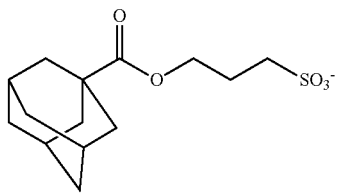
SQ-4
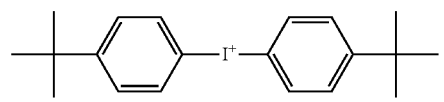
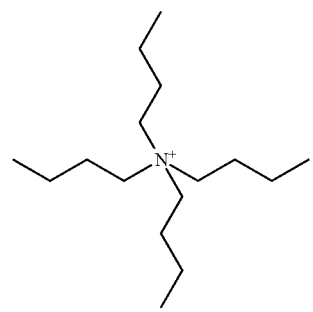 [SMILES: CCCC[N+](CCCC)(CCCC)CCCC]
SQ-5
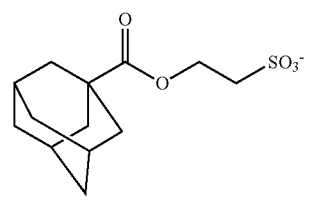
SQ-6
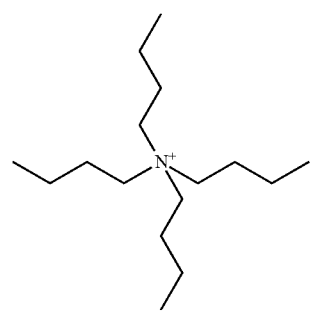 [SMILES: CCCC[N+](CCCC)(CCCC)CCCC]
TABLE 13
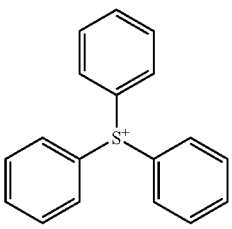 [SMILES: c1ccc([S+](c2ccccc2)c2ccccc2)cc1]
SQ-7
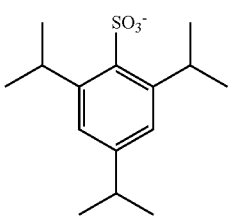
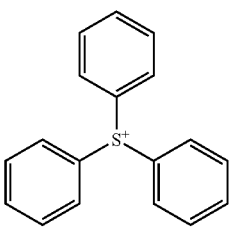 [SMILES: c1ccc([S+](c2ccccc2)c2ccccc2)cc1]
SQ-8
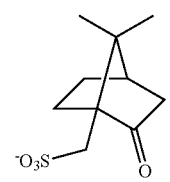
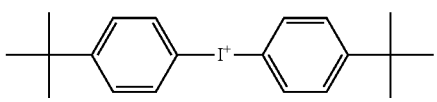 [SMILES: CC(C)(C)c1ccc([I+]c2ccc(C(C)(C)C)cc2)cc1]
SQ-9
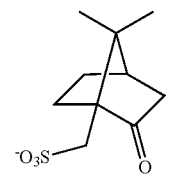
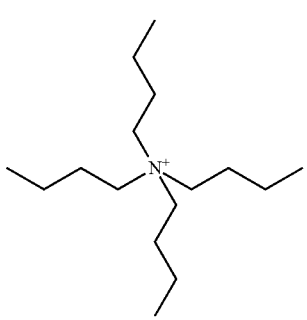
SQ-10

TABLE 13-continued

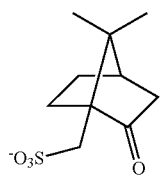

TABLE 14

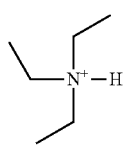 TAG-1

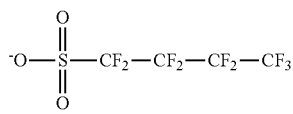

TABLE 15

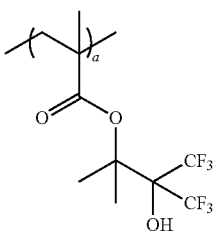 SF-1

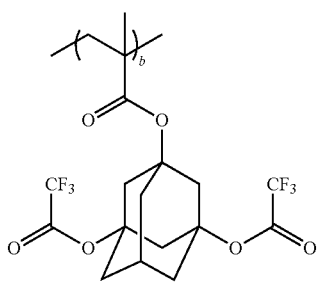

a = 0.5, b = 0.5

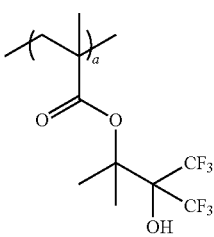 SF-2

TABLE 15-continued

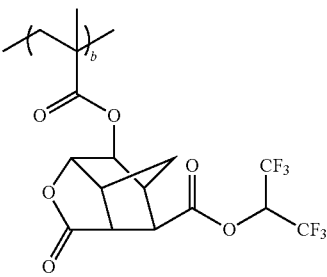

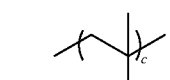

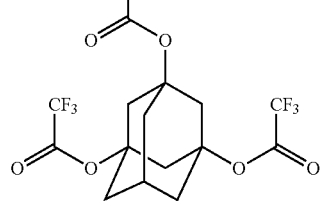

a = 0.4, b = 0.2, c = 0.4

Solvents shown in Table 4 to Table 10 are as following:
PGMEA: propylene glycol monomethyl ether acetate
GBL: γ-butyrolactone Further, Surfactant A (0.1 part by mass) was added into any of resist compositions shown in Table 4 to Table 10. Structure of surfactant A is shown below. Surfactant A: 3-methyl-3-(2,2,2-trifluoroethoxymethyl)oxetane-tetrahydrofurane-2,2-dimethyl-1,3-propanediol copolymer (manufactured by OMNOVA Solutions, Inc.), shown by the following formula.

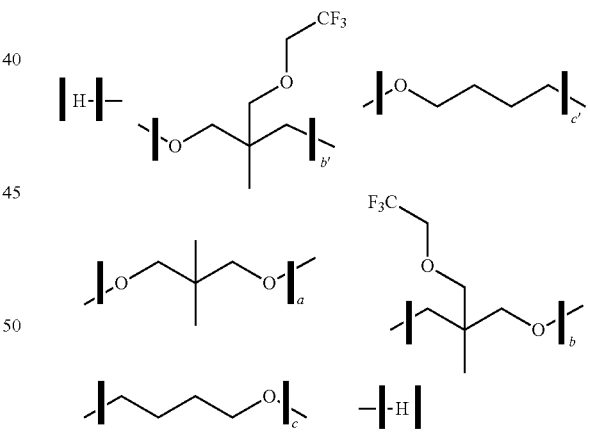

a:(b + b'):(c + c') = 1:4~7:0.01~1 (mole ratio)
Weight average molecular weight: 1500

Evaluation Method and Evaluation Results

Examples 1 to 230 and Comparative Examples 1 to 80

A solution of an antireflective film (ARC-29A: manufactured by Nissan Chemical Industries, Ltd.) was applied onto a silicon substrate and baked at 200° C. for 60 seconds to obtain the substrate coated with an antireflective film (film thickness of 100 nm); and then, a resist solution was applied onto this substrate by a spin coating method and then baked at 100° C. for 60 seconds on a hot plate to obtain a resist film having film thickness of 90 nm. This was subjected to an immersion exposure using an ArF excimer laser scanner (NSR-S610C manufactured by Nikon Corporation: NA=1.30, quadrupole, 6% halftone phase-shift mask), baked at an arbitrary temperature for 60 seconds (PEB), and then developed by an aqueous tetramethyl ammonium hydroxide solution (concentration of 2.38% by mass) for 60 seconds.

Evaluation of a resist pattern was made on a pattern having a size of 40 nm (line) and 80 nm pitch (sum of line and space) by observation with an electron microscope; and the exposure dose giving 40 nm of the pattern width could be taken as an optimum exposure dose (Eop: mJ/cm$^2$). Pattern profiles at the respective optimum dose amounts were compared; and evaluation as to acceptable and not acceptable were judged by the following criteria.

Good: Pattern side wall is highly vertical. This is an acceptable form.

Difficult dissolution of surface layer: A surface layer part of the line pattern is rather closed. This is not an acceptable form.

Footing profile: Line size is prone to increase near the substrate part. This is not an acceptable form.

Pattern fall: Symptom of the difficult dissolution of surface layer is further developed thereby causing fall of a formed pattern.

Excessive dissolution of surface layer: Line pattern is dissolved rather excessively. This is not an acceptable form because a pattern is not high enough.

Roughness of the line side wall part at the optimum dose was quantified by measuring variance of the widths thereof (LWR: 3σ value was calculated as to 30 measured points), and the values thereby obtained were compared (these are shown by LWR (unit: nm) in the Tables).

The minimum size to resolve without line fall upon narrowing the line width by increasing the exposure dose was taken as tall limit (nm). As the number gets smaller, fall resistance becomes higher; and thus, this is preferable.

PEB temperature and evaluation results of the resist compositions of the present invention shown in Tables 4 to 8 are shown in the following Tables 16 to 19. PEB temperature and evaluation results of the comparative resist compositions shown in Tables 9 to 10 are shown in the following Tables 20 to 21.

TABLE 16

| Evaluation Example | Resist | PEB (° C.) | Eop (mJ/cm$^2$) | Profile | LWR (nm) | Fall Limit (nm) |
|---|---|---|---|---|---|---|
| Example-1 | PR-1 | 100 | 40 | Good | 4.0 | 30 |
| Example-2 | PR-2 | 100 | 42 | Good | 4.4 | 31 |
| Example-3 | PR-3 | 100 | 41 | Good | 4.2 | 31 |
| Example-4 | PR-4 | 100 | 44 | Good | 4.0 | 32 |
| Example-5 | PR-5 | 100 | 47 | Good | 4.1 | 32 |
| Example-6 | PR-6 | 100 | 44 | Good | 4.4 | 30 |
| Example-7 | PR-7 | 100 | 43 | Good | 4.3 | 33 |
| Example-8 | PR-8 | 100 | 45 | Good | 4.1 | 31 |
| Example-9 | PR-9 | 100 | 47 | Good | 4.5 | 33 |
| Example-10 | PR-10 | 100 | 48 | Good | 4.4 | 32 |
| Example-11 | PR-11 | 100 | 49 | Good | 4.3 | 30 |
| Example-12 | PR-12 | 100 | 47 | Good | 4.2 | 32 |
| Example-13 | PR-13 | 95 | 43 | Good | 4.4 | 29 |
| Example-14 | PR-14 | 95 | 42 | Good | 4.0 | 30 |
| Example-15 | PR-15 | 95 | 44 | Good | 4.0 | 33 |
| Example-16 | PR-16 | 95 | 46 | Good | 4.2 | 31 |
| Example-17 | PR-17 | 95 | 47 | Good | 4.2 | 33 |

TABLE 16-continued

| Evaluation Example | Resist | PEB (° C.) | Eop (mJ/cm$^2$) | Profile | LWR (nm) | Fall Limit (nm) |
|---|---|---|---|---|---|---|
| Example-18 | PR-18 | 95 | 48 | Good | 4.3 | 32 |
| Example-19 | PR-19 | 95 | 43 | Good | 4.1 | 30 |
| Example-20 | PR-20 | 95 | 40 | Good | 4.4 | 32 |
| Example-21 | PR-21 | 95 | 40 | Good | 3.9 | 32 |
| Example-22 | PR-22 | 95 | 47 | Good | 4.3 | 30 |
| Example-23 | PR-23 | 95 | 48 | Good | 4.5 | 32 |
| Example-24 | PR-24 | 95 | 45 | Good | 4.4 | 29 |
| Example-25 | PR-25 | 95 | 39 | Good | 4.3 | 30 |
| Example-26 | PR-26 | 95 | 36 | Good | 4.0 | 33 |
| Example-27 | PR-27 | 95 | 40 | Good | 4.4 | 31 |
| Example-28 | PR-28 | 95 | 43 | Good | 4.2 | 33 |
| Example-29 | PR-29 | 95 | 45 | Good | 4.3 | 30 |
| Example-30 | PR-30 | 95 | 44 | Good | 4.1 | 31 |
| Example-31 | PR-31 | 90 | 40 | Good | 3.5 | 31 |
| Example-32 | PR-32 | 90 | 40 | Good | 4.6 | 32 |
| Example-33 | PR-33 | 90 | 41 | Good | 3.8 | 32 |
| Example-34 | PR-34 | 90 | 43 | Good | 4.2 | 30 |
| Example-35 | PR-35 | 90 | 45 | Good | 4.3 | 30 |
| Example-36 | PR-36 | 90 | 46 | Good | 4.4 | 32 |
| Example-37 | PR-37 | 90 | 40 | Good | 4.0 | 32 |
| Example-38 | PR-38 | 90 | 43 | Good | 4.5 | 30 |
| Example-39 | PR-39 | 90 | 42 | Good | 4.2 | 32 |
| Example-40 | PR-40 | 90 | 45 | Good | 4.3 | 29 |
| Example-41 | PR-41 | 90 | 46 | Good | 4.0 | 30 |
| Example-42 | PR-42 | 90 | 45 | Good | 4.2 | 33 |
| Example-43 | PR-43 | 90 | 39 | Good | 4.1 | 30 |
| Example-44 | PR-44 | 90 | 40 | Good | 4.2 | 32 |
| Example-45 | PR-45 | 90 | 37 | Good | 4.3 | 32 |
| Example-46 | PR-46 | 90 | 47 | Good | 4.3 | 30 |
| Example-47 | PR-47 | 90 | 48 | Good | 4.7 | 32 |
| Example-48 | PR-48 | 90 | 45 | Good | 4.3 | 29 |
| Example-49 | PR-49 | 95 | 39 | Good | 3.9 | 30 |
| Example-50 | PR-50 | 95 | 40 | Good | 4.4 | 33 |
| Example-51 | PR-51 | 95 | 37 | Good | 4.5 | 31 |
| Example-52 | PR-52 | 95 | 44 | Good | 4.2 | 30 |
| Example-53 | PR-53 | 95 | 44 | Good | 3.7 | 30 |
| Example-54 | PR-54 | 95 | 43 | Good | 3.8 | 35 |
| Example-55 | PR-55 | 95 | 40 | Good | 4.0 | 36 |
| Example-56 | PR-56 | 95 | 40 | Good | 4.2 | 33 |
| Example-57 | PR-57 | 95 | 42 | Good | 4.2 | 32 |
| Example-58 | PR-58 | 95 | 45 | Good | 4.3 | 33 |
| Example-59 | PR-59 | 95 | 45 | Good | 4.1 | 33 |
| Example-60 | PR-60 | 95 | 45 | Good | 4.4 | 30 |
| Example-61 | PR-61 | 90 | 42 | Good | 4.7 | 31 |
| Example-62 | PR-62 | 90 | 43 | Good | 4.1 | 29 |
| Example-63 | PR-63 | 90 | 42 | Good | 4.5 | 28 |
| Example-64 | PR-64 | 90 | 44 | Good | 4.4 | 29 |
| Example-65 | PR-65 | 90 | 44 | Good | 4.3 | 30 |
| Example-66 | PR-66 | 90 | 44 | Good | 4.8 | 30 |

TABLE 17

| Evaluation Example | Resist | PEB (° C.) | Eop (mJ/cm$^2$) | Profile | LWR (nm) | Fall Limit (nm) |
|---|---|---|---|---|---|---|
| Example-67 | PR-67 | 95 | 39 | Good | 4.4 | 31 |
| Example-68 | PR-68 | 95 | 40 | Good | 4.2 | 33 |
| Example-69 | PR-69 | 95 | 40 | Good | 3.9 | 30 |
| Example-70 | PR-70 | 95 | 41 | Good | 4.1 | 30 |
| Example-71 | PR-71 | 95 | 45 | Good | 3.5 | 32 |
| Example-72 | PR-72 | 95 | 47 | Good | 4.2 | 32 |
| Example-73 | PR-73 | 95 | 40 | Good | 4.4 | 30 |
| Example-74 | PR-74 | 95 | 42 | Good | 4.0 | 32 |
| Example-75 | PR-75 | 95 | 40 | Good | 4.5 | 29 |
| Example-76 | PR-76 | 95 | 39 | Good | 4.6 | 29 |
| Example-77 | PR-77 | 95 | 44 | Good | 4.4 | 30 |
| Example-78 | PR-78 | 95 | 41 | Good | 4.0 | 33 |
| Example-79 | PR-79 | 90 | 40 | Good | 3.9 | 31 |
| Example-80 | PR-80 | 90 | 40 | Good | 3.9 | 33 |
| Example-81 | PR-81 | 90 | 41 | Good | 4.2 | 30 |
| Example-82 | PR-82 | 90 | 40 | Good | 4.0 | 31 |
| Example-83 | PR-83 | 90 | 41 | Good | 4.2 | 31 |

TABLE 17-continued

| Evaluation Example | Resist | PEB (° C.) | Eop (mJ/cm$^2$) | Profile | LWR (nm) | Fall Limit (nm) |
|---|---|---|---|---|---|---|
| Example-84 | PR-84 | 90 | 40 | Good | 4.1 | 32 |
| Example-85 | PR-85 | 90 | 40 | Good | 4.0 | 32 |
| Example-86 | PR-86 | 90 | 43 | Good | 4.6 | 30 |
| Example-87 | PR-87 | 90 | 43 | Good | 4.6 | 30 |
| Example-88 | PR-88 | 90 | 45 | Good | 4.2 | 33 |
| Example-89 | PR-89 | 90 | 42 | Good | 4.5 | 31 |
| Example-90 | PR-90 | 90 | 44 | Good | 4.4 | 32 |
| Example-91 | PR-91 | 90 | 42 | Good | 4.6 | 31 |
| Example-92 | PR-92 | 90 | 40 | Good | 4.5 | 30 |
| Example-93 | PR-93 | 90 | 40 | Good | 4.2 | 28 |
| Example-94 | PR-94 | 90 | 42 | Good | 4.3 | 30 |
| Example-95 | PR-95 | 90 | 44 | Good | 4.0 | 30 |
| Example-96 | PR-96 | 90 | 42 | Good | 4.2 | 33 |
| Example-97 | PR-97 | 90 | 40 | Good | 4.1 | 31 |
| Example-98 | PR-98 | 90 | 42 | Good | 4.2 | 30 |
| Example-99 | PR-99 | 90 | 43 | Good | 4.3 | 30 |
| Example-100 | PR-100 | 90 | 41 | Good | 4.3 | 35 |
| Example-101 | PR-101 | 90 | 42 | Good | 4.0 | 36 |
| Example-102 | PR-102 | 90 | 42 | Good | 4.3 | 33 |
| Example-103 | PR-103 | 95 | 39 | Good | 4.1 | 32 |
| Example-104 | PR-104 | 95 | 39 | Good | 4.4 | 33 |
| Example-105 | PR-105 | 95 | 40 | Good | 4.3 | 33 |
| Example-106 | PR-106 | 95 | 40 | Good | 4.0 | 32 |
| Example-107 | PR-107 | 95 | 41 | Good | 4.2 | 30 |
| Example-108 | PR-108 | 95 | 42 | Good | 3.9 | 33 |
| Example-109 | PR-109 | 95 | 40 | Good | 4.2 | 31 |
| Example-110 | PR-110 | 95 | 39 | Good | 4.4 | 33 |
| Example-111 | PR-111 | 95 | 41 | Good | 4.5 | 32 |
| Example-112 | PR-112 | 95 | 40 | Good | 4.1 | 30 |
| Example-113 | PR-113 | 95 | 43 | Good | 3.8 | 32 |
| Example-114 | PR-114 | 95 | 43 | Good | 3.9 | 29 |
| Example-115 | PR-115 | 90 | 40 | Good | 4.0 | 30 |
| Example-116 | PR-116 | 90 | 41 | Good | 4.4 | 33 |
| Example-117 | PR-117 | 90 | 42 | Good | 4.3 | 31 |
| Example-118 | PR-118 | 90 | 44 | Good | 4.6 | 33 |
| Example-119 | PR-119 | 90 | 39 | Good | 4.4 | 32 |
| Example-120 | PR-120 | 90 | 38 | Good | 4.8 | 30 |
| Example-121 | PR-121 | 90 | 40 | Good | 4.1 | 32 |
| Example-122 | PR-122 | 90 | 41 | Good | 4.0 | 32 |
| Example-123 | PR-123 | 90 | 42 | Good | 4.2 | 30 |
| Example-124 | PR-124 | 90 | 42 | Good | 4.2 | 32 |
| Example-125 | PR-125 | 90 | 44 | Good | 4.6 | 29 |
| Example-126 | PR-126 | 90 | 40 | Good | 4.0 | 30 |
| Example-127 | PR-127 | 90 | 42 | Good | 4.1 | 33 |
| Example-128 | PR-128 | 90 | 43 | Good | 3.5 | 31 |
| Example-129 | PR-129 | 90 | 40 | Good | 4.6 | 33 |
| Example-130 | PR-130 | 90 | 39 | Good | 3.8 | 30 |
| Example-131 | PR-131 | 90 | 40 | Good | 4.2 | 31 |
| Example-132 | PR-132 | 90 | 43 | Good | 4.3 | 31 |

TABLE 18

| Evaluation Example | Resist | PEB (° C.) | Eop (mJ/cm$^2$) | Profile | LWR (nm) | Fall Limit (nm) |
|---|---|---|---|---|---|---|
| Example-133 | PR-133 | 110 | 40 | Good | 4.4 | 32 |
| Example-134 | PR-134 | 110 | 41 | Good | 4.0 | 32 |
| Example-135 | PR-135 | 110 | 41 | Good | 4.5 | 30 |
| Example-136 | PR-136 | 110 | 40 | Good | 4.2 | 30 |
| Example-137 | PR-137 | 110 | 43 | Good | 4.3 | 32 |
| Example-138 | PR-138 | 110 | 42 | Good | 4.0 | 32 |
| Example-139 | PR-139 | 110 | 44 | Good | 4.3 | 30 |
| Example-140 | PR-140 | 110 | 44 | Good | 4.3 | 32 |
| Example-141 | PR-141 | 110 | 45 | Good | 4.7 | 29 |
| Example-142 | PR-142 | 110 | 44 | Good | 4.3 | 30 |
| Example-143 | PR-143 | 110 | 42 | Good | 4.8 | 33 |
| Example-144 | PR-144 | 110 | 45 | Good | 4.4 | 30 |
| Example-145 | PR-145 | 110 | 39 | Good | 4.5 | 32 |
| Example-146 | PR-146 | 110 | 39 | Good | 5.0 | 32 |
| Example-147 | PR-147 | 110 | 40 | Good | 4.0 | 30 |
| Example-148 | PR-148 | 110 | 41 | Good | 4.1 | 32 |
| Example-149 | PR-149 | 110 | 44 | Good | 4.5 | 29 |

TABLE 18-continued

| Evaluation Example | Resist | PEB (° C.) | Eop (mJ/cm$^2$) | Profile | LWR (nm) | Fall Limit (nm) |
|---|---|---|---|---|---|---|
| Example-150 | PR-150 | 110 | 48 | Good | 4.8 | 30 |
| Example-151 | PR-151 | 110 | 40 | Good | 4.0 | 33 |
| Example-152 | PR-152 | 110 | 47 | Good | 4.2 | 31 |
| Example-153 | PR-153 | 110 | 40 | Good | 3.9 | 30 |
| Example-154 | PR-154 | 110 | 41 | Good | 3.8 | 30 |
| Example-155 | PR-155 | 110 | 41 | Good | 4.2 | 35 |
| Example-156 | PR-156 | 110 | 42 | Good | 4.3 | 36 |
| Example-157 | PR-157 | 110 | 47 | Good | 4.4 | 33 |
| Example-158 | PR-158 | 110 | 47 | Good | 4.6 | 32 |
| Example-159 | PR-159 | 110 | 46 | Good | 4.5 | 33 |
| Example-160 | PR-160 | 110 | 46 | Good | 4.2 | 33 |
| Example-161 | PR-161 | 110 | 42 | Good | 4.3 | 30 |
| Example-162 | PR-162 | 110 | 44 | Good | 4.0 | 31 |
| Example-163 | PR-163 | 110 | 40 | Good | 4.5 | 29 |
| Example-164 | PR-164 | 110 | 41 | Good | 4.6 | 28 |
| Example-165 | PR-165 | 110 | 49 | Good | 4.0 | 29 |
| Example-166 | PR-166 | 110 | 48 | Good | 4.5 | 30 |
| Example-167 | PR-167 | 110 | 46 | Good | 4.8 | 30 |
| Example-168 | PR-168 | 110 | 48 | Good | 4.5 | 31 |
| Example-169 | PR-169 | 110 | 40 | Good | 4.6 | 33 |
| Example-170 | PR-170 | 110 | 40 | Good | 4.2 | 30 |
| Example-171 | PR-171 | 110 | 42 | Good | 4.2 | 30 |
| Example-172 | PR-172 | 110 | 42 | Good | 4.2 | 32 |
| Example-173 | PR-173 | 110 | 48 | Good | 4.0 | 32 |
| Example-174 | PR-174 | 110 | 49 | Good | 3.8 | 30 |
| Example-175 | PR-175 | 110 | 49 | Good | 4.2 | 32 |
| Example-176 | PR-176 | 110 | 48 | Good | 4.3 | 29 |
| Example-177 | PR-177 | 110 | 40 | Good | 4.4 | 29 |
| Example-178 | PR-178 | 110 | 41 | Good | 4.6 | 30 |
| Example-179 | PR-179 | 110 | 41 | Good | 4.5 | 30 |
| Example-180 | PR-180 | 110 | 47 | Good | 4.2 | 30 |
| Example-181 | PR-181 | 110 | 47 | Good | 4.3 | 31 |
| Example-182 | PR-182 | 110 | 46 | Good | 4.0 | 33 |
| Example-183 | PR-183 | 110 | 47 | Good | 4.7 | 35 |
| Example-184 | PR-184 | 110 | 48 | Good | 4.2 | 32 |
| Example-185 | PR-185 | 110 | 43 | Good | 4.2 | 33 |
| Example-186 | PR-186 | 110 | 43 | Good | 4.6 | 30 |
| Example-187 | PR-187 | 110 | 41 | Good | 4.0 | 29 |
| Example-188 | PR-188 | 110 | 42 | Good | 4.2 | 33 |
| Example-189 | PR-189 | 110 | 49 | Good | 4.1 | 31 |
| Example-190 | PR-190 | 110 | 49 | Good | 4.0 | 33 |
| Example-191 | PR-191 | 110 | 46 | Good | 4.6 | 30 |
| Example-192 | PR-192 | 110 | 48 | Good | 3.8 | 29 |
| Example-193 | PR-193 | 110 | 40 | Good | 4.2 | 29 |
| Example-194 | PR-194 | 110 | 40 | Good | 4.3 | 29 |
| Example-195 | PR-195 | 110 | 42 | Good | 4.4 | 30 |
| Example-196 | PR-196 | 110 | 44 | Good | 4.6 | 33 |
| Example-197 | PR-197 | 110 | 48 | Good | 4.5 | 32 |
| Example-198 | PR-198 | 110 | 47 | Good | 4.2 | 30 |

TABLE 19

| Evaluation Example | Resist | PEB (° C.) | Eop (mJ/cm$^2$) | Profile | LWR (nm) | Fall Limit (nm) |
|---|---|---|---|---|---|---|
| Example-199 | PR-199 | 110 | 47 | Good | 4.3 | 29 |
| Example-200 | PR-200 | 110 | 46 | Good | 4.0 | 31 |
| Example-201 | PR-201 | 90 | 35 | Good | 4.8 | 33 |
| Example-202 | PR-202 | 90 | 34 | Good | 4.0 | 34 |
| Example-203 | PR-203 | 90 | 31 | Good | 4.9 | 31 |
| Example-204 | PR-204 | 90 | 34 | Good | 4.5 | 33 |
| Example-205 | PR-205 | 90 | 33 | Good | 4.1 | 35 |
| Example-206 | PR-206 | 90 | 34 | Good | 4.4 | 35 |
| Example-207 | PR-207 | 85 | 35 | Good | 4.3 | 36 |
| Example-208 | PR-208 | 85 | 34 | Good | 4.7 | 33 |
| Example-209 | PR-209 | 85 | 34 | Good | 4.8 | 33 |
| Example-210 | PR-210 | 85 | 37 | Good | 4.5 | 35 |
| Example-211 | PR-211 | 85 | 37 | Good | 4.9 | 31 |
| Example-212 | PR-212 | 85 | 38 | Good | 4.9 | 33 |
| Example-213 | PR-213 | 90 | 35 | Good | 4.3 | 32 |
| Example-214 | PR-214 | 90 | 36 | Good | 4.6 | 35 |
| Example-215 | PR-215 | 90 | 35 | Good | 5.2 | 35 |

TABLE 19-continued

| Evaluation Example | Resist | PEB (° C.) | Eop (mJ/cm²) | Profile | LWR (nm) | Fall Limit (nm) |
|---|---|---|---|---|---|---|
| Example-216 | PR-216 | 90 | 37 | Good | 4.6 | 32 |
| Example-217 | PR-217 | 90 | 36 | Good | 4.7 | 33 |
| Example-218 | PR-218 | 90 | 38 | Good | 4.9 | 35 |
| Example-219 | PR-219 | 100 | 32 | Good | 5.0 | 32 |
| Example-220 | PR-220 | 100 | 33 | Good | 4.4 | 33 |
| Example-221 | PR-221 | 100 | 31 | Good | 4.1 | 30 |
| Example-222 | PR-222 | 100 | 36 | Good | 4.5 | 35 |
| Example-223 | PR-223 | 100 | 37 | Good | 4.7 | 36 |
| Example-224 | PR-224 | 100 | 36 | Good | 4.7 | 35 |
| Example-225 | PR-225 | 100 | 30 | Good | 4.4 | 35 |
| Example-226 | PR-226 | 100 | 30 | Good | 4.8 | 33 |
| Example-227 | PR-227 | 100 | 31 | Good | 4.7 | 37 |
| Example-228 | PR-228 | 100 | 39 | Good | 4.9 | 35 |
| Example-229 | PR-229 | 100 | 39 | Good | 4.8 | 36 |
| Example-230 | PR-230 | 100 | 38 | Good | 4.4 | 35 |

TABLE 20

| Evaluation Example | Resist | PEB (° C.) | Eop (mJ/cm²) | Profile | LWR (nm) | Fall Limit (nm) |
|---|---|---|---|---|---|---|
| Comparative Example-1 | PR-231 | 110 | 38 | Difficult dissolution of surface layer | 6.7 | 40 |
| Comparative Example-2 | PR-232 | 110 | 37 | Difficult dissolution of surface layer | 6.7 | 39 |
| Comparative Example-3 | PR-233 | 110 | 39 | Difficult dissolution of surface layer | 7.1 | 38 |
| Comparative Example-4 | PR-234 | 110 | 38 | Difficult dissolution of surface layer | 6.5 | 38 |
| Comparative Example-5 | PR-235 | 110 | | Pattern-fall at Under Dose | Measurement Impossibility | 45 |
| Comparative Example-6 | PR-236 | 110 | | Pattern-fall at Under Dose | Measurement Impossibility | 44 |
| Comparative Example-7 | PR-237 | 110 | 38 | Difficult dissolution of surface layer | 5.8 | 38 |
| Comparative Example-8 | PR-238 | 110 | 38 | Difficult dissolution of surface layer | 6.1 | 36 |
| Comparative Example-9 | PR-239 | 110 | | Pattern-fall at Under Dose | Measurement Impossibility | 44 |
| Comparative Example-10 | PR-240 | 110 | | Pattern-fall at Under Dose | Measurement Impossibility | 42 |
| Comparative Example-11 | PR-241 | 110 | 42 | Difficult dissolution of surface layer | 4.8 | 35 |
| Comparative Example-12 | PR-242 | 110 | 43 | Difficult dissolution of surface layer | 4.9 | 33 |
| Comparative Example-13 | PR-243 | 110 | 42 | Difficult dissolution of surface layer | 6.2 | 35 |
| Comparative Example-14 | PR-244 | 110 | 44 | Difficult dissolution of surface layer | 6.7 | 36 |
| Comparative Example-15 | PR-245 | 110 | 38 | Difficult dissolution of surface layer | 7.1 | 35 |
| Comparative Example-16 | PR-246 | 110 | | Pattern-fall at Under Dose | Measurement Impossibility | 44 |
| Comparative Example-17 | PR-247 | 95 | 30 | Excessive dissolution of surface layer | 5.9 | 29 |
| Comparative Example-18 | PR-248 | 95 | 31 | Excessive dissolution of surface layer | 6.2 | 28 |
| Comparative Example-19 | PR-249 | 95 | 40 | Footing profile | 5.2 | 35 |
| Comparative Example-20 | PR-250 | 95 | 42 | Footing profile | 5.3 | 36 |
| Comparative Example-21 | PR-251 | 90 | 30 | Excessive dissolution of surface layer | 5.9 | 28 |
| Comparative Example-22 | PR-252 | 90 | 30 | Excessive dissolution of surface layer | 5.9 | 31 |
| Comparative Example-23 | PR-253 | 90 | 45 | Footing profile | 5.4 | 33 |
| Comparative Example-24 | PR-254 | 90 | 45 | Footing profile | 4.9 | 32 |
| Comparative Example-25 | PR-255 | 95 | 28 | Excessive dissolution of surface layer | 4.9 | 27 |
| Comparative Example-26 | PR-256 | 95 | 26 | Excessive dissolution of surface layer | 4.9 | 30 |
| Comparative Example-27 | PR-257 | 95 | 44 | Footing profile | 5.0 | 33 |
| Comparative Example-28 | PR-258 | 95 | 47 | Footing profile | 4.9 | 33 |
| Comparative Example-29 | PR-259 | 90 | 24 | Excessive dissolution of surface layer | 5.3 | 29 |

TABLE 20-continued

| Evaluation Example | Resist | PEB (°C.) | Eop (mJ/cm$^2$) | Profile | LWR (nm) | Fall Limit (nm) |
|---|---|---|---|---|---|---|
| Comparative Example-30 | PR-260 | 90 | 26 | Excessive dissolution of surface layer | 5.0 | 30 |
| Comparative Example-31 | PR-261 | 90 | 47 | Footing profile | 4.8 | 35 |
| Comparative Example-32 | PR-262 | 90 | 49 | Footing profile | 4.8 | 38 |
| Comparative Example-33 | PR-263 | 95 | 30 | Excessive dissolution of surface layer | 5.8 | 33 |
| Comparative Example-34 | PR-264 | 95 | 31 | Excessive dissolution of surface layer | 5.4 | 32 |
| Comparative Example-35 | PR-265 | 95 | 44 | Footing profile | 5.2 | 30 |
| Comparative Example-36 | PR-266 | 95 | 46 | Footing profile | 4.8 | 31 |
| Comparative Example-37 | PR-267 | 110 | 28 | Excessive dissolution of surface layer | 5.0 | 28 |
| Comparative Example-38 | PR-268 | 110 | 27 | Excessive dissolution of surface layer | 5.2 | 28 |
| Comparative Example-39 | PR-269 | 110 | 42 | Footing profile | 4.5 | 33 |
| Comparative Example-40 | PR-270 | 110 | 44 | Footing profile | 4.6 | 32 |
| Comparative Example-41 | PR-271 | 110 | 30 | Excessive dissolution of surface layer | 5.2 | 29 |
| Comparative Example-42 | PR-272 | 110 | 31 | Excessive dissolution of surface layer | 4.9 | 31 |
| Comparative Example-43 | PR-273 | 110 | 43 | Footing profile | 4.7 | 31 |
| Comparative Example-44 | PR-274 | 110 | 41 | Footing profile | 4.3 | 33 |
| Comparative Example-45 | PR-275 | 110 | 27 | Excessive dissolution of surface layer | 4.9 | 30 |
| Comparative Example-46 | PR-276 | 110 | 25 | Excessive dissolution of surface layer | 4.8 | 28 |
| Comparative Example-47 | PR-277 | 110 | 45 | Footing profile | 4.5 | 29 |
| Comparative Example-48 | PR-278 | 110 | 47 | Footing profile | 4.4 | 28 |
| Comparative Example-49 | PR-279 | 95 | 40 | Footing profile | 4.1 | 34 |
| Comparative Example-50 | PR-280 | 95 | 42 | Footing profile | 4.2 | 32 |
| Comparative Example-51 | PR-281 | 95 | 43 | Footing profile | 4.5 | 33 |
| Comparative Example-52 | PR-282 | 95 | 42 | Footing profile | 4.4 | 35 |
| Comparative Example-53 | PR-283 | 90 | 41 | Footing profile | 3.8 | 35 |
| Comparative Example-54 | PR-284 | 90 | 44 | Footing profile | 4.0 | 35 |
| Comparative Example-55 | PR-285 | 90 | 42 | Footing profile | 4.1 | 34 |
| Comparative Example-56 | PR-286 | 90 | 43 | Footing profile | 4.4 | 33 |
| Comparative Example-57 | PR-287 | 95 | 39 | Footing profile | 4.4 | 36 |
| Comparative Example-58 | PR-288 | 95 | 40 | Footing profile | 4.2 | 35 |
| Comparative Example-59 | PR-289 | 95 | 40 | Footing profile | 4.3 | 33 |
| Comparative Example-60 | PR-290 | 95 | 42 | Footing profile | 4.4 | 34 |

TABLE 21

| Evaluation Example | Resist | PEB (°C.) | Eop (mJ/cm$^2$) | Profile | LWR (nm) | Fall Limit (nm) |
|---|---|---|---|---|---|---|
| Comparative Example-61 | PR-291 | 90 | 41 | Footing profile | 4.3 | 33 |
| Comparative Example-62 | PR-292 | 90 | 44 | Footing profile | 4.5 | 33 |
| Comparative Example-63 | PR-293 | 90 | 41 | Footing profile | 4.5 | 37 |
| Comparative Example-64 | PR-294 | 90 | 41 | Footing profile | 4.7 | 35 |

TABLE 21-continued

| Evaluation Example | Resist | PEB (° C.) | Eop (mJ/cm²) | Profile | LWR (nm) | Fall Limit (nm) |
|---|---|---|---|---|---|---|
| Comparative Example-65 | PR-295 | 95 | 41 | Footing profile | 4.1 | 37 |
| Comparative Example-66 | PR-296 | 95 | 40 | Footing profile | 4.5 | 37 |
| Comparative Example-67 | PR-297 | 95 | 44 | Footing profile | 4.3 | 36 |
| Comparative Example-68 | PR-298 | 95 | 42 | Footing profile | 4.5 | 35 |
| Comparative Example-69 | PR-299 | 110 | 39 | Footing profile | 4.3 | 37 |
| Comparative Example-70 | PR-300 | 110 | 39 | Footing profile | 4.7 | 37 |
| Comparative Example-71 | PR-301 | 110 | 40 | Footing profile | 4.1 | 35 |
| Comparative Example-72 | PR-302 | 110 | 41 | Footing profile | 4.0 | 37 |
| Comparative Example-73 | PR-303 | 110 | 42 | Footing profile | 3.8 | 35 |
| Comparative Example-74 | PR-304 | 110 | 43 | Footing profile | 4.2 | 35 |
| Comparative Example-75 | PR-305 | 110 | 44 | Footing profile | 3.8 | 38 |
| Comparative Example-76 | PR-306 | 110 | 41 | Footing profile | 4.2 | 36 |
| Comparative Example-77 | PR-307 | 110 | 45 | Footing profile | 4.4 | 38 |
| Comparative Example-78 | PR-308 | 110 | 47 | Footing profile | 4.6 | 35 |
| Comparative Example-79 | PR-309 | 110 | 46 | Footing profile | 4.5 | 34 |
| Comparative Example-80 | PR-310 | 110 | 47 | Footing profile | 4.3 | 38 |

From the results shown in Tables 16 to 21, it was confirmed that the resist composition of the present invention, concurrently containing (A) the polymer containing in its composition a specific acid-labile group having a monocyclic structure, (B) the photo acid generator generating a specific sulfonic acid used for a chemically amplified resist composition, and (C) the specific onium sulfonate, showed excellent properties in line pattern profile, roughness, and fall limit (Examples 1 to 230). From the results shown in Tables 16 to 21, it is clear that the composition not concurrently containing all of (A) the polymer, (B) the photo acid generator, and (C) the onium sulfonate of the present invention fails to show improvement of these properties.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A resist composition comprising:
(A) a polymer containing one or more repeating units having a structure shown by the following general formula (1) and/or one or more repeating units having a structure shown by the following general formula (2), wherein the polymer further contains a repeating unit having an adhesive group of a lactone ring and optionally further contains one or more of an acid labile unit shown by the following general formula (6) and/or a repeating unit having an adhesive group of a hydroxyl group, the composition ratios of the respective repeating units that constitute the polymer of the component (A) satisfying $a+b+c+d=100$, $30 \leq a \leq 80$, $0 \leq b \leq 40$, $0 \leq c \leq 20$, and $20 \leq d \leq 50$, wherein total content of the repeating units having a structure shown by the following general formulae (1) and/or (2) is "a %" by mole, total content of the acid-labile units shown by the following general formula (6) is "b %" by mole, total content of the repeating units having a hydroxyl group is "c %" by mole, and total content of the repeating units having a lactone ring is "d %" by mole, and an alkaline-solubility of the polymer is increased by an acid,
(B) a photo acid generator generating, in response to a high energy beam, a sulfonic acid shown by the following general formula (3), and
(C) an onium sulfonate shown by the following general formula (4);

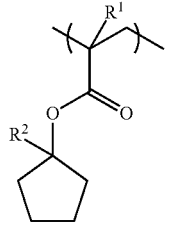

(1)

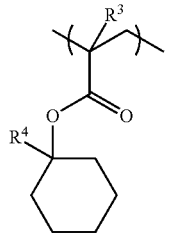

(2)

wherein, each $R^1$ and $R^3$ independently represents a hydrogen atom or a methyl group, and each $R^2$ and $R^4$ independently represents a linear, a branched, or a cyclic alkyl group having 1 to 7 carbon atoms and optionally containing an oxygen atom;

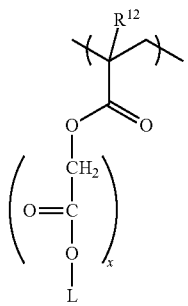

(6)

wherein $R^{12}$ represents a hydrogen atom or a methyl group, x represents 0 or 1, and L represents an acid-labile group;

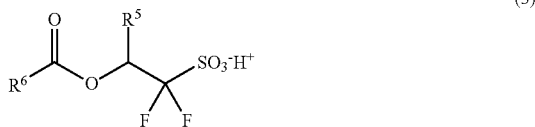
(3)

wherein, $R^5$ represents a hydrogen atom or a trifluoromethyl group, $R^6$ represents a linear, a branched, or a cyclic alkyl group, substituted or unsubstituted, having 1 to 23 carbon atoms, or an aryl group, substituted or unsubstituted, having 6 to 14 carbon atoms;

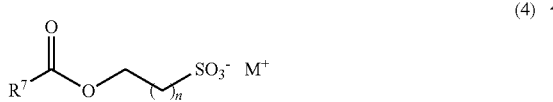
(4)

and wherein, $R^7$ represents a monovalent hydrocarbon group optionally containing a hetero atom, excluding the cases that $R^7$ represents a vinyl group and an isopropenyl group, n represents an integer of 1 to 3, and $M^+$ represents a counter cation having a substituent and is any of a sulfonium cation, an iodonium cation, and an ammonium cation.

2. The resist composition according to claim 1, wherein the onium sulfonate of the component (C) is a sulfonium sulfonate shown by the following general formula (5);

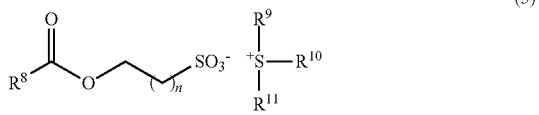
(5)

wherein $R^8$ represents a monovalent hydrocarbon group optionally containing a hetero atom, n represents an integer of 1 to 3, and each $R^9$, $R^{10}$, and $R^{11}$ independently represent any of a linear or a branched alkyl group, alkenyl group, and oxoalkyl group, substituted or unsubstituted, having 1 to 10 carbon atoms, or any of an aryl, an aralkyl, and an aryl oxoalkyl group, substituted or unsubstituted, having 6 to 18 carbon atoms, or any two or more of $R^9$, $R^{10}$, and $R^{11}$ may be bonded with each other to form a ring together with a sulfur atom in the formula.

3. The resist composition according to claim 2, wherein amount of the photo acid generator of the component (B) is 2 to 10% by mass relative to amount of the polymer of the component (A) and amount of the onium sulfonate of the component (C) in terms of mole is more than amount of the photo acid generator of the component (B).

4. The resist composition according to claim 3, wherein the resist composition further contains any one or more of an organic solvent, a basic compound, a dissolution inhibitor, and a surfactant.

5. A patterning process comprising at least a step of applying the resist composition according to claim 4 onto a substrate, a step of heat treatment, a step of exposing to a high energy beam, and a step of developing by using a developer.

6. The patterning process according to claim 5, wherein wavelength of the high energy beam is made in the range between 180 and 250 nm.

7. The patterning process according to claim 6, wherein the step of exposing to a high energy beam is carried out by an immersion exposure intervened with a liquid.

8. The patterning process according to claim 7, wherein water is used as the liquid.

9. The patterning process according to claim 5, wherein the step of exposing to a high energy beam is carried out by an immersion exposure intervened with a liquid.

10. The patterning process according to claim 9, wherein water is used as the liquid.

11. The resist composition according to claim 1, wherein amount of the photo acid generator of the component (B) is 2 to 10% by mass relative to amount of the polymer of the component (A) and amount of the onium sulfonate of the component (C) in terms of mole is more than amount of the photo acid generator of the component (B).

12. The resist composition according to claim 1, wherein the resist composition further contains any one or more of an organic solvent, a basic compound, a dissolution inhibitor, and a surfactant.

13. A patterning process comprising at least a step of applying the resist composition according to claim 1 onto a substrate, a step of heat treatment, a step of exposing to a high energy beam, and a step of developing by using a developer.

14. The patterning process according to claim 13, wherein wavelength of the high energy beam is made in the range between 180 and 250 nm.

15. The patterning process according to claim 14, wherein the step of exposing to a high energy beam is carried out by an immersion exposure intervened with a liquid.

16. The patterning process according to claim 15, wherein water is used as the liquid.

17. The patterning process according to claim 13, wherein the step of exposing to a high energy beam is carried out by an immersion exposure intervened with a liquid.

18. The patterning process according to claim 17, wherein water is used as the liquid.

* * * * *